(12) United States Patent
Ho et al.

(10) Patent No.: US 12,489,049 B2
(45) Date of Patent: Dec. 2, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chia-Cheng Ho, Hsinchu (TW); Chun-Chieh Lu, Taipei (TW); Chih-Sheng Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 209 days.

(21) Appl. No.: 17/575,660

(22) Filed: Jan. 14, 2022

(65) Prior Publication Data

US 2022/0139822 A1    May 5, 2022

Related U.S. Application Data

(63) Continuation of application No. 16/571,214, filed on Sep. 16, 2019, now Pat. No. 11,227,828.

(51) Int. Cl.
| | |
|---|---|
| *H01L 23/522* | (2006.01) |
| *H01L 21/768* | (2006.01) |
| *H10D 1/68* | (2025.01) |
| *H10D 30/01* | (2025.01) |
| *H10D 30/62* | (2025.01) |
| *H10D 64/01* | (2025.01) |

(52) U.S. Cl.
CPC .... *H01L 23/5223* (2013.01); *H01L 21/76816* (2013.01); *H01L 21/76831* (2013.01); *H10D 1/696* (2025.01); *H10D 30/024* (2025.01); *H10D 30/62* (2025.01); *H10D 64/017* (2025.01)

(58) Field of Classification Search
None
See application file for complete search history.

(56) References Cited

U.S. PATENT DOCUMENTS

| | | | |
|---|---|---|---|
| 2008/0105980 A1* | 5/2008 | Kim | H01L 21/76808 438/631 |
| 2019/0115444 A1* | 4/2019 | Bentley | H01L 29/66545 |
| 2019/0130956 A1* | 5/2019 | Müller | H01L 29/0673 |

* cited by examiner

*Primary Examiner* — Jay C Chang
(74) *Attorney, Agent, or Firm* — JCIPRNET

(57) ABSTRACT

A semiconductor device includes a semiconductor fin, a gate structure, a capacitor structure, a conductive contact, and a hard mask layer. The gate structure is disposed across the semiconductor fin. The capacitor structure is disposed on the gate structure. The capacitor structure includes a ferroelectric layer. The conductive contact is disposed on the capacitor structure. The hard mask layer laterally surrounds the conductive contact. The conductive contact protrudes from a top surface of the hard mask layer.

20 Claims, 52 Drawing Sheets

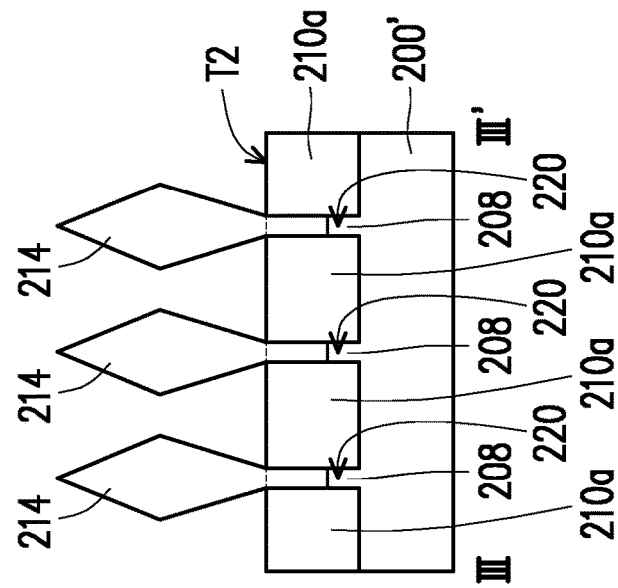
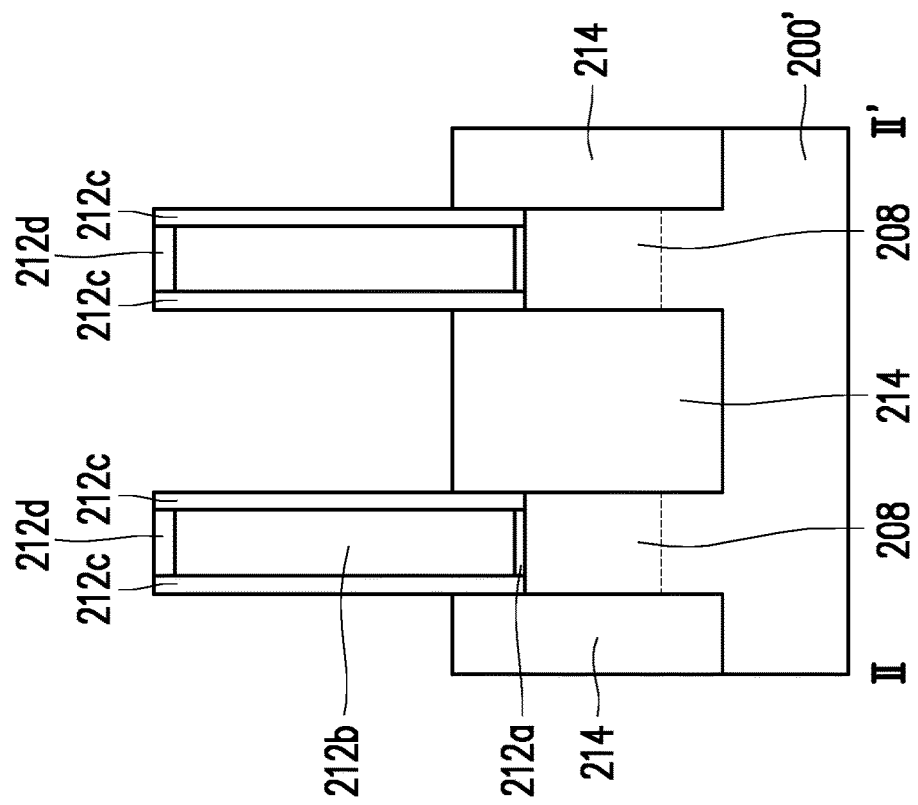
FIG. 2H

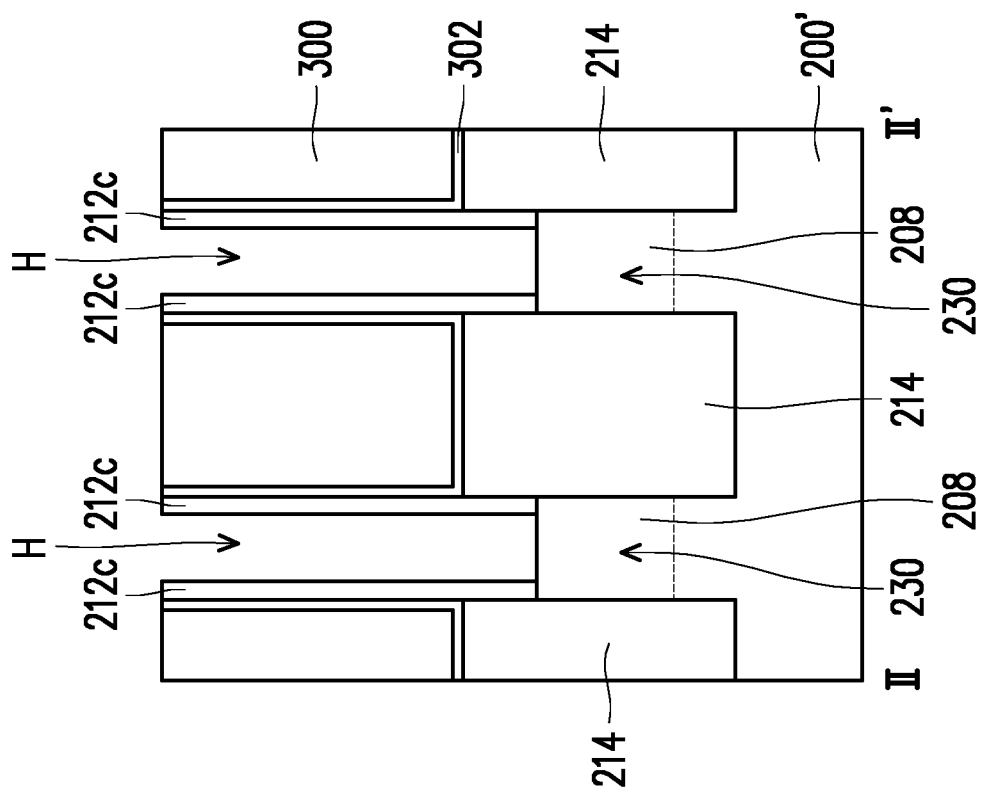
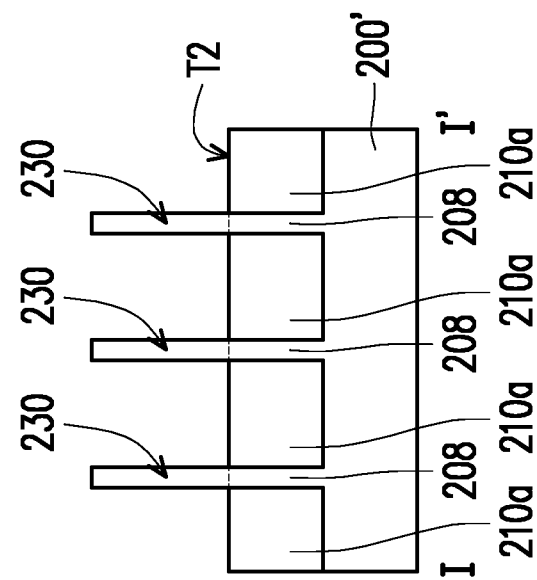
FIG. 2J

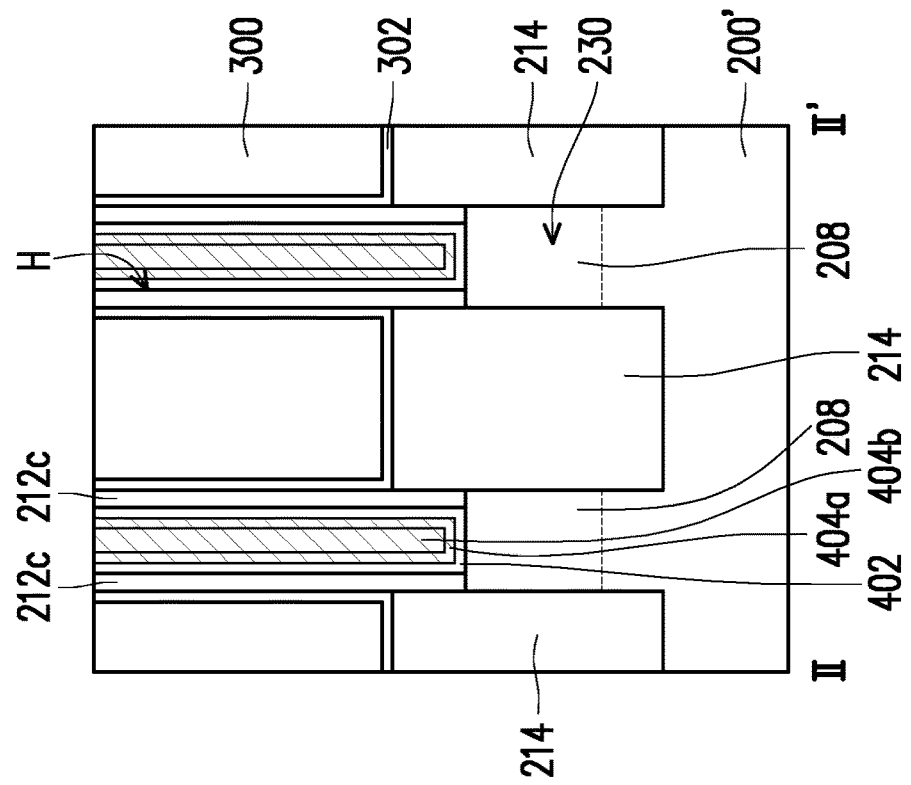
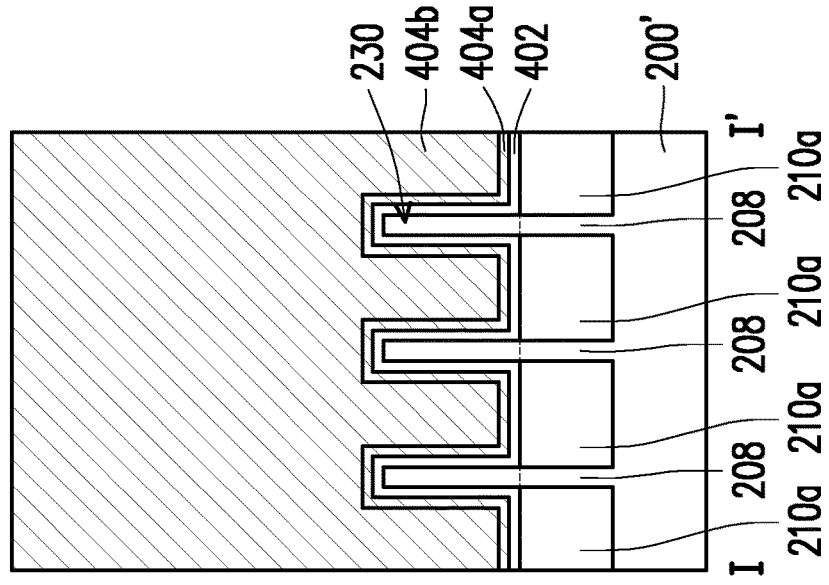
FIG. 2K

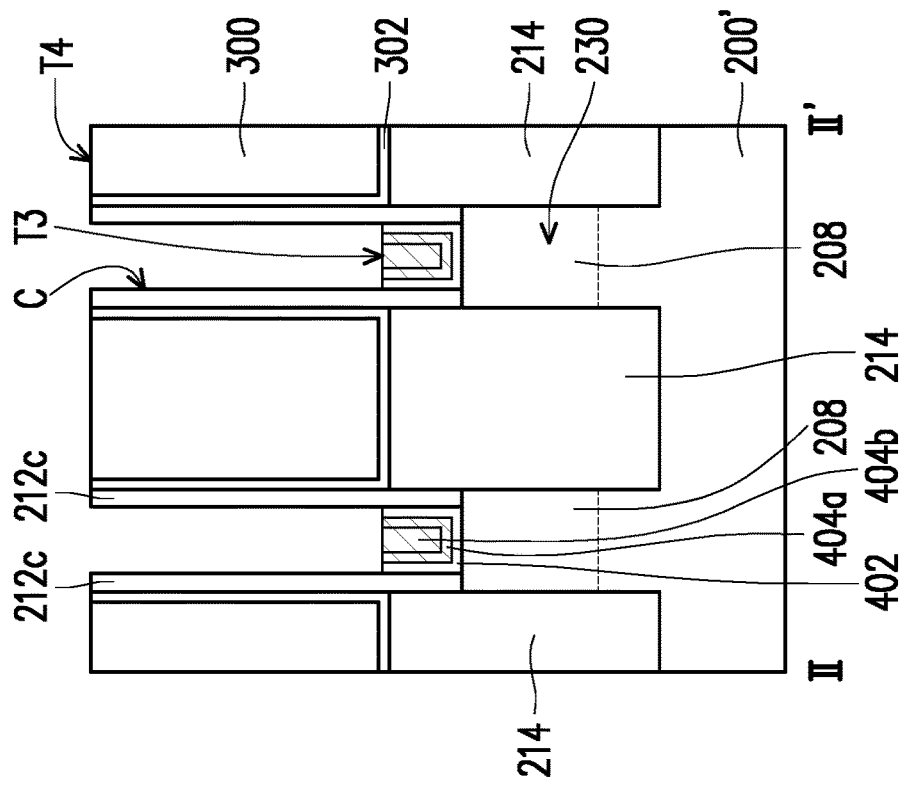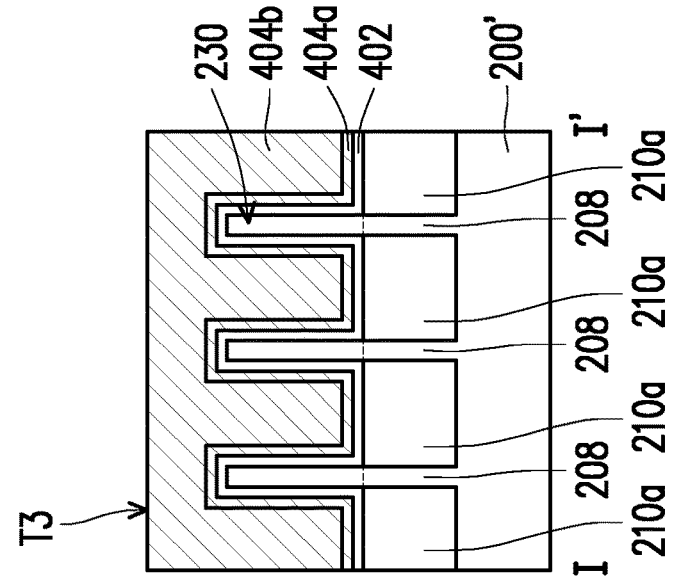
FIG. 2L

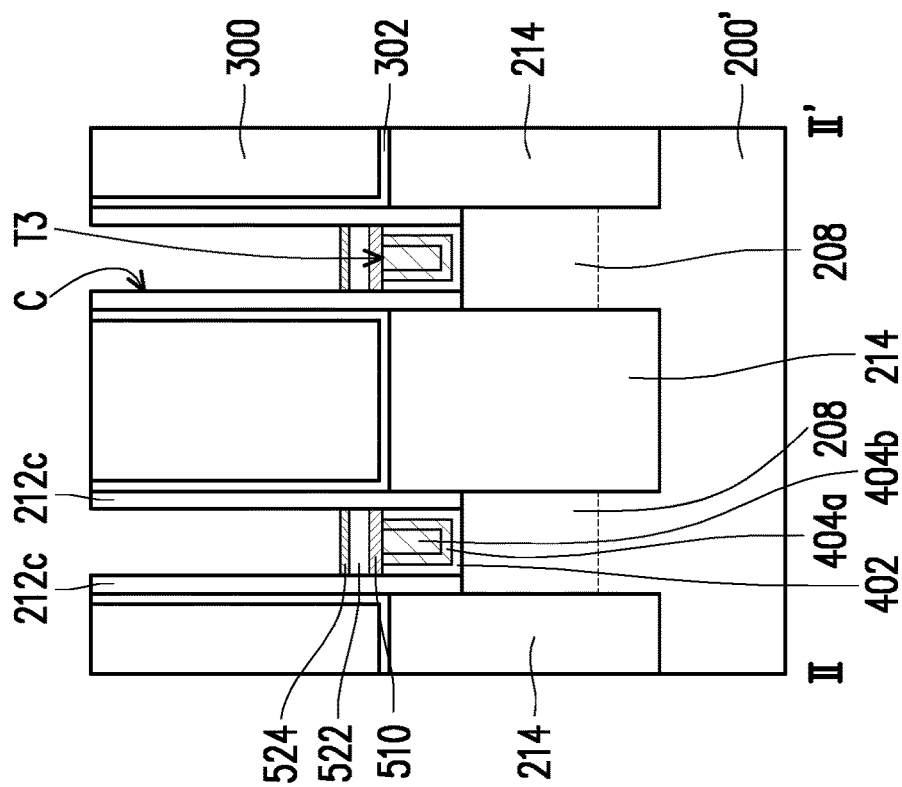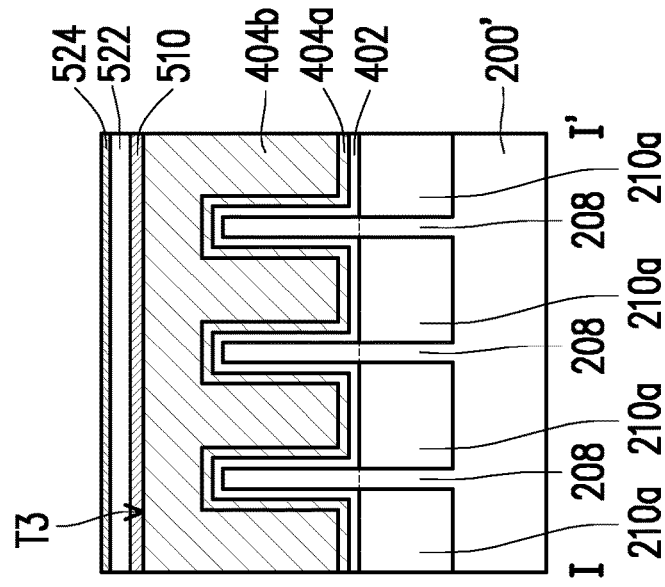
FIG. 2M

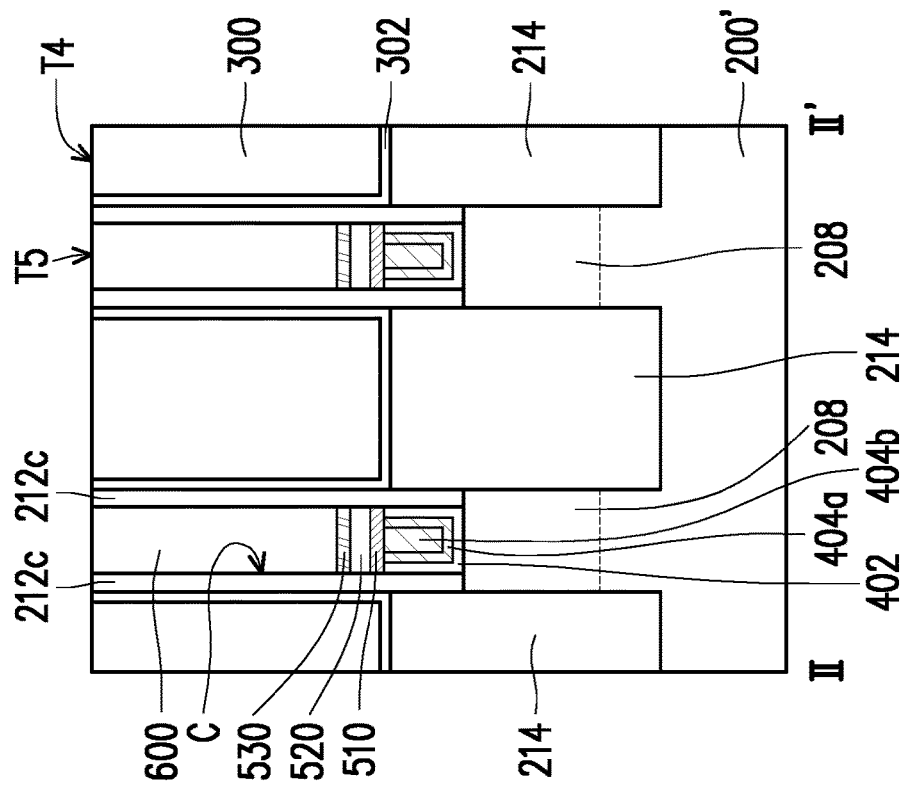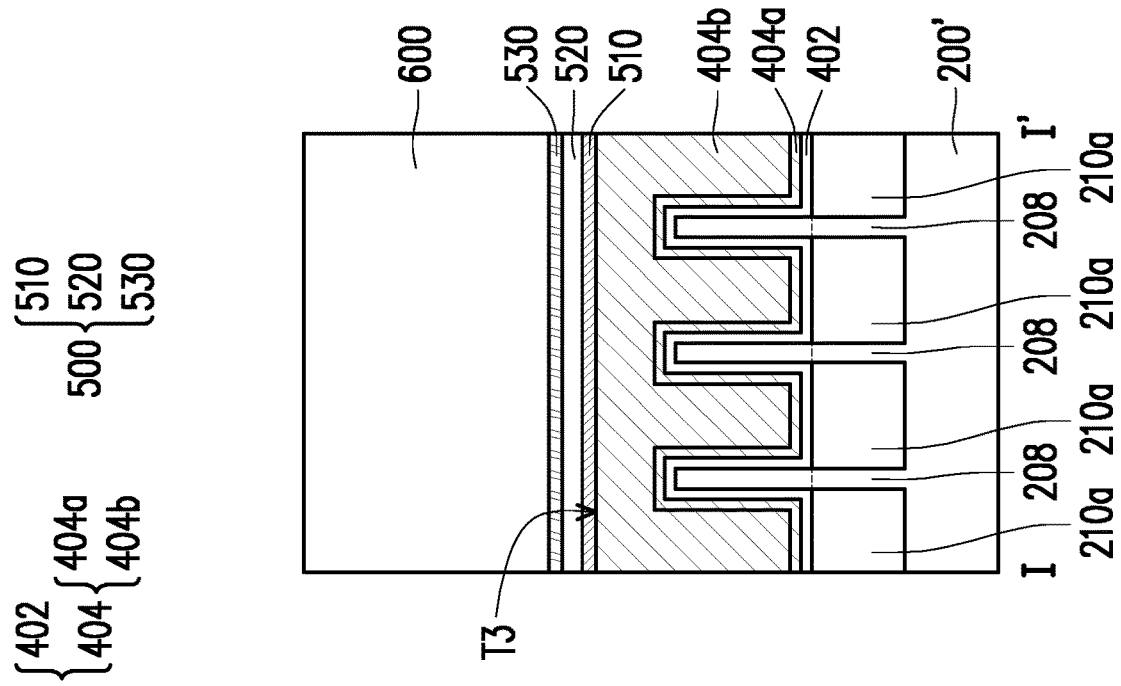
FIG. 2P

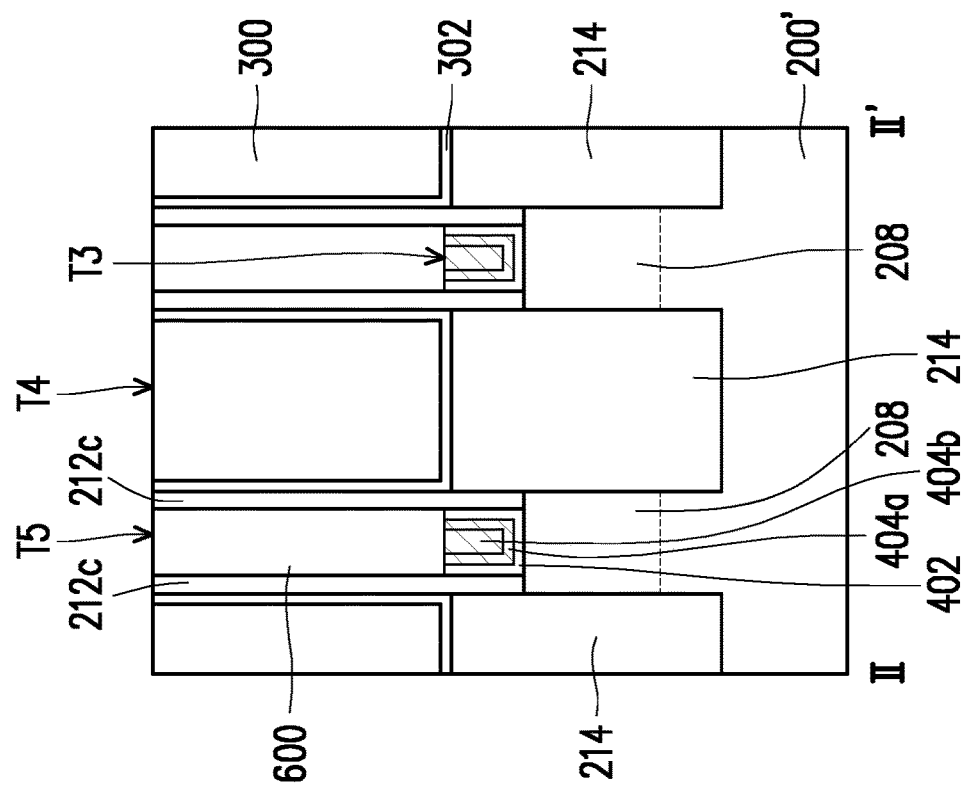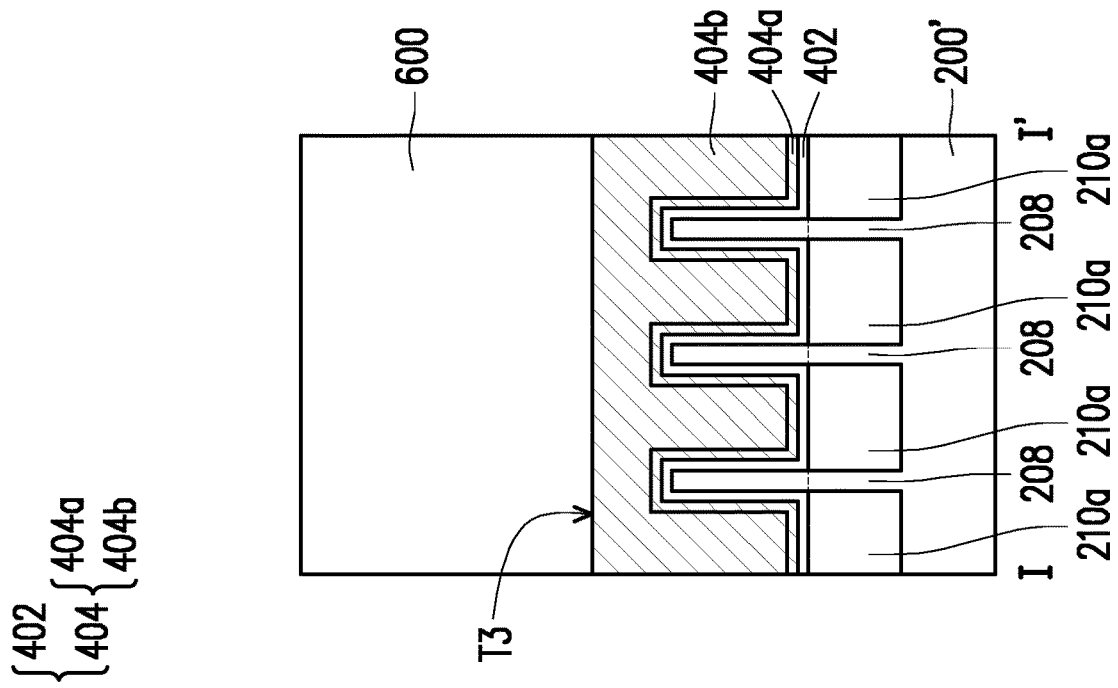
FIG. 7A

SEMICONDUCTOR DEVICE AND MANUFACTURING METHOD THEREOF

CROSS-REFERENCE TO RELATED APPLICATION

This is a continuation application of and claims the priority benefit of U.S. application Ser. No. 16/571,214, filed on Sep. 16, 2019, now allowed. The entirety of the above-mentioned patent application is hereby incorporated by reference herein and made a part of this specification.

BACKGROUND

As the semiconductor devices keep scaling down in size, three-dimensional multi-gate structures, such as the fin-type field effect transistor (FinFET), have been developed to replace planar CMOS devices. A characteristic of the FinFET device lies in that the structure has one or more silicon-based fins that are wrapped around by the gate to define the channel of the device. The gate wrapping structure further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A to FIG. 7E are cross-sectional views illustrating various stages of the method of manufacturing the semiconductor device in FIG. 6A to FIG. 6E.

DETAILED DESCRIPTION

Figure 1A:
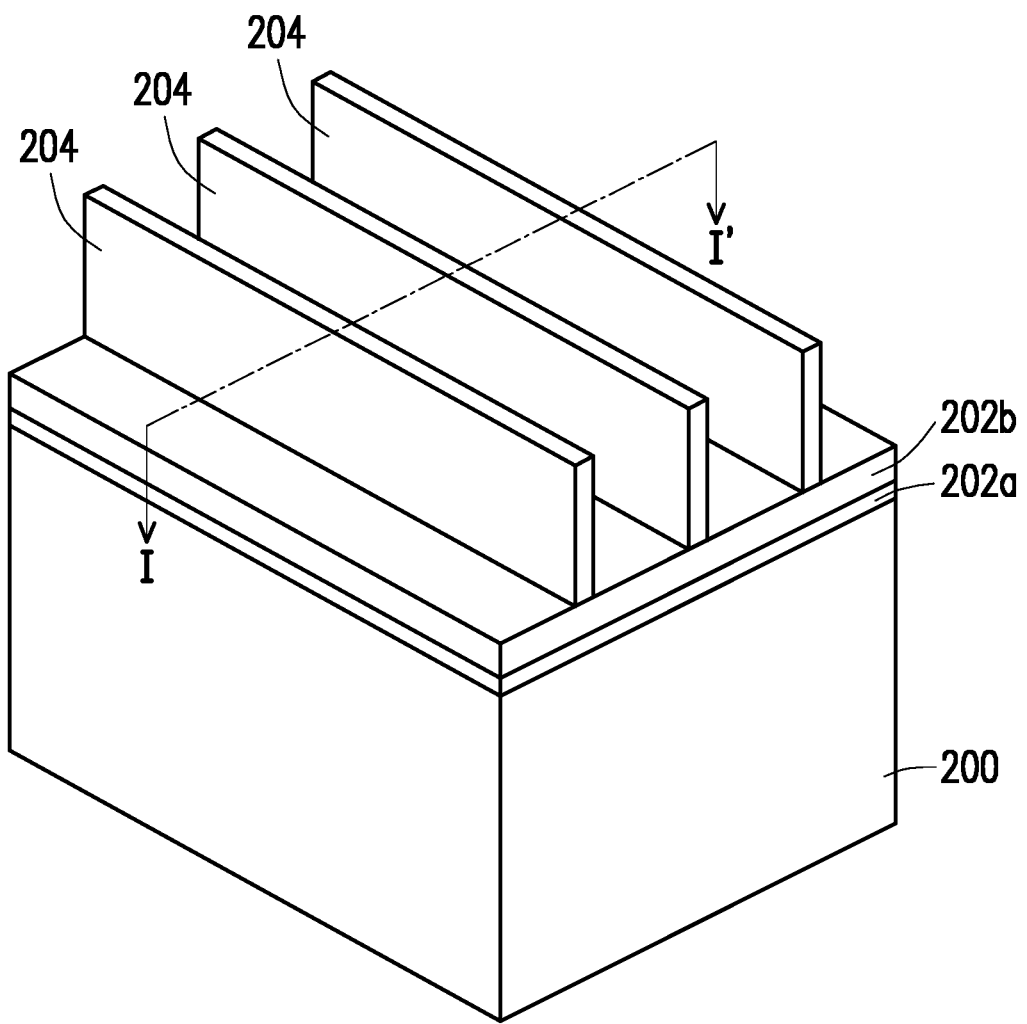
FIG. 1A to FIG. 1R are perspective views illustrating various stages of a method of manufacturing a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2A:
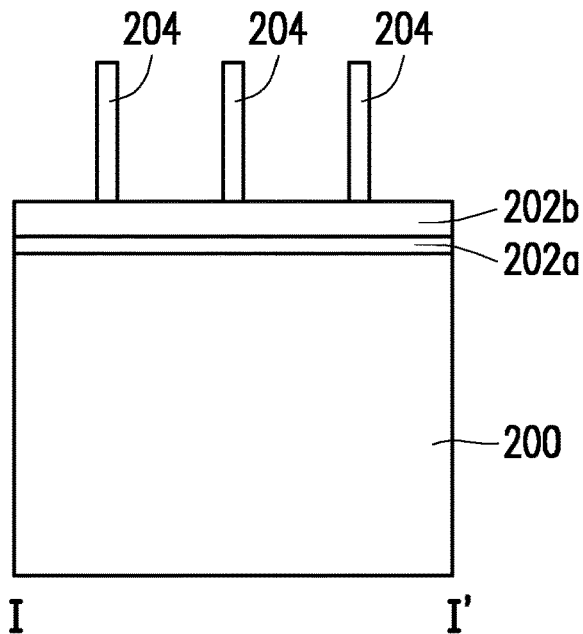
FIG. 2A to FIG. 2R are cross-sectional views illustrating various stages of the method of manufacturing the semiconductor device in FIG. 1A to FIG. 1R.

FIG. 1A is a perspective view illustrating one of various stages of a method of manufacturing a semiconductor device 10 in accordance with some embodiments of the present disclosure. FIG. 2A is a cross-sectional view of the semiconductor device 10 taken along line I-I' of FIG. 1A. Referring to FIG. 1A and FIG. 2A, a semiconductor substrate 200 is provided. In some embodiments, the semiconductor substrate 200 may be a bulk semiconductor substrate, a semiconductor-on-insulator (SOI) substrate, or the like. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used.

In some embodiments, the semiconductor substrate 200 includes a crystalline silicon substrate (e.g., wafer). In some alternative embodiments, the semiconductor substrate 200 may be made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP. The semiconductor substrate 200 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or a combination thereof. In some embodiments, a dopant concentration may be equal to or less than $10^{18}$ cm$^{-3}$, such as in the range between about $10^{17}$ cm$^{-3}$ and about $10^{18}$ cm$^{-3}$. Depending on the dopant type, an n-type FinFET or a p-type FinFET may be formed on the semiconductor substrate 200 in the subsequent processes. In some embodiments, the dopant concentration in various doped regions may be different.

In some embodiments, a pad layer 202a and a mask layer 202b are sequentially formed on the semiconductor substrate 200. The pad layer 202a may be a silicon oxide thin film formed by, for example, a thermal oxidation process. In some embodiments, the pad layer 202a may act as an adhesion layer between the semiconductor substrate 200 and the mask layer 202b. In some embodiments, the pad layer 202a may also act as an etch stop layer for etching the mask layer 202b. In some embodiments, the mask layer 202b may be a silicon nitride layer formed by low-pressure chemical vapor deposition (LPCVD) or plasma enhanced chemical vapor deposition (PECVD). In some alternative embodiments, the mask layer 202b may be formed by thermal nitridation of silicon. The mask layer 202b is used as a hard mask during subsequent photolithography processes. A patterned photoresist layer 204 having a predetermined pattern is formed on the mask layer 202b.

Figure 1B:
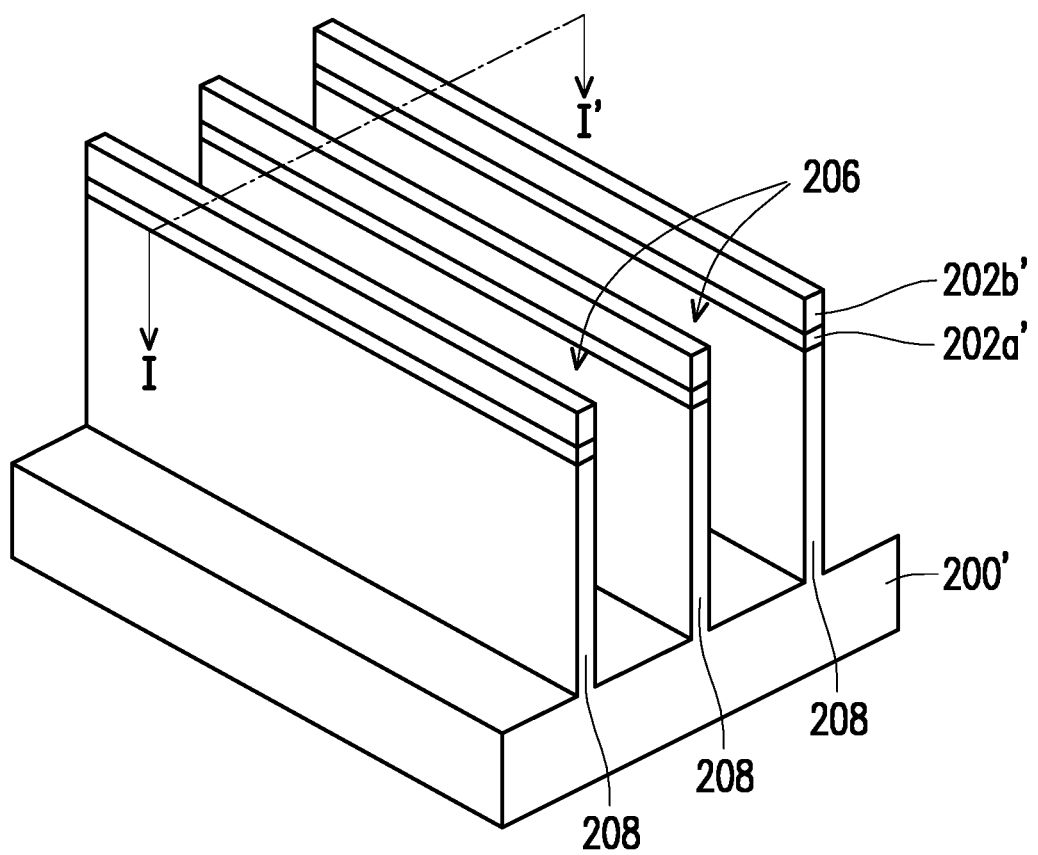
Figure 2B:
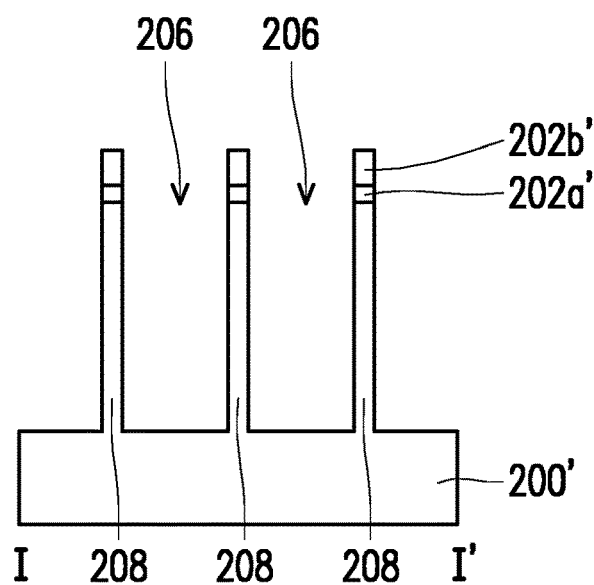

FIG. 1B is a perspective view illustrating one of various stages of a method of manufacturing a semiconductor device 10 in accordance with some embodiments of the disclosure. FIG. 2B is a cross-sectional view of the semiconductor device 10 taken along line I-I' of FIG. 1B. Referring to FIG. 1B and FIG. 2B, portions of the mask layer 202b and the pad layer 202a not covered by the patterned photoresist layer 204 are sequentially etched to form a patterned mask layer 202b' and a patterned pad layer 202a'. The patterned mask layer 202b' and the patterned pad layer 202a' expose the underlying semiconductor substrate 200. By using the patterned mask layer 202b', the patterned pad layer 202a', and the patterned photoresist layer 204 as a mask, portions of the semiconductor substrate 200 are exposed and etched to form a plurality of trenches 206 and a plurality of semiconductor fins 208 located between the trenches 206. In some embodiments, the semiconductor substrate 200 may be etched through an isotropic etching process or an anisotropic etching process. For example, the semiconductor substrate 200 may be etched through a reactive ion etch (RIE), a neutral beam etch (NBE), the like, or a combination thereof to form a semiconductor substrate 200' having the semiconductor fins 208 thereon. Although FIG. 1B and FIG. 2B illustrated that the semiconductor fins 208 have straight profile, the configuration merely serves as an exemplary illustration. In some embodiments, the semiconductor fins 208 may not have straight profile. In other words, in some embodiments, at least a portion of sidewalls of the semiconductor fins 208 is slanted. In some embodiments, P wells (not shown) or N wells may be formed in the semiconductor fins 208 or the semiconductor substrate 200'.

As illustrated in FIG. 1B and FIG. 2B, the semiconductor fins 208 protrude from the semiconductor substrate 200' to separate two adjacent trenches 206. In some embodiments, widths of the semiconductor fins 208 may be smaller than 30 nm. In some embodiments, heights of the semiconductor fin 208 and depths of the trenches 206 range from about 5 nm to about 500 nm. After the trenches 206 and the semiconductor fins 208 are formed, the patterned photoresist layer 204 is removed. Thereafter, a cleaning process may be performed to remove native oxides of the semiconductor substrate 200' and the semiconductor fins 208. The cleaning process may be performed using diluted hydrofluoric (DHF) acid or other suitable cleaning solutions.

Figure 1C:
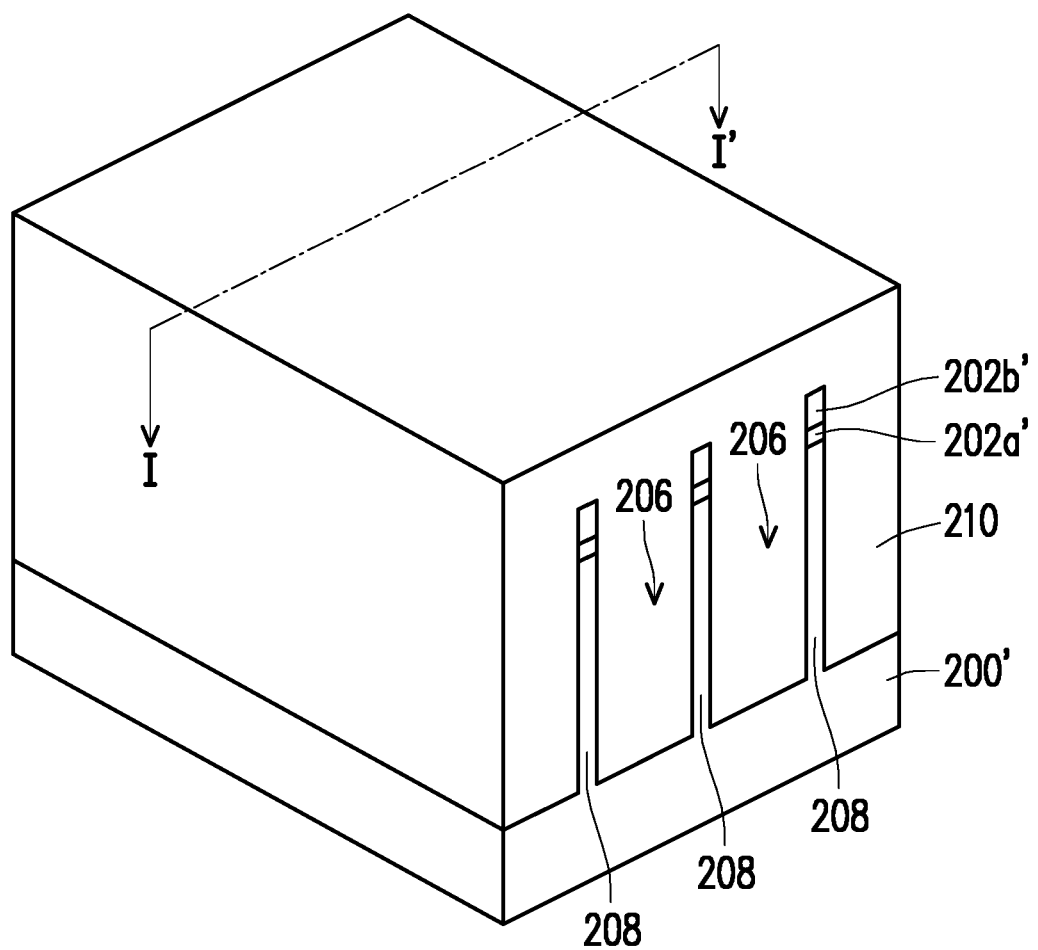
Figure 2C:
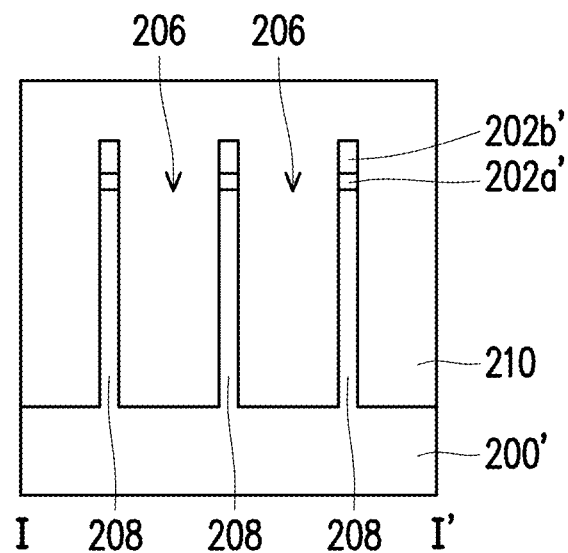

FIG. 1C is a perspective view illustrating one of various stages of a method of manufacturing a semiconductor device 10 in accordance with some embodiments of the disclosure. FIG. 2C is a cross-sectional view of the semiconductor device 10 taken along line I-I' of FIG. 1C. Referring to FIG. 1C and FIG. 2C, an insulating material 210 is formed over the semiconductor substrate 200'. In some embodiments, the insulating material 210 fills up the trenches 206 and covers the semiconductor fins 208, the patterned pad layer 202a', and the patterned mask layer 202b'. The insulating material 210 may include silicon oxide, silicon nitride, silicon oxynitride, a spin-on dielectric material, or a low-k dielectric material. The low-k dielectric materials are generally referring to dielectric materials having a dielectric constant lower than 3.9. The insulating material 210 may be formed by High Density Plasma Chemical Vapor Deposition (HDPCVD), Sub Atmospheric Chemical Vapor Deposition (SACVD), spin-on, or other suitable processes.

Figure 1D:
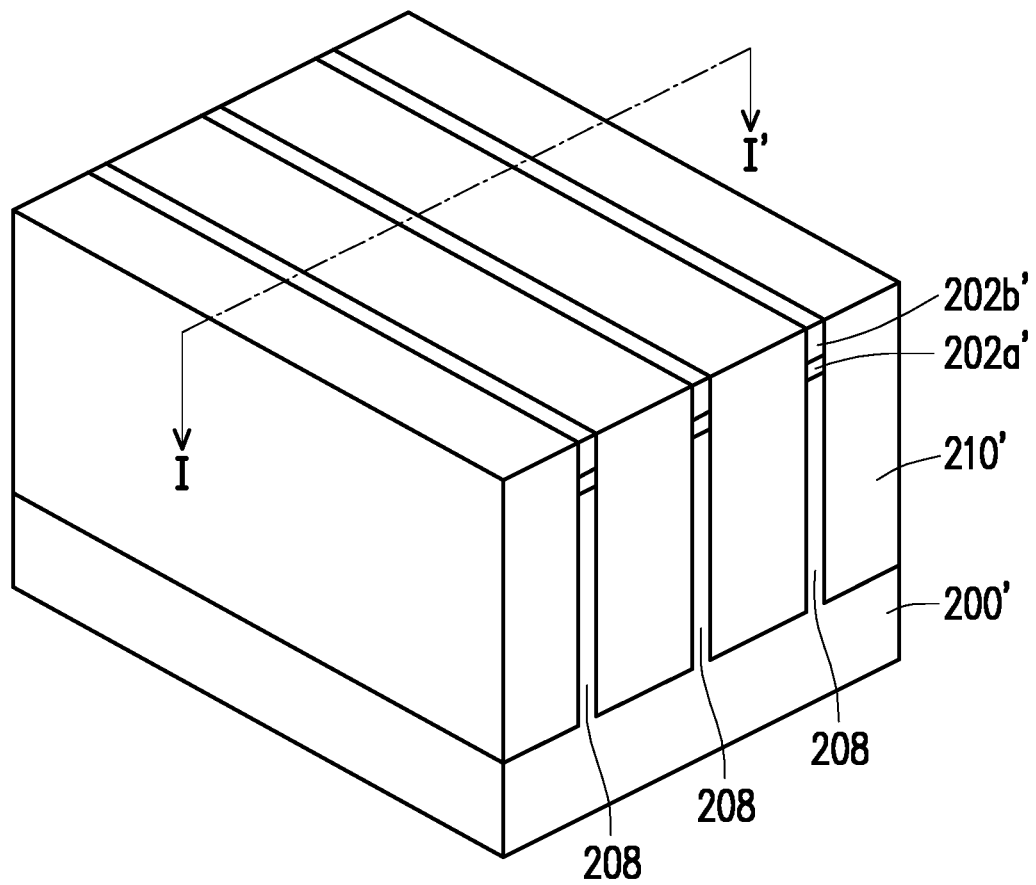
Figure 2D:
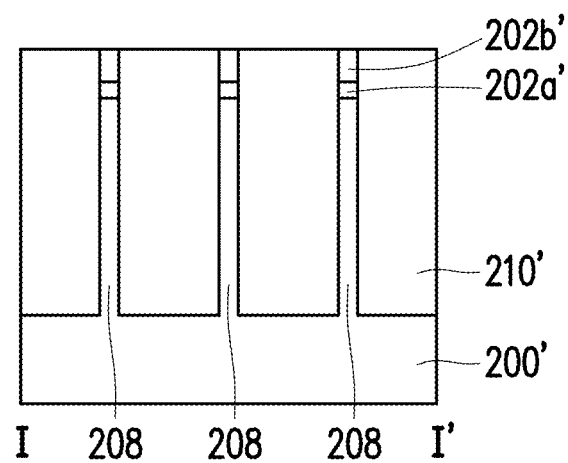

FIG. 1D is a perspective view illustrating one of various stages of a method of manufacturing a semiconductor device 10 in accordance with some embodiments of the disclosure. FIG. 2D is a cross-sectional view of the semiconductor device 10 taken along line I-I' of FIG. 1D. Referring to FIG. 1D and FIG. 2D, a planarization process is performed on the insulating material 210. In some embodiments, a portion of the insulating material 210 is removed to form a polished insulating material 210'. The planarization process includes, for example, a chemical mechanical polish (CMP) process, an etch back process, combinations thereof, or the like. In some embodiments, after the insulating material 210 is planarized, a top surface of the polished insulating material 210' is substantially coplanar with a top surface of the patterned mask layer 202b'. In other words, the top surfaces of the semiconductor fins 208 are protected by the patterned pad layer 202a' and the patterned mask layer 202b' and are not revealed.

Figure 1E:
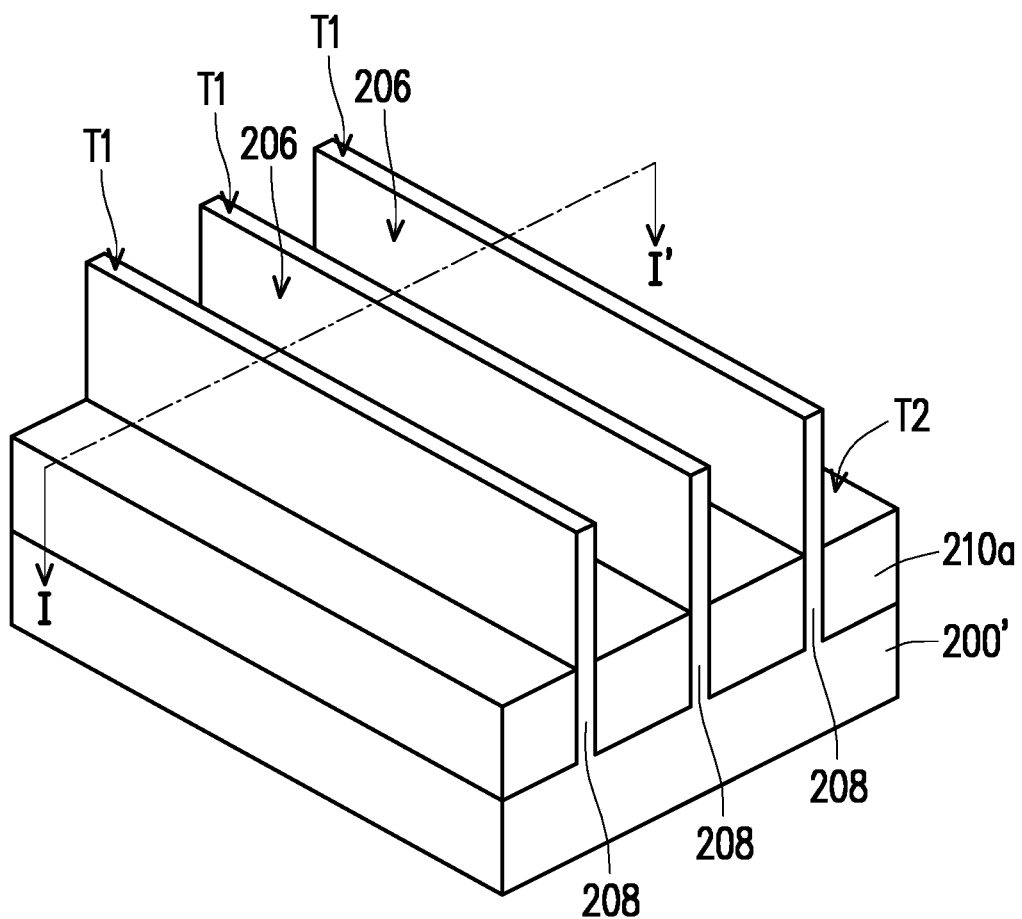
Figure 2E:
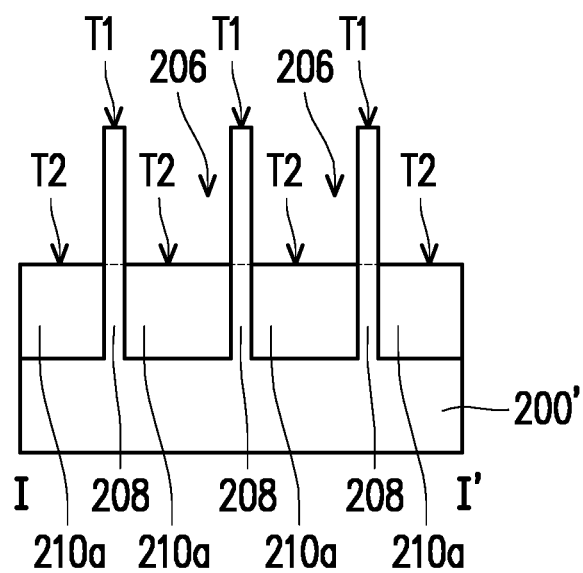

FIG. 1E is a perspective view illustrating one of various stages of a method of manufacturing a semiconductor device 10 in accordance with some embodiments of the disclosure. FIG. 2E is a cross-sectional view of the semiconductor device 10 taken along line I-I' of FIG. 1E. Referring to FIG. 1E and FIG. 2E, the polished insulating material 210' filled in the trenches 206 is partially removed by an etching process to form a plurality of insulators 210a in the trenches 206. In some embodiments, the polished insulating material 210' may be etched off by a wet etching process with hydrofluoric acid (HF). Alternatively, the polished insulating material 210' may be etched off by a dry etching process with $HF_3$ and $NH_3$ gases. During the dry etching process, plasma may be generated and Argon may also be included. As illustrated in FIG. 1E and FIG. 2E, each semiconductor fin 208 is sandwiched between two adjacent insulators 210a. In some embodiments, top surfaces T2 of the insulators 210a are lower than top surfaces T1 of the semiconductor fins 208. For example, the semiconductor fins 208 protrude from the top surfaces T2 of the insulators 210a. In some embodiments, a height difference between the top surfaces T1 of the semiconductor fins 208 and the top surfaces T2 of the insulators 210a ranges from about 15 nm to about 50 nm. In some embodiments, the insulators 210a may be referred to as "Shallow Trench Isolation (STI)." In some embodiments, the top surfaces T2 of the insulators 210a may have a flat surface (as shown in FIG. 1E and FIG. 2E), a convex surface, a concave surface, or a combination thereof.

Figure 1F:
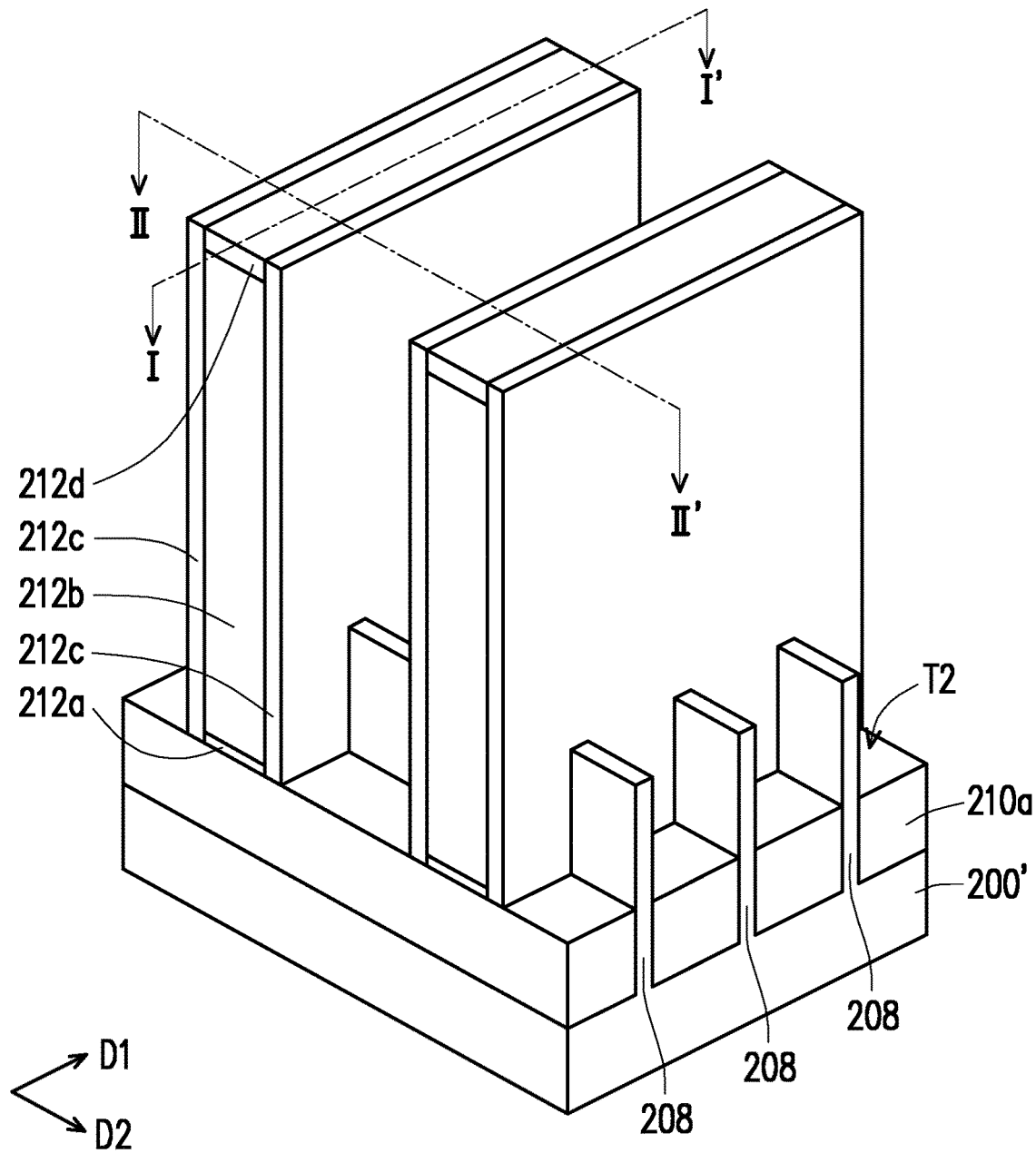
Figure 2F:
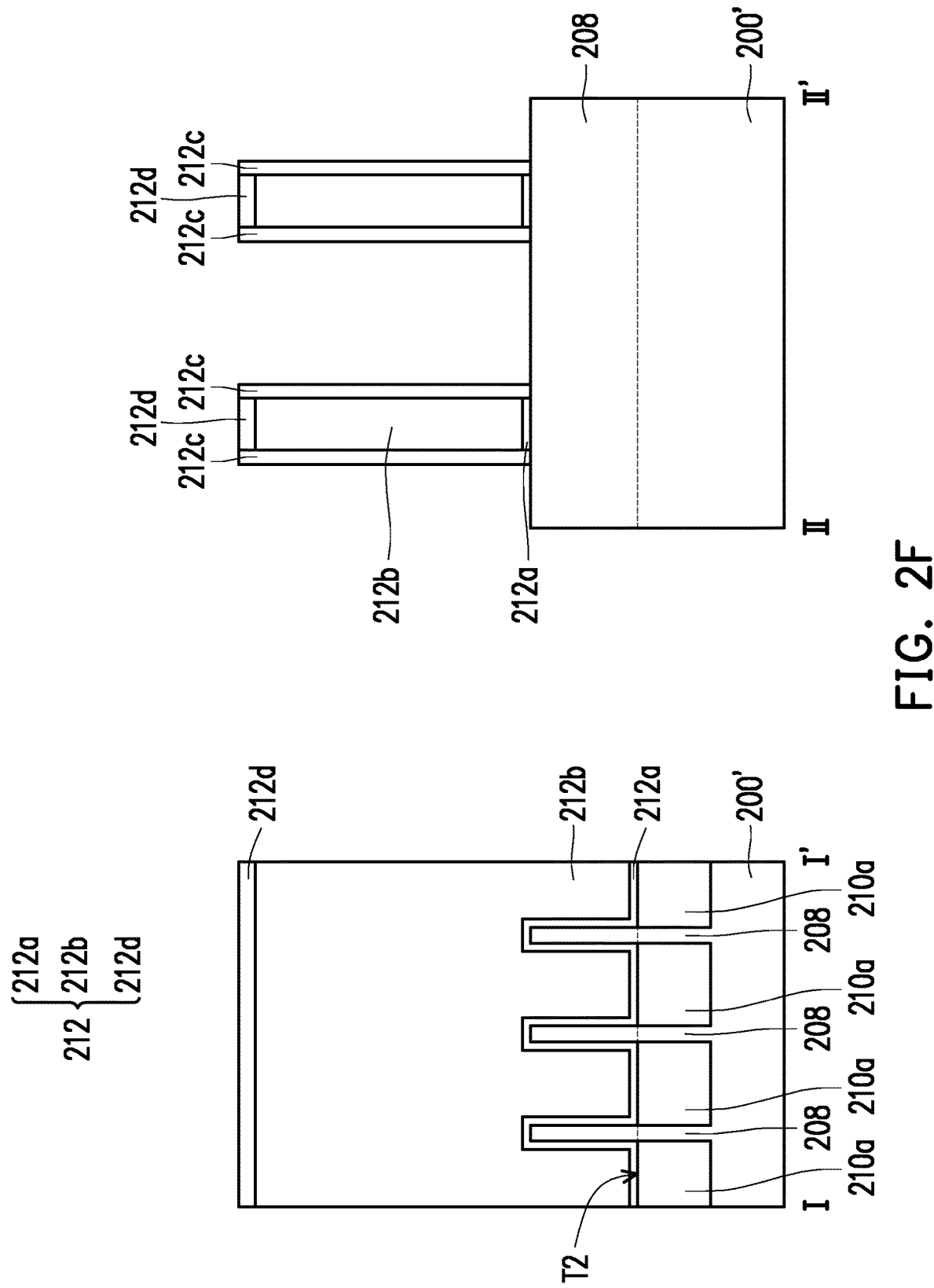

FIG. 1F is a perspective view illustrating one of various stages of a method of manufacturing a semiconductor device 10 in accordance with some embodiments of the disclosure. FIG. 2F is a cross-sectional view of the semiconductor device 10 taken along lines I-I' and II-II' of FIG. 1F. Referring to FIG. 1F and FIG. 2F, a plurality of dummy gate structures 212 is formed over a portion of the semiconductor fins 208 and a portion of the insulators 210a. In some embodiments, the dummy gate structures 212 are formed across the semiconductor fins 208. For example, an extending direction D1 of the dummy gate structures 212 may be perpendicular to an extending direction D2 of the semiconductor fins 208. In some embodiments, each dummy gate structure 212 includes a dummy gate dielectric layer 212a, a dummy gate 212b disposed over the dummy gate dielectric layer 212a, and a mask layer 212d disposed over the dummy gate 212b. In some embodiments, the dummy gate dielectric layer 212a is conformally formed over a portion of the insulators 210a and a portion of the semiconductor fins 208. In some embodiments, the dummy gate dielectric layer 212a may include silicon oxide, silicon nitride, or silicon oxynitride. The dummy gate dielectric layer 212a may be formed using a suitable process, such as Atomic Layer Deposition (ALD), Chemical Vapor Deposition (CVD), Physical Vapor Deposition (PVD), thermal oxidation, UV-ozone oxidation, or a combination thereof. The dummy gate dielectric layer 212a may be formed to separate the semiconductor fins 208 and the dummy gate 212b and to function as an etching stop layer.

As illustrated in FIG. 1F and FIG. 2F, the dummy gate 212b is formed on the dummy gate dielectric layer 212a. In some embodiments, the dummy gate 212b may be a single-layered structure or a multi-layered structure. In some embodiments, the dummy gate 212b includes a silicon-containing material, such as poly-silicon, amorphous silicon, or a combination thereof. In some embodiments, a thickness of the dummy gate 212b ranges between 30 nm and 90 nm. The dummy gate 212b may be formed by a suitable process, such as ALD, CVD, PVD, plating, or a combination thereof. In some embodiments, the mask layer 212d is formed on the dummy gate 212b. In some embodiments, the mask layer 212d may be formed of silicon nitride, silicon oxide, silicon carbo-nitride, combinations thereof, or the like.

In addition to the dummy gate structures 212, multiple pairs of spacers 212c are also formed over portions of the semiconductor fins 208 and portions of the insulators 210a. As illustrated in FIG. 1F and FIG. 2F, the spacers 212c are disposed on sidewalls of the dummy gate structures 212. For example, the dummy gate dielectric layer 212a, the dummy gate 212b, and the mask layer 212d are sandwiched between a pair of spacers 212c. In some embodiments, the spacers 212c and the dummy gate structures 212 have the same extending direction D1. Similar to the dummy gate structures 212, the spacers 212c are also formed across the semiconductor fins 208. In some embodiments, the spacers 212c are formed of dielectric materials, such as silicon oxide, silicon nitride, carbonized silicon nitride (SiCN), SiCON, or a combination thereof. In some embodiments, the spacers 212c may be formed by a thermal oxidation or a deposition followed by an anisotropic etch. It should be noted that the spacers 212c may be a single-layered structure or a multi-layered structure.

Figure 1G:
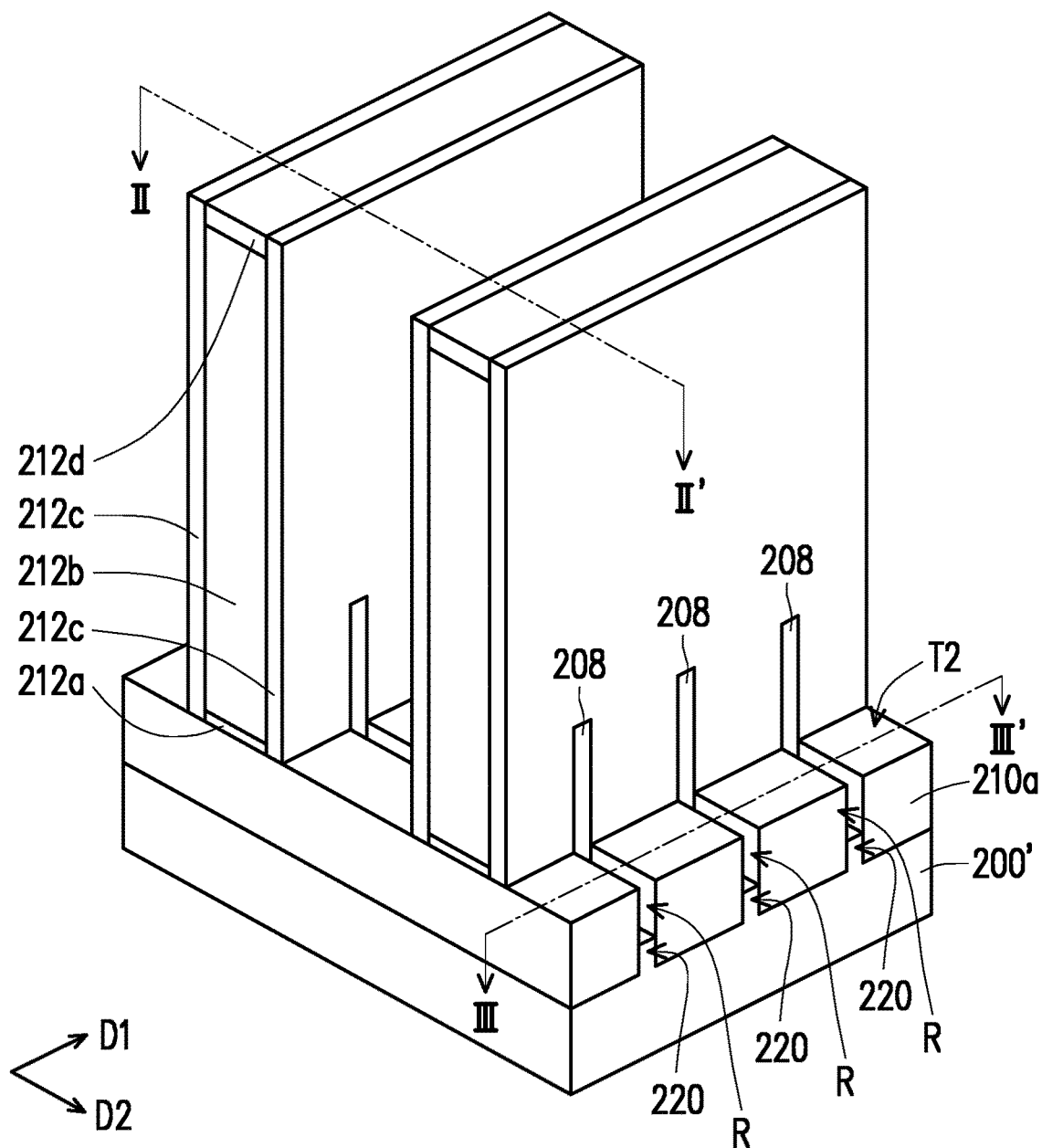
Figure 2G:
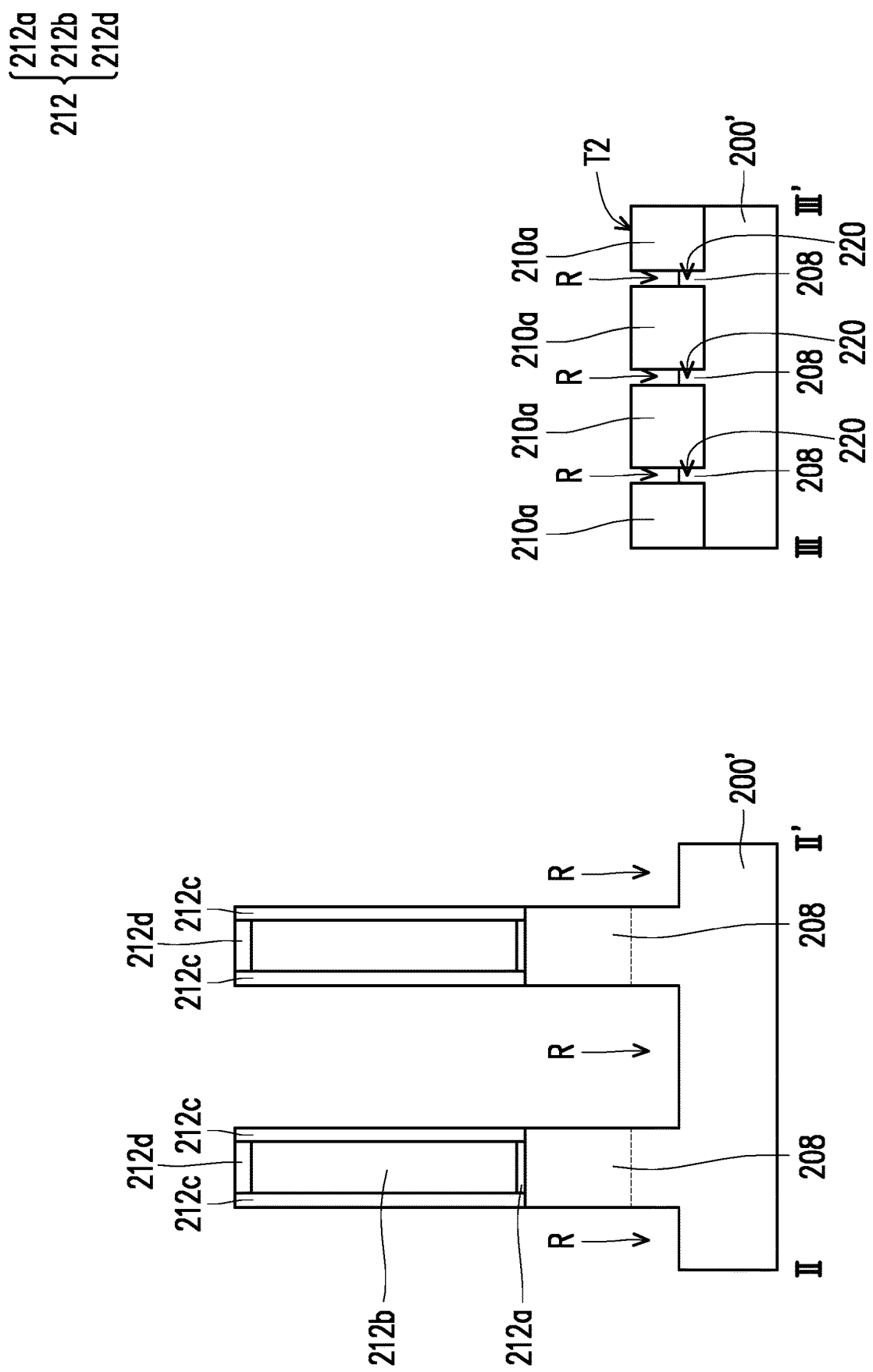

FIG. 1G is a perspective view illustrating one of various stages of a method of manufacturing a semiconductor device 10 in accordance with some embodiments of the disclosure. FIG. 2G is a cross-sectional view of the semiconductor device 10 taken along lines II-II' and III-III' of FIG. 1G. Referring to FIG. 1G and FIG. 2G, the semiconductor fins 208 exposed by the dummy gate structure 212 and the spacers 212c are removed/recessed to form a plurality of recessed portions R. Portions of the semiconductor fins 208 may be removed by, for example, anisotropic etching, isotropic etching, or a combination thereof. In some embodiments, portions of the semiconductor fins 208 are recessed below the top surfaces T2 of the insulators 210a. In some embodiments, a depth of the recessed portions R is less than a thickness of the insulators 210a. In other words, the semiconductor fins 208 exposed by the dummy gate structure 212 and the spacers 212c are not entirely removed, and the remaining semiconductor fins 208 located in the recessed portion R form source/drain regions 220 of the semiconductor fins 208. As illustrated in FIG. 1G and FIG. 2G, the semiconductor fins 208 covered by the dummy gate structure 212 and the spacers 212c are not etched and are exposed at sidewalls of the spacers 212c.

Figure 1H:
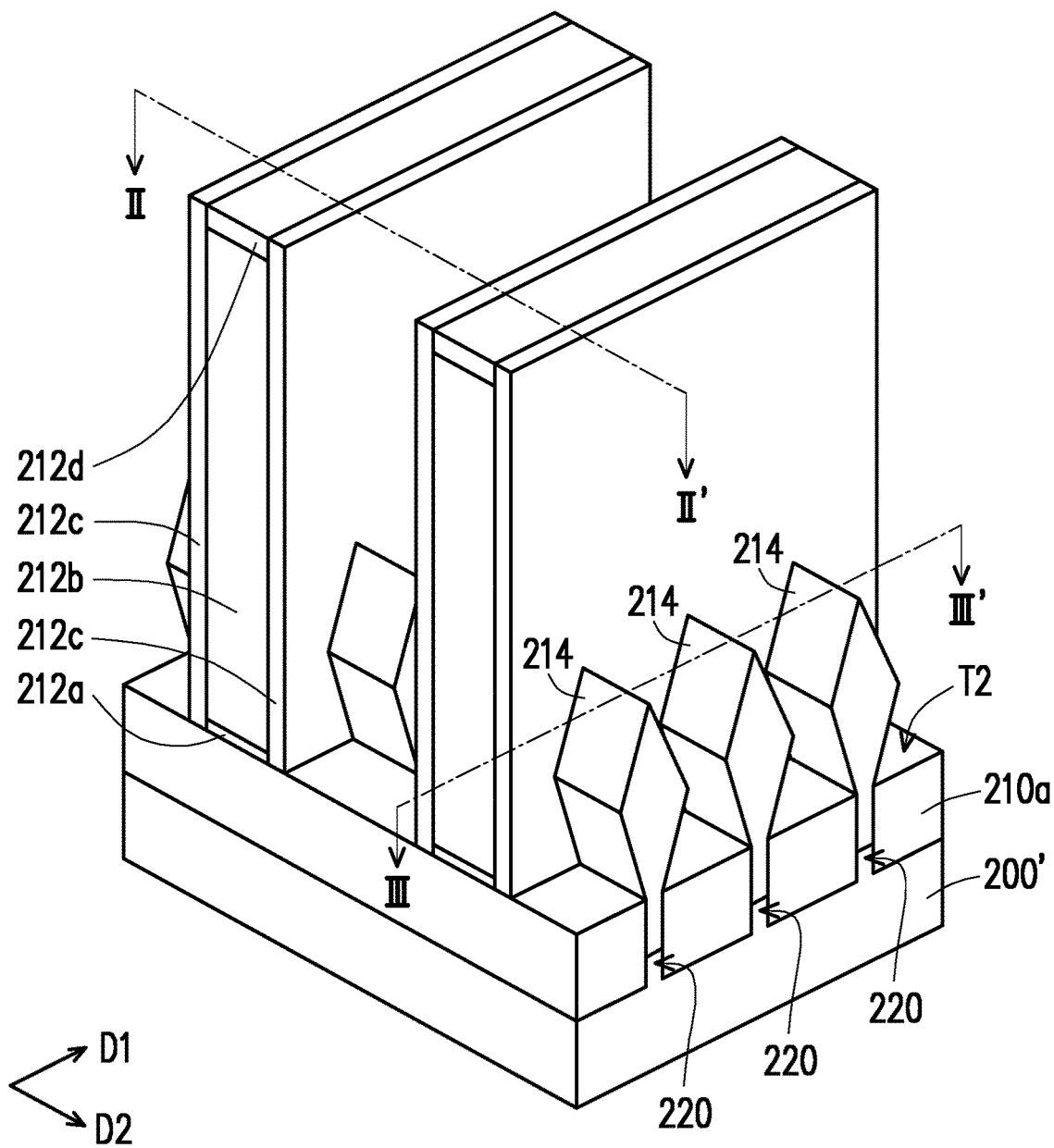

FIG. 1H is a perspective view illustrating one of various stages of a method of manufacturing a semiconductor device 10 in accordance with some embodiments of the disclosure. FIG. 2H is a cross-sectional view of the semiconductor device 10 taken along lines II-II' and III-III' of FIG. 1H. Referring to FIG. 1H and FIG. 2H, a plurality of strained material structures 214 (or a highly doped low resistance material structure) is grown over the recessed portions R of the semiconductor fins 208 and extends beyond the top surfaces T2 of the insulators 210a. That is, the strained material structures 214 are formed over portions of the semiconductor fins 208 revealed by the dummy gate structure 212 and the spacers 212c. In some embodiments, the strained material structures 214 are grown to strain or stress the semiconductor fins 208. In some embodiments, the strained material structures 214 are formed over the source/drain regions 220 of the semiconductors fins 208 to function as sources/drains of the subsequently formed device. In some embodiments, the strained material structures 214 are formed such that each dummy gate structure 212 is disposed between respective neighboring pairs of the strained material structures 214. For example, the strained material structures 214 include a source disposed at a side of one of the spacers 212c and a drain disposed at a side of another one of the spacers 212c. As illustrated in FIG. 1H and FIG. 2H, the dummy gate structures 212 are separated from the neighboring strained material structures 214 by the corresponding spacers 212c. As such, appropriate lateral distance is maintained between the dummy gate structures 212 and the strained material structures 214, so the strained material structures 214 do not short out with the subsequently formed gates of the resulting device.

In some embodiments, the strained material structures 214 may be doped with a conductive dopant. In some embodiments, the strained material structures 214, such as SiGe, SiGeB, Ge, GeSn, or the like, are epitaxial-grown with p-type dopants for straining a p-type FinFET. That is, the strained material structures 214 are doped with the p-type dopants to be the source and the drain of the p-type FinFET. The p-type dopants include boron or $BF_2$. In some alternative embodiments, the strained material structures 214, such as SiC, SiP, SiCP, a combination of SiC/SiP, or the like, are epitaxial-grown with n-type dopants for straining an n-type FinFET. That is, the strained material structures 214 are doped with the n-type dopants to be the source and the drain of the n-type FinFET. The n-type dopants include arsenic and/or phosphorus. In some embodiments, the strained material structures 214 may be epitaxial-grown by LPCVD process with in-situ doping. In some embodiments, a concentration of the dopant in the strained material structures 214 may range between about $10^{19}$ cm$^{-3}$ and about $10^{21}$ cm$^{-3}$. Depending on the type of the device, the strained material structures 214 in different regions may be doped with different type of dopants. Similarly, depending on the function of the device, the strained material structures 214 in different regions may be doped with different dopant concentrations. In some embodiments, each of the strained material structures 214 may be a single-layered structure or a multi-layered structure.

As mentioned above, the strained material structures 214 may include SiGe, SiGeB, Ge, GeSn, SiC, SiP, SiCP, a combination of SiC/SiP, or the like. However, the disclosure is not limited thereto. In some alternative embodiments, the strained material structures 214 may also include III-V compound semiconductors, such as GaAs, InP, GaN, InGaAs, InAlAs, GaSb, AlSb, AlAs, AlP, GaP, or a combination thereof. As illustrated in FIG. 1G to FIG. 1H and FIG. 2G to FIG. 2H, after the strained material structures 214 are grown to reach the top surfaces T2 of the insulators 210a, the epitaxial growth of the strained material structures 214 continues. In some embodiments, the strained material structures 214 above the top surfaces T2 of the insulators 210a expand horizontally and facets are formed for each of the strained material structure 214. As shown in FIG. 1H and FIG. 2H, the strained material structures 214 are separated from each other. However, the disclosure is not limited thereto. In some alternative embodiments, the further growth of the strained material structures 214 above the top surfaces T2 of the insulators 210a may cause neighboring strained material structures 214 to merge with each other.

It should be noted that the recess step illustrated in FIG. 1G and FIG. 2G may be omitted in some embodiments. For example, the strained material structures 214 may be formed on the un-recessed semiconductor fins 208. That is, the strained material structures 214 may be formed on the source/drain regions 220 of the un-recessed semiconductor fins 208.

Figure 1I:
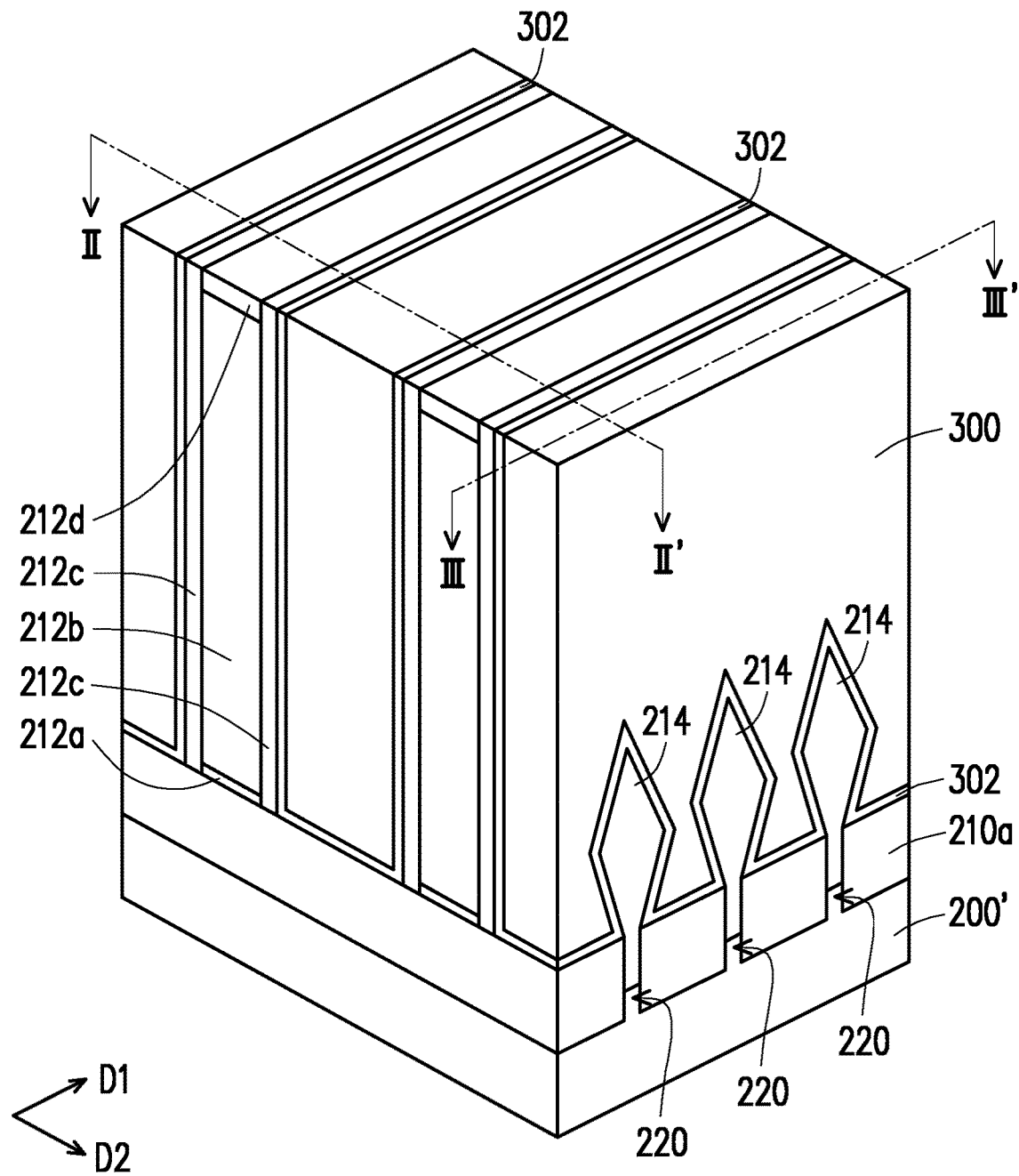
Figure 2I:
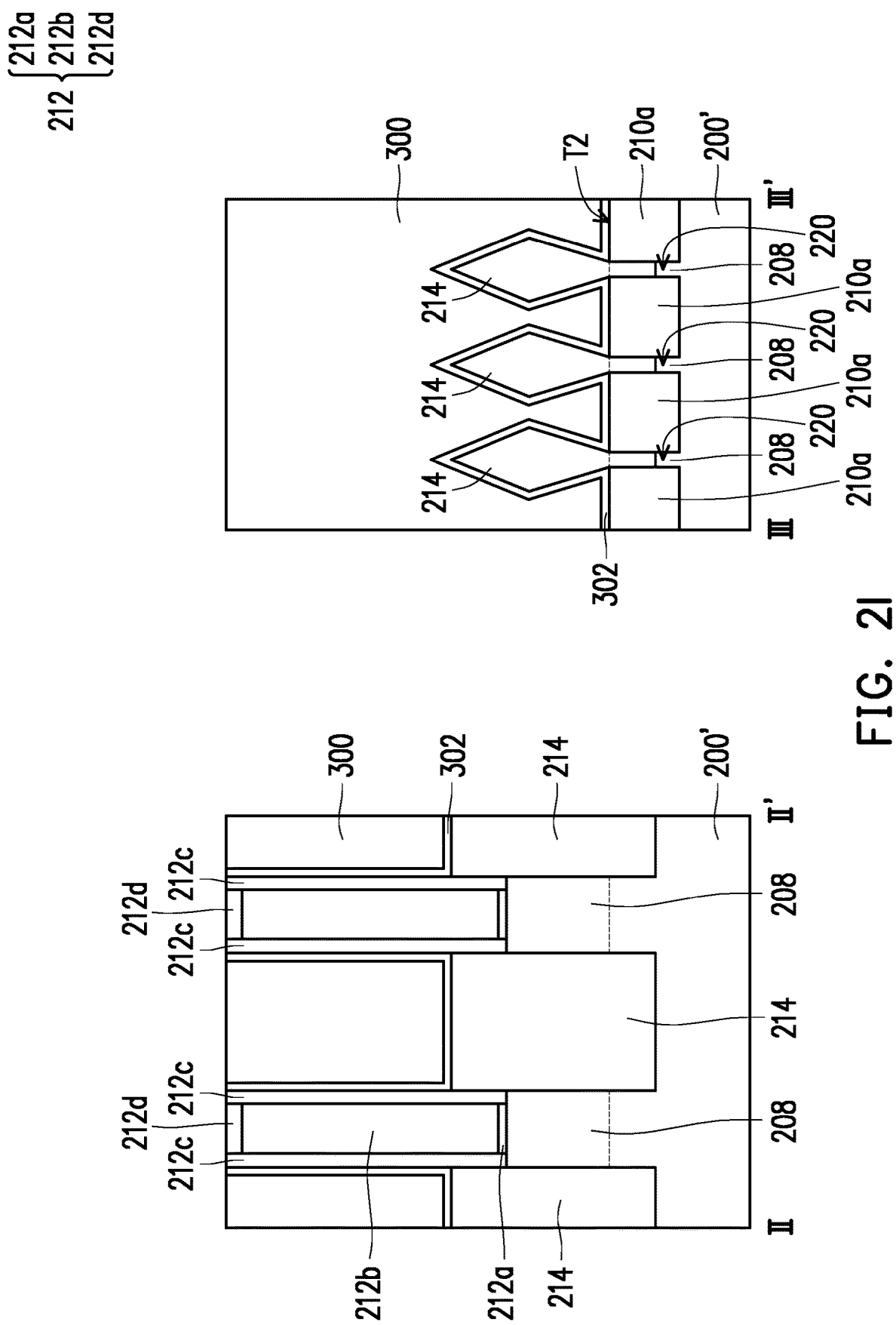

FIG. 1I is a perspective view illustrating one of various stages of a method of manufacturing a semiconductor device 10 in accordance with some embodiments of the disclosure. FIG. 2I is a cross-sectional view of the semiconductor device 10 taken along lines II-II' and III-III' of FIG. 1I. Referring to FIG. 1I and FIG. 2I, an etch stop layer 302 and an interlayer dielectric layer 300 are sequentially formed over the strained material structures 214 and the insulators 210a. In some embodiments, the etch stop layer 302 is formed adjacent to the spacers 212c. As illustrated in FIG. 1I and FIG. 2I, the etch stop layer 302 is conformally formed on the top surfaces T2 of the insulators 210a and the strained material structures 214. That is, the etch stop layer 302 follows the profile (the facet) of the strained material structures 214. In some embodiments, the etch stop layer 302 may be formed of silicon oxide, silicon nitride, silicon carbo-nitride, or the like. In some embodiments, the etch stop layer 302 may be formed through, for example, CVD, SACVD, Molecular Layer Deposition (MLD), ALD, or the like. In some embodiments, the etch stop layer 320 may be referred to as "contact etch stop layer (CESL)."

As illustrated in FIG. 1I and FIG. 2I, the interlayer dielectric layer 300 is formed on the etch stop layer 302. In some embodiments, the interlayer dielectric layer 300 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the interlayer dielectric layer 300 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 300 may include one or more dielectric materials and/or one or more dielectric layers. In some embodiments, the interlayer dielectric layer 300 is formed to a suitable thickness by Flowable Chemical Vapor Deposition (FCVD), CVD, HDPCVD, SACVD, spin-on, sputtering, or other suitable methods. For example, an interlayer dielectric material layer (not shown) may be formed to cover the etch stop layer 302, the dummy gate structures 212, and the spacers 212c. Subsequently, the thickness of the interlayer dielectric material layer is reduced until a top surface of the dummy gate structure 212 is exposed, so as to form the interlayer dielectric layer 300. The reduction the thickness of the interlayer dielectric material layer may be achieved by a chemical mechanical polishing (CMP) process, an etching process, or other suitable processes. After reducing the thickness of the interlayer dielectric material layer, top surfaces of the dummy gate structures 212, top surfaces of the spacers 212c, and a top surface of the interlayer dielectric layer 300 are substantially coplanar.

Figure 1J:
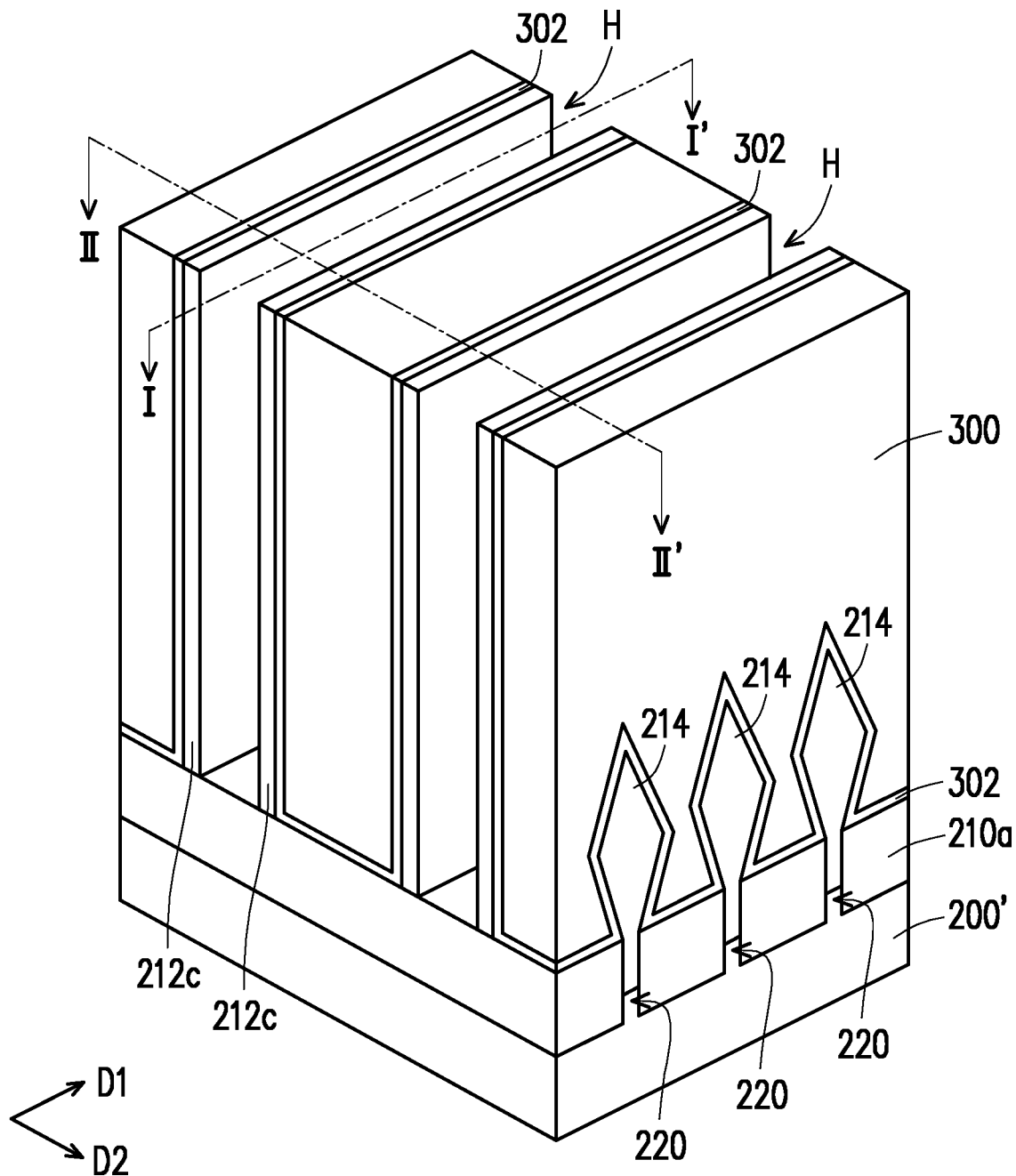

FIG. 1J is a perspective view illustrating one of various stages of a method of manufacturing a semiconductor device 10 in accordance with some embodiments of the disclosure. FIG. 2J is a cross-sectional view of the semiconductor device 10 taken along lines I-I' and II-II' of FIG. 1J. Referring to FIG. 1J and FIG. 2J, the dummy gate structures 212 are removed to form hollow portions H exposing a portion of the semiconductor fins 208. For example, the mask layer 212d, the dummy gate 212b, and the dummy gate dielectric layer 212a are removed to form hollow portions H between two adjacent spacers 212c. In some embodiments, the exposed portion of the semiconductor fins 208 may act as channel regions 230 of the semiconductor fins 208. In some embodiments, the dummy gate structures 212 are removed through an etching process or other suitable processes. The etching process includes, for example, a wet etching process or a dry etching process. Example of the wet etching process includes chemical etching and example of the dry etching process includes plasma etching. However, other commonly known etching methods may also be utilized to remove the dummy gate structures 212. In some embodiments, during the etching process of the dummy gate 212b, the underlying dummy gate dielectric layer 212a may act as an etch stop layer. The dummy gate dielectric layer 212a may be removed after the removal of the dummy gate 212b.

Figure 1K:
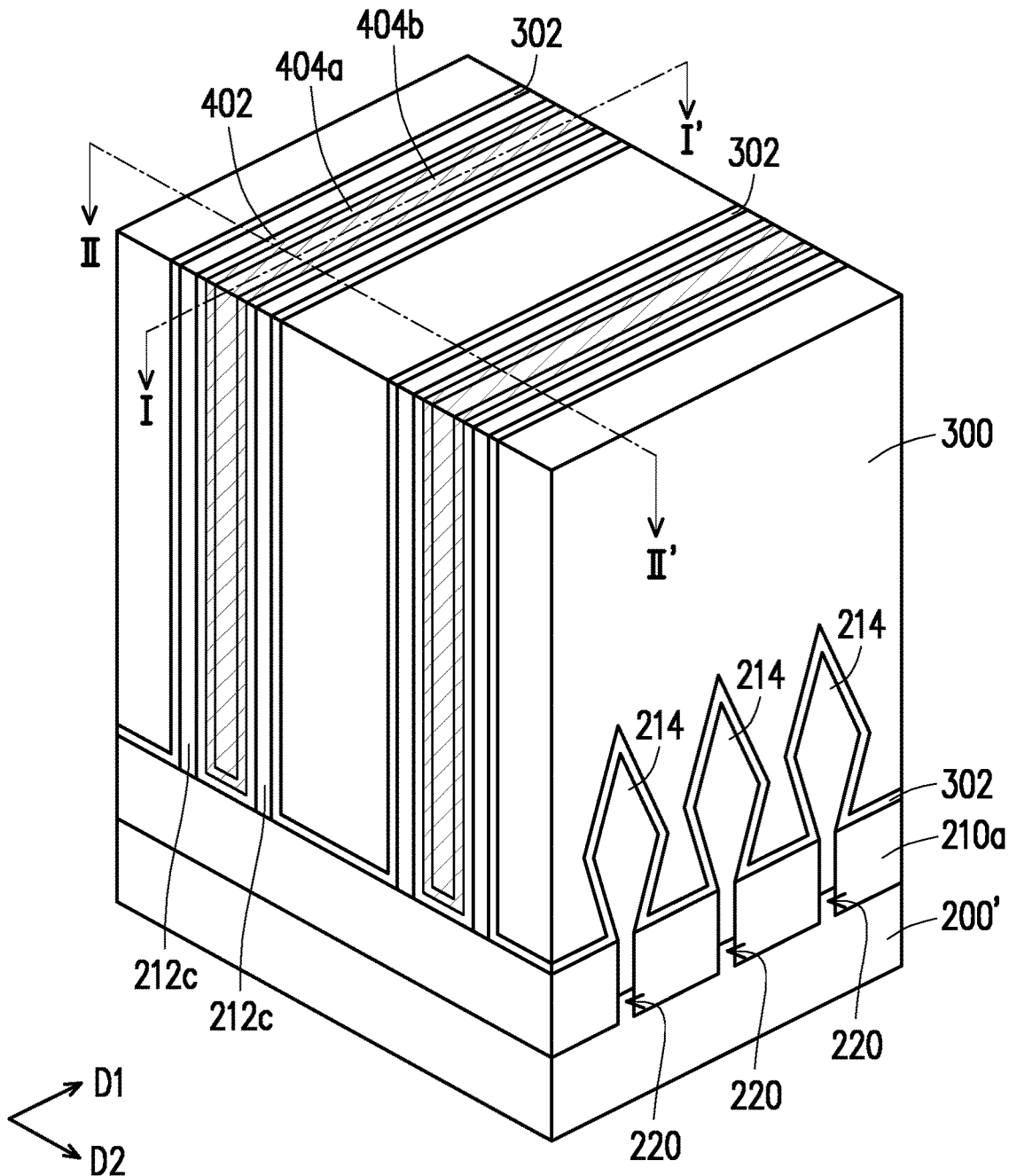

FIG. 1K is a perspective view illustrating one of various stages of a method of manufacturing a semiconductor device 10 in accordance with some embodiments of the disclosure. FIG. 2K is a cross-sectional view of the semiconductor device 10 taken along lines I-I' and II-II' of FIG. 1K. Referring to FIG. 1K and FIG. 2K, a gate dielectric layer 402, a work function layer 404a, and a metal layer 404b are sequentially deposited into the hollow portions H to form gate structures 400. For example, each gate structure 400 is located in the corresponding hollow portion H and is sandwiched between the neighboring spacers 212c. As illustrated in FIG. 1K and FIG. 2K, the gate structures 400 are disposed across the semiconductor fins 208. For example, the gate structures 400 are disposed over the channel regions 230 of the semiconductor fins 208. In some embodiments, the work function layer 404a and the metal layer 404b may be collectively referred to as a gate 404 of the gate structure 400. In some embodiments, the gate dielectric layer 402 is conformally deposited into the hallow portion H. For example, the gate dielectric layer 402 covers the top surface and the sidewalls of the semiconductor fins 208 exposed by the hallow portion H. Meanwhile, the gate dielectric layer 402 also covers sidewalls of the spacers 212c and the top surfaces of the insulators 210a. In some embodiments, a material of the gate dielectric layer 402 may be identical to or different from the material of the dummy gate dielectric layer 212a. For example, the gate dielectric layer 402 includes silicon oxide, silicon nitride, silicon oxynitride, or a combination thereof. In some alternative embodiments, the gate dielectric layers 402 are made of a high-k dielectric material. In some embodiments, the high-k dielectric material refers to dielectric materials having a dielectric constant greater than about 7.0, and may include a metal oxide or a silicate of Hf, Al, Zr, La, Mg, Ba, Ti, Pb, and combinations thereof. In some embodiments, the gate dielectric layer 402 may be formed by, for example, Molecular-Beam Deposition (MBD), ALD, PECVD, thermal oxidation, UV-ozone oxidation, a combination thereof, or the like. In some embodiments, the gate dielectric layer 402 may further include an interfacial layer (not shown). In some embodiments, the interfacial layer may be used in order to create a good interface between the semiconductor fins 208 and the gate 404, as well as to suppress the mobility degradation of the channel carrier of the subsequently formed semiconductor device. In some embodiments, the interfacial layer is formed by a thermal oxidation process, a CVD process, or an ALD process. The interfacial layer includes, for example, silicon oxide or silicon oxynitride. In some embodiments, a liner layer, a seed layer, an adhesion layer, or a combination thereof may be further included between the gates 404 and the semiconductor fins 208.

As illustrated in FIG. 1K and FIG. 2K, the work function layer 404a is conformally disposed on the gate dielectric layer 402. In some embodiments, the work function layer 404a includes p-type or n-type work function metals. Exemplary p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. On the other hand, exemplary n-type work function metals include Ti, Ag, TaAl, TaAlC, TiAlN, TaC, TaCN, TaSiN, Mn, Zr, other suitable n-type work function materials, or combinations thereof. In some embodiments, the work function layer 404a may be formed by, for example, CVD, PECVD, ALD, Remote Plasma Atomic Layer Deposition (RPALD), Plasma-Enhanced Atomic Layer Deposition (PEALD), MBD, or the like. In some embodiments, the work function layer 400 may serve the purpose of adjusting threshold voltage (Vt) of the subsequently formed semiconductor device.

The metal layer 404b is disposed on the work function layer 404a. In some embodiments, the metal layer 404b may include tungsten, cobalt, or the like. In some embodiments, precursor gases for forming the tungsten metal layer 404b may include tungsten hexafluoride (WF$_6$), silane (SiH$_4$), and/or hydrogen (H$_2$). In some embodiments, the metal layer 404b is formed through CVD. In some embodiments, a barrier layer (not shown) may exist between the metal layer 404b and the work function layer 404a. The barrier layer includes, for example, TiN or the like and is formed through ALD.

During the formation of the gate dielectric layer 402, the work function layer 404a, and the metal layer 404b, excessive portions of these layers may be formed outside of the hollow portion H. For example, excessive portions of these layers are formed on the etch stop layer 302 and the interlayer dielectric layer 300. As such, a planarization process, such as a CMP process, may be performed to remove excessive portions of these layers to render the structure illustrated in FIG. 1K and FIG. 2K. As illustrated in FIG. 1K and FIG. 2K, the gate dielectric layer 402 and the work function layer 404a have U-shaped cross-sectional views.

The steps illustrated in FIG. 1I to FIG. 1K and FIG. 2I to FIG. 2J is commonly referred to as a "metal gate replacement process." In some embodiments, the dummy gate structure 212 including polysilicon is replaced by the gate structure 400 which includes metal.

Figure 1L:
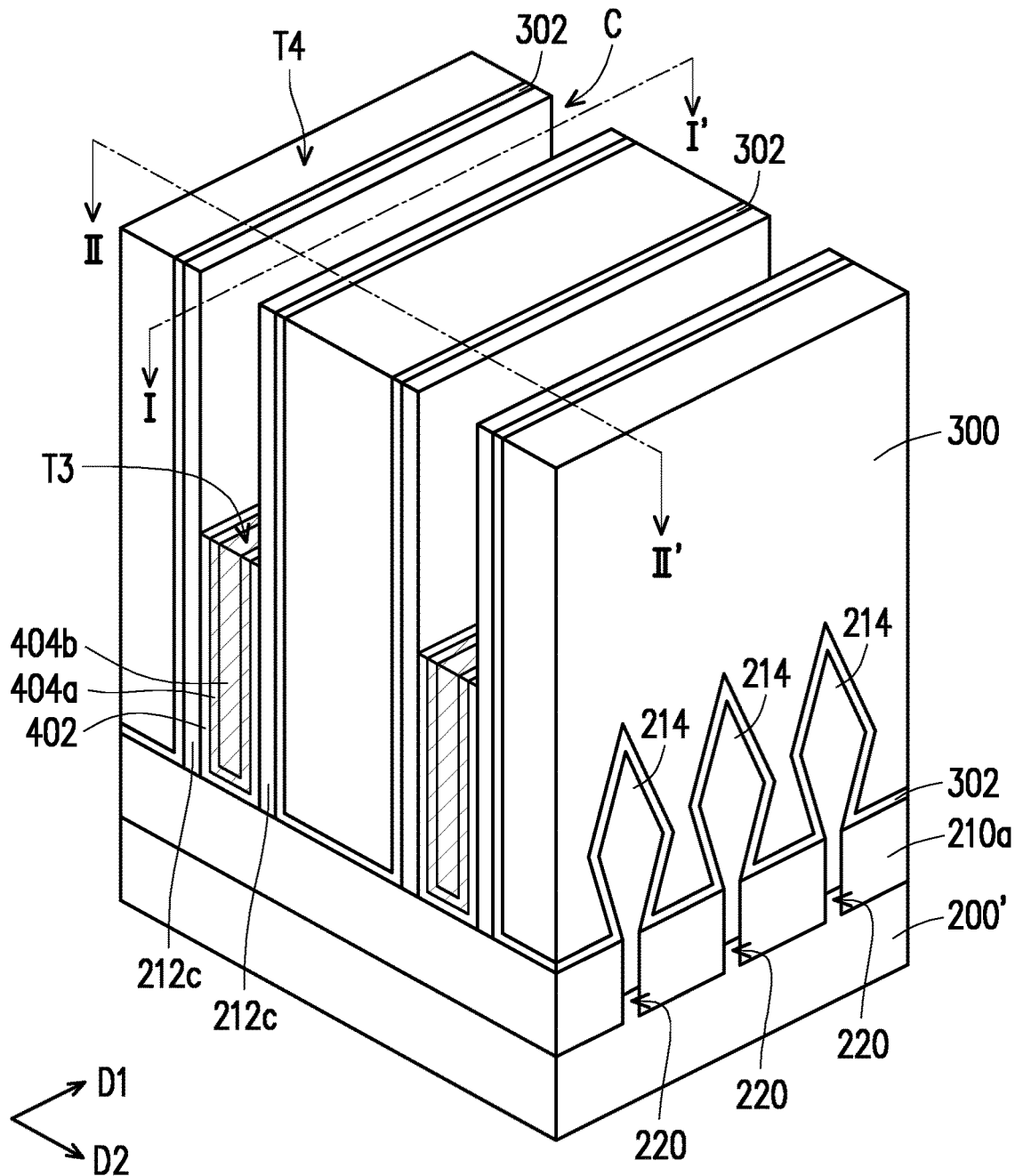

FIG. 1L is a perspective view illustrating one of various stages of a method of manufacturing a semiconductor device 10 in accordance with some embodiments of the disclosure. FIG. 2L is a cross-sectional view of the semiconductor device 10 taken along lines I-I' and II-II' of FIG. 1L. Referring to FIG. 1L and FIG. 2L, a portion of each gate structure 400 is removed to form a plurality of cavities C. Portions of the gate structures 400 may be removed through an etch back process. For example, a portion of the gate dielectric layer 402, a portion of the work function layer 404a, and a portion of the metal layer 404b may be removed through performing a wet etching process or a dry etching process. After the gate structures 400 are partially removed, top surfaces T3 of the gate structures 400 are lower than top surface T4 of the interlayer dielectric layer 300. As illustrated in FIG. 2L, the channel regions 230 of the semiconductor fins 208 are still covered by the gate structures 400 after the gate structures 400 are partially removed.

Figure 1M:
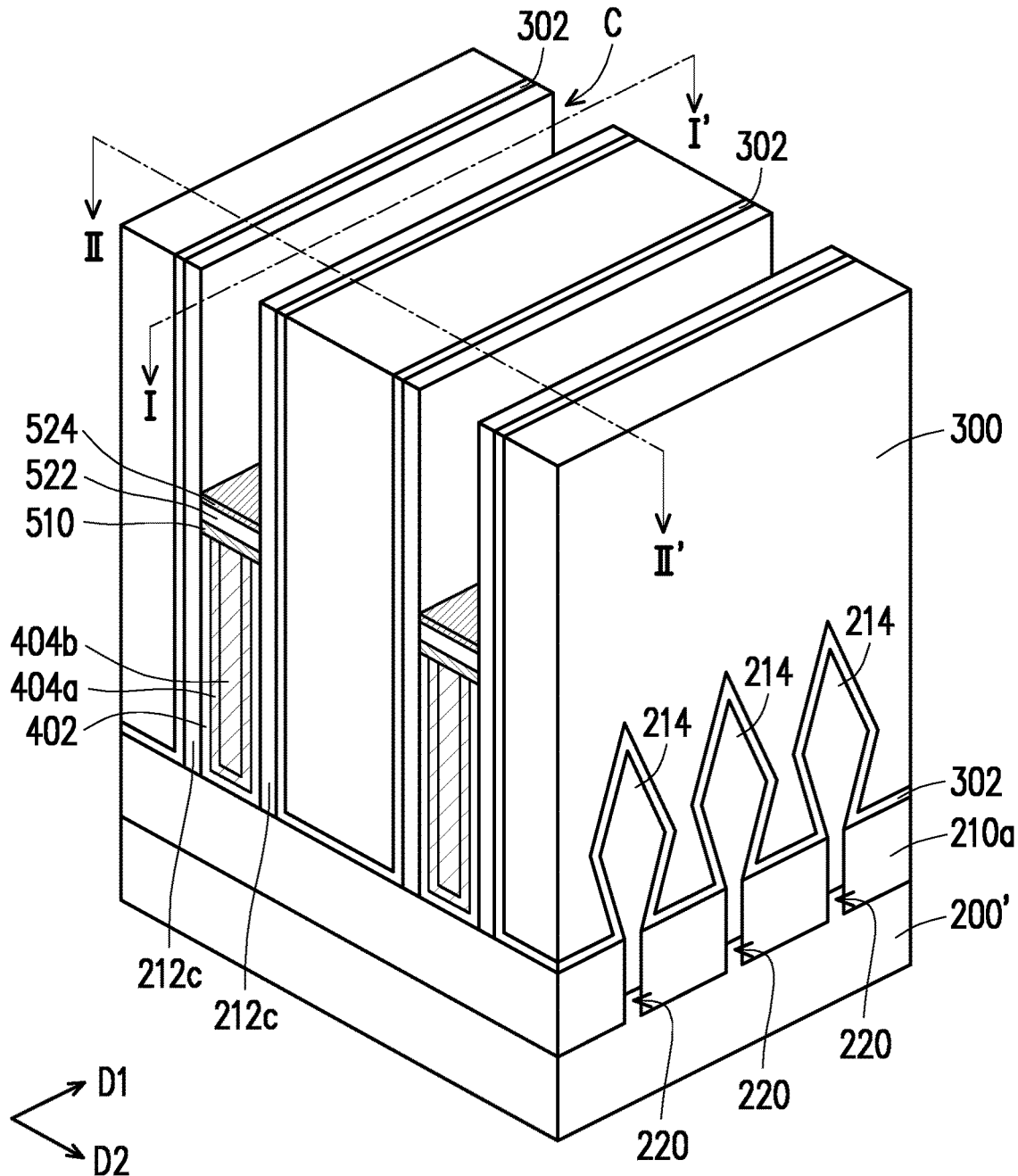

FIG. 1M is a perspective view illustrating one of various stages of a method of manufacturing a semiconductor device 10 in accordance with some embodiments of the disclosure. FIG. 2M is a cross-sectional view of the semiconductor device 10 taken along lines I-I' and II-II' of FIG. 1M. Referring to FIG. 1M and FIG. 2M, a metal layer 510, a precursor layer 522, and a capping metal layer 524 are sequentially deposited in the cavities C. For example, the metal layer 510, the precursor layer 522, and the capping metal layer 524 are sequentially formed on the top surfaces T3 of the gate structures 400. In some embodiments, the metal layer 510 is selectively formed on the gate structures 400. In some embodiments, the metal layer 510 includes, for example, titanium, tantalum, tungsten, cobalt, or the like. The metal layer 510 may be formed through, for example, ALD, CVD, PVD, a combination thereof, or the like.

In some embodiments, the precursor layer 522 is formed on the metal layer 510. For example, the precursor layer 522 is deposited in the cavities C through ALD. In some embodiments, the precursor layer 522 is selectively deposited on the metal layer 510 through ALD with a specific tuning. In some embodiments, the precursor layer 522 includes a hafnium-containing compound and a dopant. In some embodiments, the hafnium-containing compound includes, for example, hafnium dioxide (HfO$_2$), hafnium tetrachloride (HfCl$_4$), tetrakis(ethylmethylamido)hafnium (TEMAH), tetrakis(dimethylamido)hafnium (TDMAH), or a combination thereof. In some embodiments, the hafnium-containing compound may coexist with water. For example, HfCl$_4$/H$_2$O, TEMAH/

H₂O, or TDMAH/H₂O may be used. The dopant in the precursor layer 522 includes, for example, zirconium (Zr), aluminum (Al), lanthanum (La), yttrium (Y), gadolinium (Gd), strontium (Sr), or a combination thereof. The precursor layer 522 may be formed by introducing the dopant in HfO₂ during ALD growth. In other words, the dopant is introduced by an in-situ doping process. As illustrated in FIG. 1M and FIG. 2M, the capping metal layer 524 is formed on the precursor layer 522. For example, the capping metal layer 524 is formed such that the precursor layer 522 is sandwiched between the metal layer 510 and the capping metal layer 524. In some embodiments, a material of the capping metal layer 524 includes, for example, titanium nitride (TiN), tantalum nitride (TaN), tungsten (W), or the like. The capping metal layer 524 may be formed by, for example, ALD, CVD, PVD, a combination thereof, or the like. In some embodiments, the capping metal layer 524 is selectively formed on the precursor layer 522. In some embodiments, the capping metal layer 524 is able to provide mechanical stress to the precursor layer 522, so the crystallinity of the precursor layer 522 may be altered in the subsequent processes.

Figure 1N:
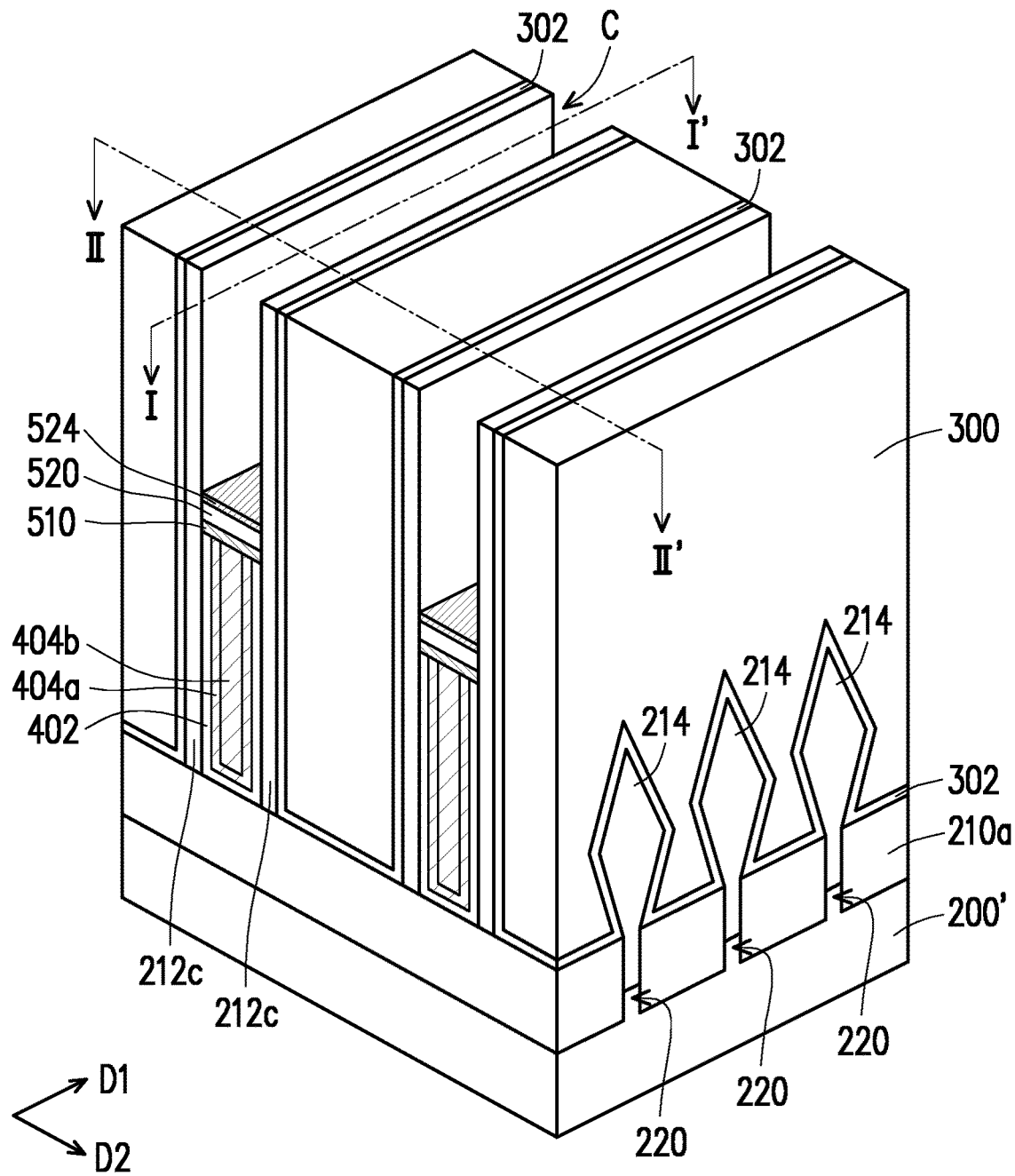
Figure 10:
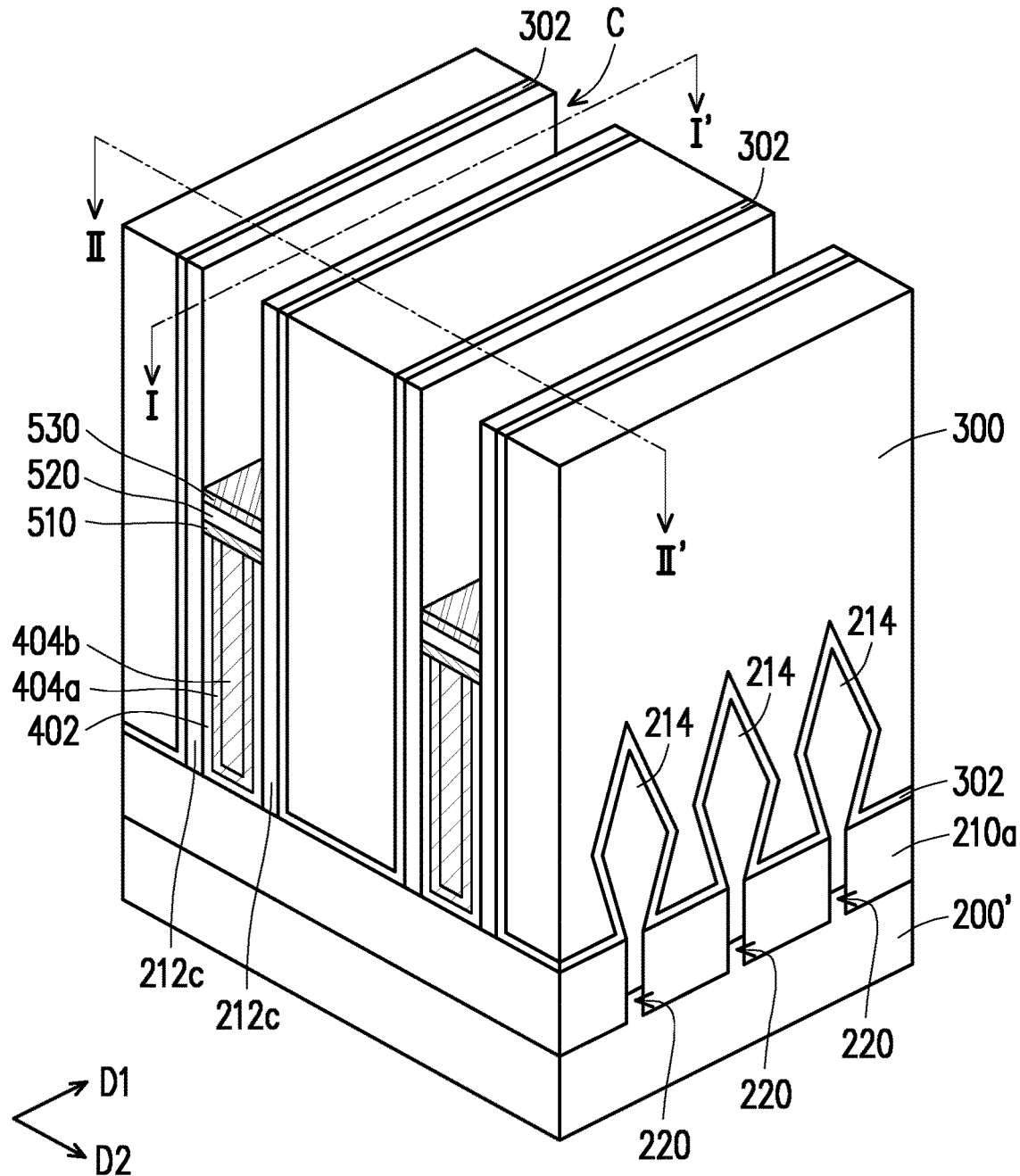
FIG. 10A and FIG. 10B are cross-sectional views of semiconductor devices in accordance with some alternative embodiments of the disclosure.
Figure 2N:
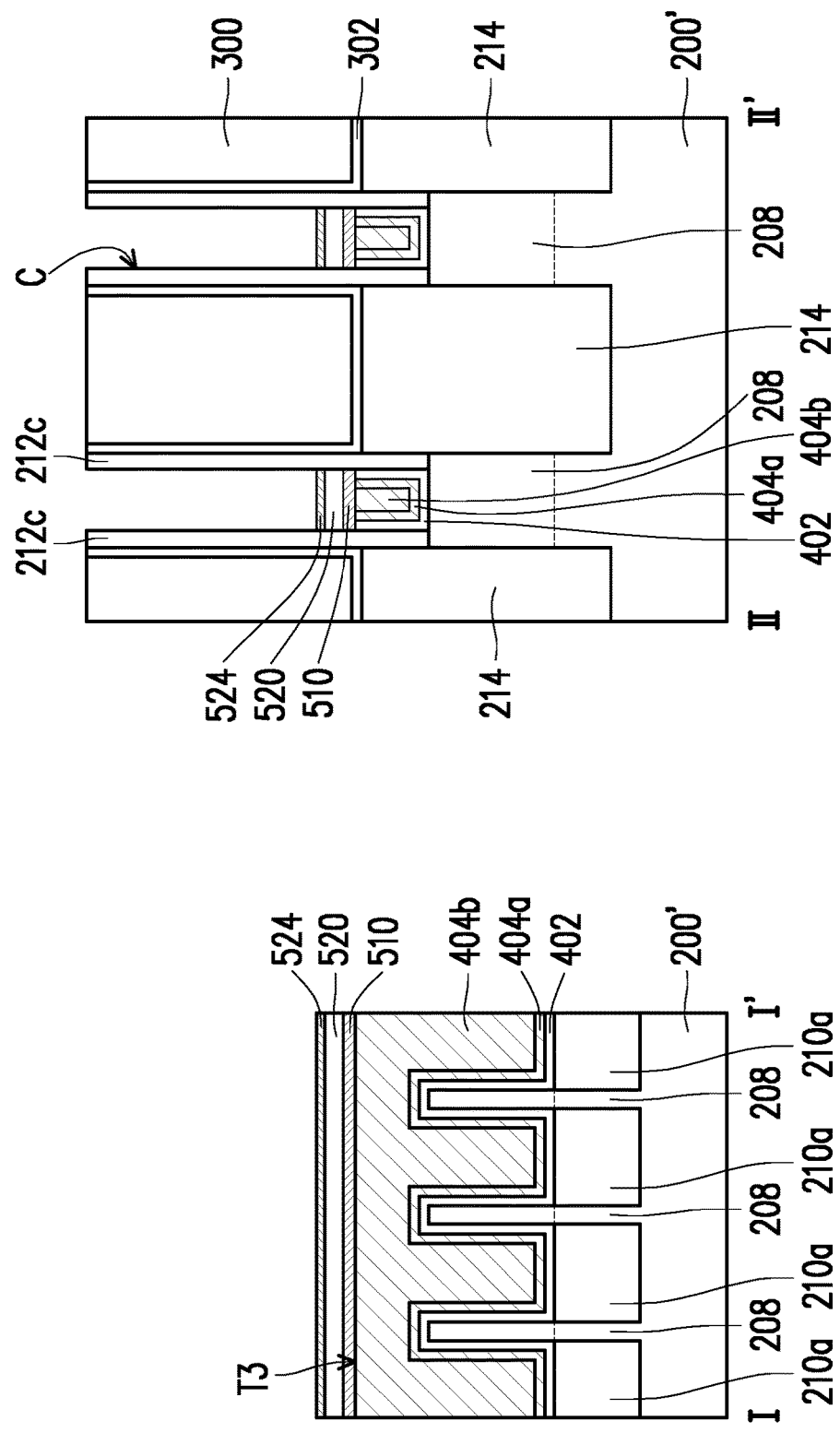
Figure 20:
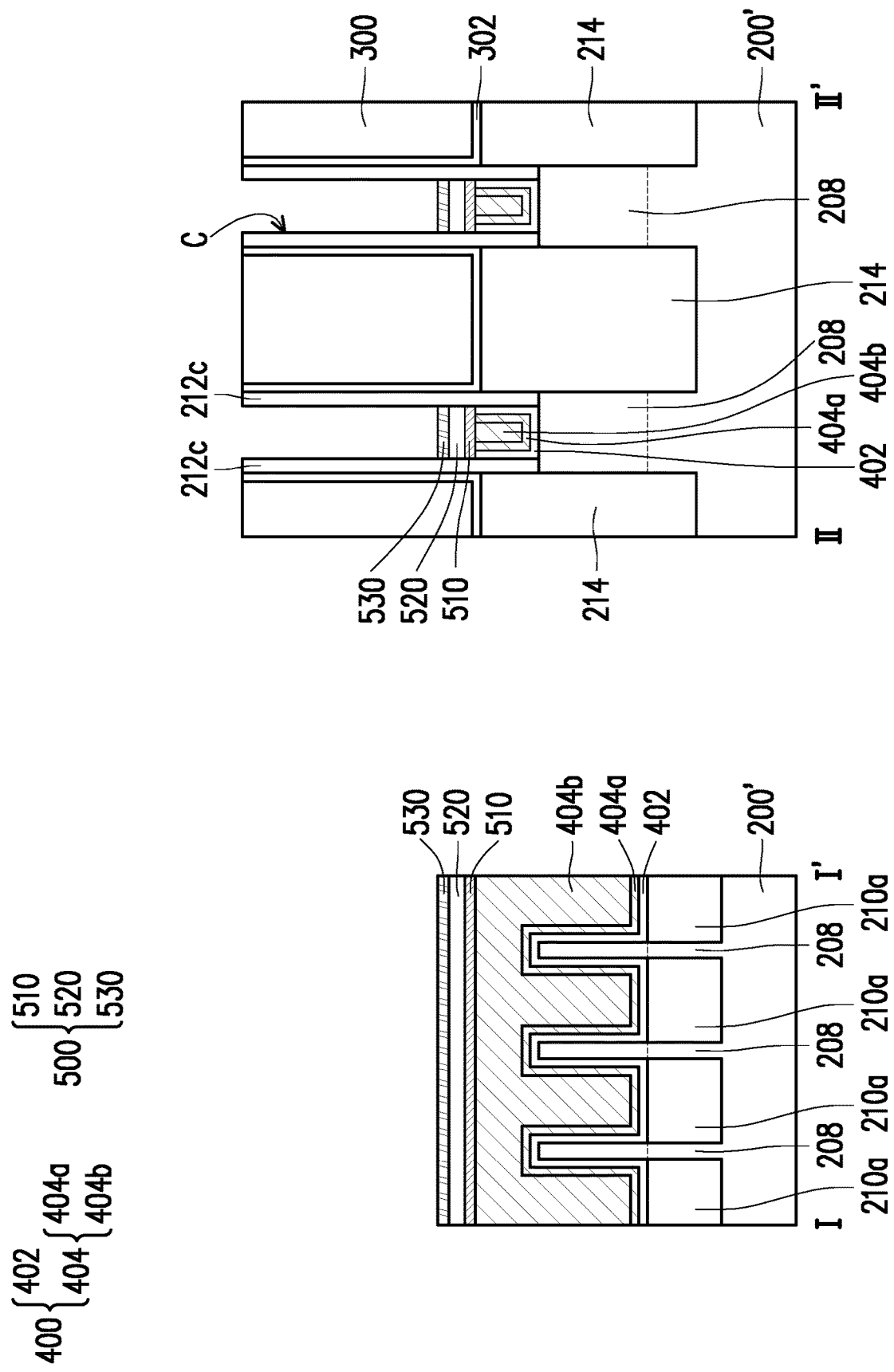

FIG. 1N is a perspective view illustrating one of various stages of a method of manufacturing a semiconductor device 10 in accordance with some embodiments of the disclosure. FIG. 2N is a cross-sectional view of the semiconductor device 10 taken along lines I-I' and II-II' of FIG. 1N. Referring to FIG. 1N and FIG. 2N, the precursor layer 522 and the capping metal layer 524 are annealed simultaneously to transform the precursor layer 522 into a ferroelectric layer 520. In some embodiments, a post annealing process is performed on the precursor layer 522 to change the crystallinity of the HfO₂ compounds in the precursor layer 522 from amorphous phase to high-temperature tetragonal phase. Thereafter, when the precursor layer 522 is being cool down, the capping metal layer 524 disposed on the precursor layer 522 is able to provide mechanical stress to further transform the crystallinity of the HfO₂ compounds in the precursor layer 522 from high-temperature tetragonal phase to high-pressure ferroelectric orthorhombic phase, thereby transforming the precursor layer 522 to the ferroelectric layer 520. In some embodiments, the metal layer 510 is deposited on the gate structures 400 before the ferroelectric layer 520 is formed. In some embodiments, the ferroelectric layer 520 has a thickness of 10 nm to 50 nm. It should be noted that the foregoing steps are merely exemplary illustrations for forming the ferroelectric layer 520, and the disclosure is not limited thereto. Depending on the dopant introduced to the precursor layer 522, the capping metal layer 524 may be omitted in some alternative embodiments. For example, in some alternative embodiments, annealing the precursor layer 522 without providing the capping metal layer 524 is able to transform the precursor layer 522 to the ferroelectric layer 520.

FIG. 1O is a perspective view illustrating one of various stages of a method of manufacturing a semiconductor device 10 in accordance with some embodiments of the disclosure. FIG. 2O is a cross-sectional view of the semiconductor device 10 taken along lines I-I' and II-II' of FIG. 1O. Referring to FIG. 1O and FIG. 2O, a metal layer (not shown) is formed over the ferroelectric layer 520 and the capping metal layer 524. For simplicity, the metal layer and the capping metal layer 524 are collectively illustrated as a metal layer 530 in FIG. 1O and FIG. 2O. The metal layer includes, for example, titanium, tantalum, tungsten, cobalt, or the like. Similar to the metal layer 510, the metal layer may be formed through, for example, ALD, CVD, PVD, a combination thereof, or the like. In some embodiments, the metal layer is selectively formed on the capping metal layer 524. In some embodiments, the metal layer 510, the ferroelectric layer 520, and the metal layer 530 collectively form capacitor structures 500 over the gate structures 400. As illustrated in FIG. 1O and FIG. 2O, the gate structures 400 and the capacitor structures 500 are located between the corresponding pair of spacers 212c. In some embodiments, each capacitor structure 500 forms a capacitor. For example, the metal layer 510 may serve as a bottom electrode of the capacitor, the metal layer 530 may serve as a top electrode of the capacitor, and the ferroelectric layer 520 may serve as a dielectric layer sandwiched between the top electrode and the bottom electrode. In some embodiments, the capacitor structure 500 may be referred to as a "metal-ferroelectric-metal (MFM) capacitor." In some embodiments, with the incorporation of the capacitor structures 500 (the MFM capacitors), the subsequently formed semiconductor device may be referred to as a "Ferroelectric Random Access Memory (FRAM)."

Figure 3:
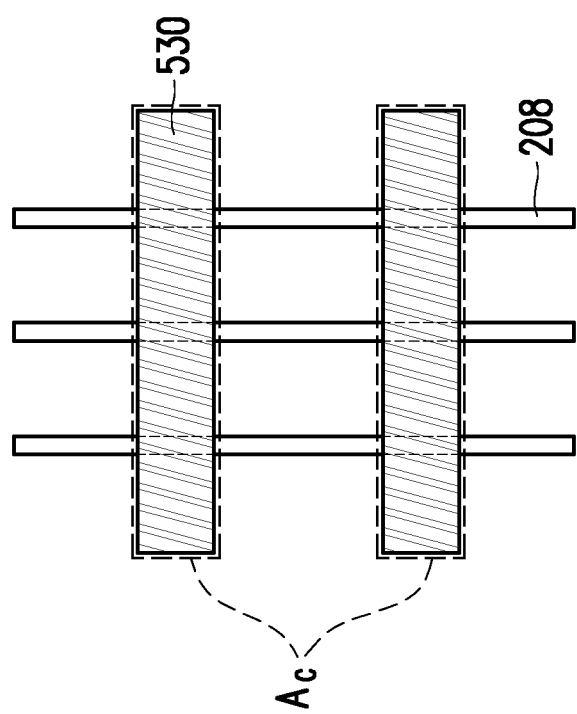
FIG. 3 is a top view of FIG. 1O and FIG. 2O.

In some embodiments, by forming the capacitor structures 500 with the steps provided in FIG. 1L to FIG. 1O and FIG. 2L to FIG. 2O, a ratio of an effective area of capacitance of the capacitor structures 500 to a contact area between the gate structures 400 and the semiconductor fins 208 may range between 0.69 and 1. Throughout the disclosure, the effective area of capacitance refers to the area contributing to the capacitance. For example, the effective area of capacitance may refer to the vertical overlapping area among the top electrode, the dielectric layer, and the bottom electrode. In FIG. 1O and FIG. 2O, the effective area of capacitance of the capacitor structures 500 is the vertical overlapping area among the metal layer 530, the ferroelectric layer 520, and the metal layer 510. For example, the effective area of capacitance of the capacitor structures 500 is labelled as $A_C$ in FIG. 3, which is a top view of FIG. 1O and FIG. 2O. It should be noted that elements other than the semiconductor fins 208 and the metal layer 530 are omitted in FIG. 3 for clarity. Since the ratio is less than 1, the voltage drop across the ferroelectric layer 520 may be maximized and the capacitance of the capacitor structures 500 is less than the capacitance of the transistor (the capacitance generated between the gate structures 400 and the semiconductor fins 208). As a result, the full hysteresis window may be induced (i.e. all ferroelectric dipole may be flipped), the write voltage may be reduced, the charge trapping issue may be eliminated, and the endurance of the subsequently formed semiconductor device may be improved.

Figure 1P:
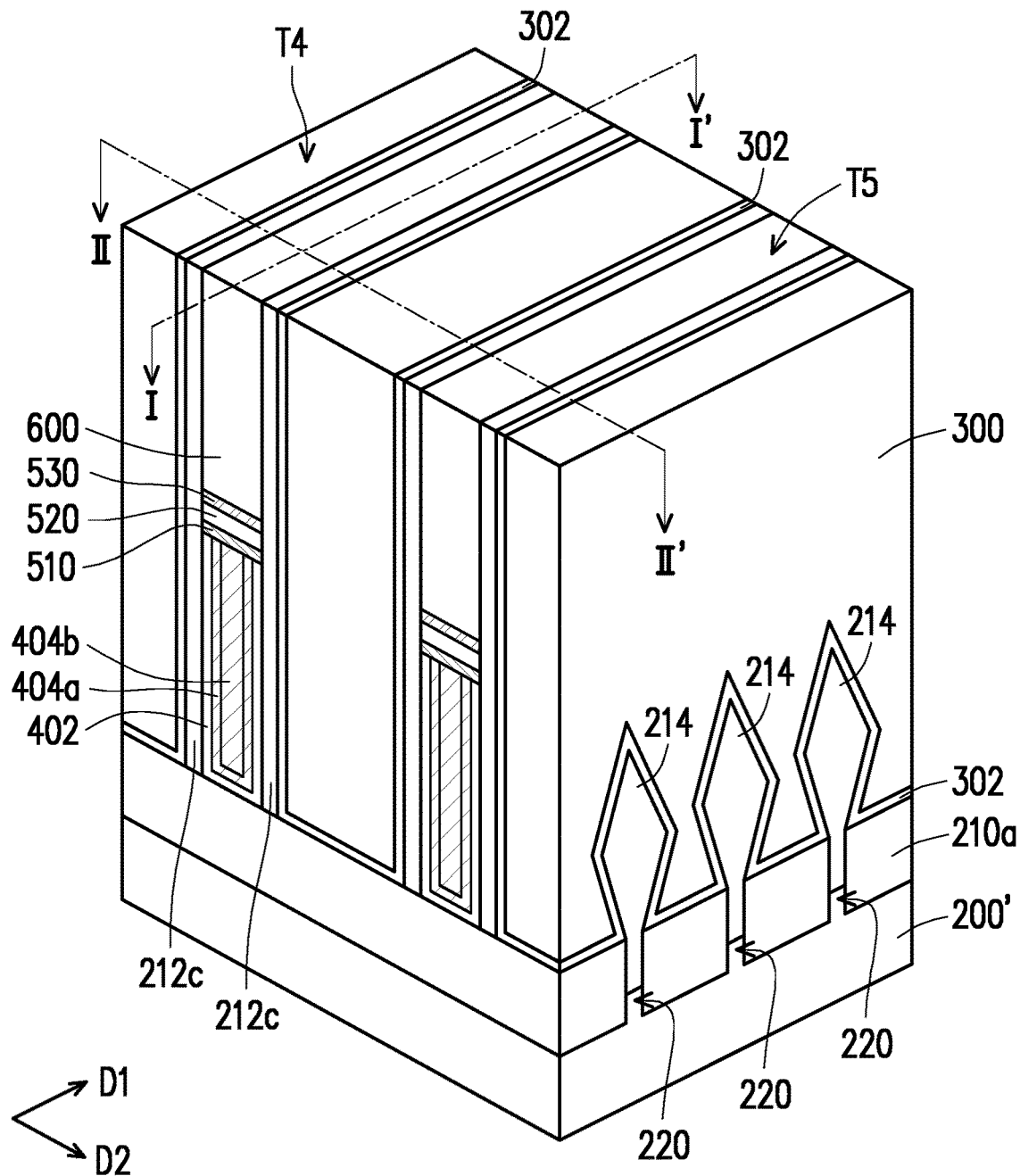

FIG. 1P is a perspective view illustrating one of various stages of a method of manufacturing a semiconductor device 10 in accordance with some embodiments of the disclosure. FIG. 2P is a cross-sectional view of the semiconductor device 10 taken along lines I-I' and II-II' of FIG. 1P. Referring to FIG. 1P and FIG. 2P, a hard mask layer 600 is formed over the capacitor structures 500 to seal the cavities C. In some embodiments, the hard mask layer 600 is sandwiched between the two adjacent spacers 212c. In some embodiments, the formation of the hard mark layer 600 may include filling the cavities C with a dielectric material and performing a planarization process such as a CMP process or a mechanical grinding process to remove excess portions of the dielectric material. After performing the planarization process, a top surface T5 of the hard mask layer 600 is substantially coplanar with the top surface T4 of the inter-layer dielectric layer 300. In some embodiments, the hard mask layer 600 may be formed of silicon nitride, silicon oxynitride, silicon oxy-carbo-nitride, or the like.

Figure 1Q:
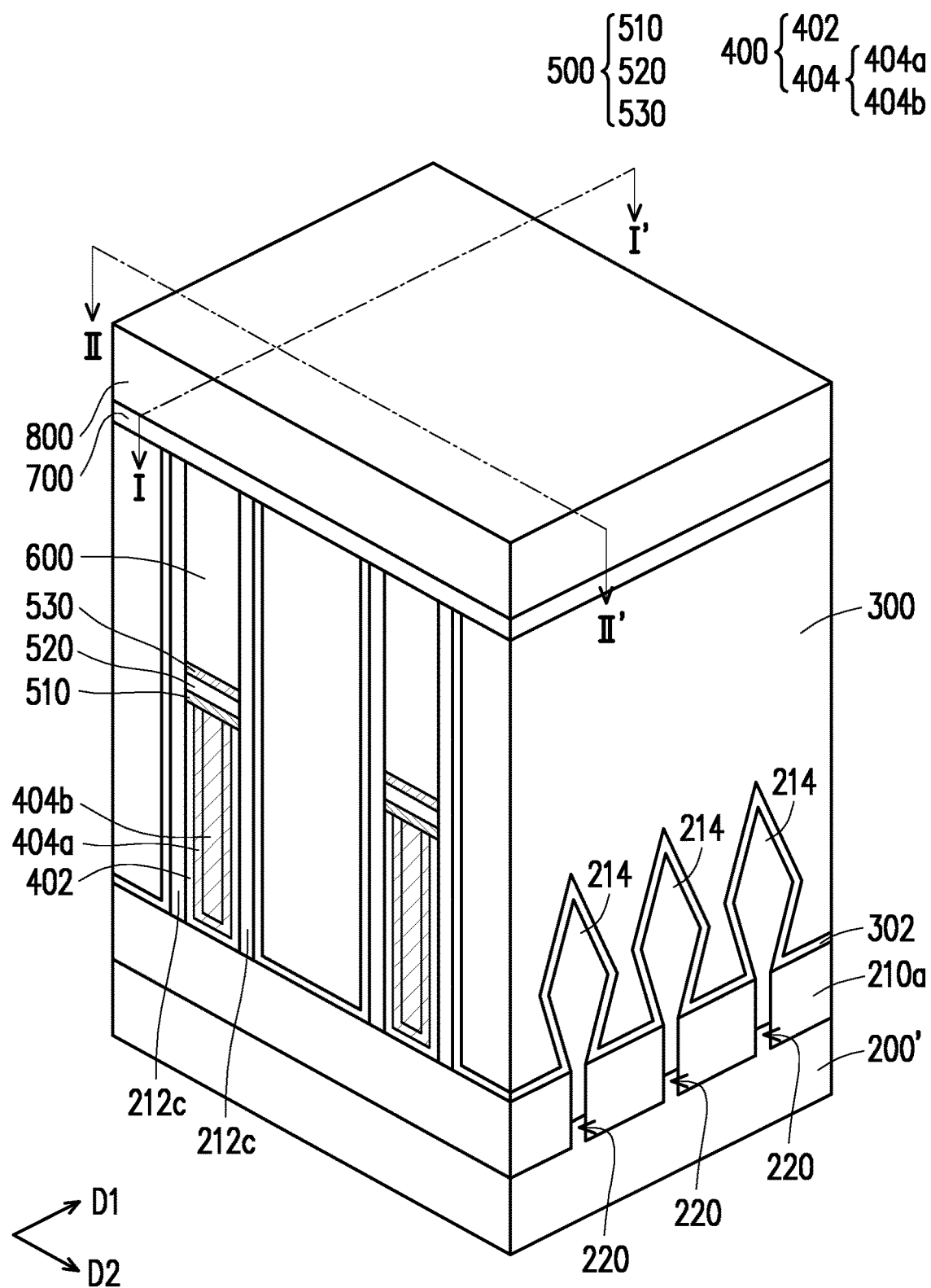
Figure 2Q:
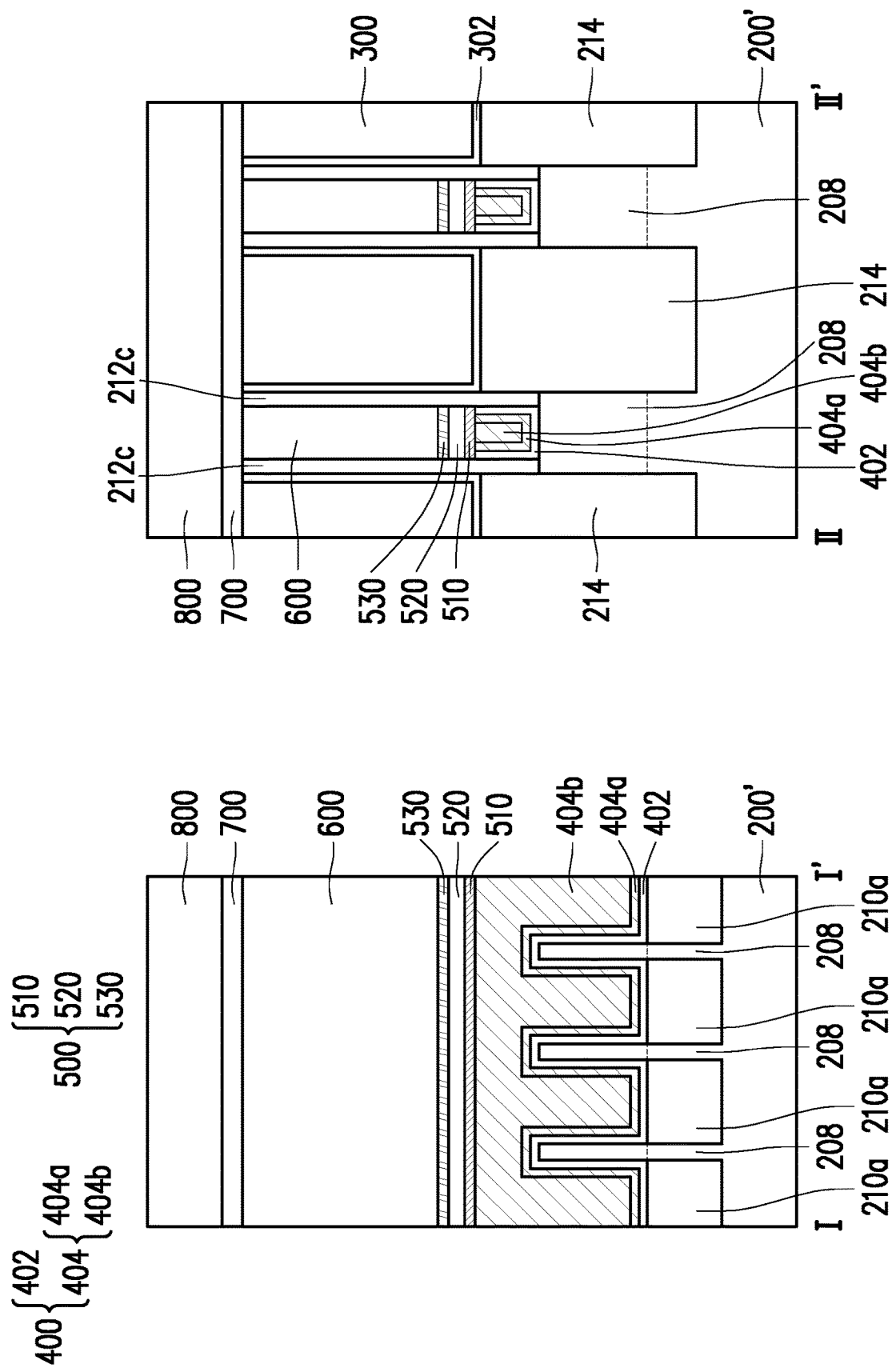

FIG. 1Q is a perspective view illustrating one of various stages of a method of manufacturing a semiconductor device 10 in accordance with some embodiments of the disclosure. FIG. 2Q is a cross-sectional view of the semiconductor device 10 taken along lines I-I' and II-II' of FIG. 1Q. Referring to FIG. 1Q and FIG. 2Q, an etch stop layer 700 and an interlayer dielectric layer 800 are sequentially formed over the interlayer dielectric layer 300, the etch stop layer 302, the spacers 212c, and the hard mask layer 600. In some embodiments, a material of the etch stop layer 700 may be similar to that of the etch stop layer 320. For example, the material of the etch stop layer 700 includes silicon oxide, silicon nitride, silicon carbo-nitride, or a combination thereof. The etch stop layer 700 may be deposited using, for example, CVD, SACVD, MLD, ALD, or the like. In some embodiments, the etch stop layer 700 may be referred to as a "contact etch stop layer (CESL)."

As illustrated in FIG. 1Q and FIG. 2Q, the interlayer dielectric layer 800 is formed over the etch stop layer 700. In some embodiments, a material of the interlayer dielectric layer 800 may be similar to that of the interlayer dielectric layer 300. In some embodiments, the interlayer dielectric layer 800 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the interlayer dielectric layer 800 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 800 may include one or more dielectric materials and/or one or more dielectric layers. In some embodiments, the interlayer dielectric layer 800 is formed to a suitable thickness by FCVD, CVD, HDPCVD, SACVD, spin-on, sputtering, or other suitable methods.

Figure 1R:
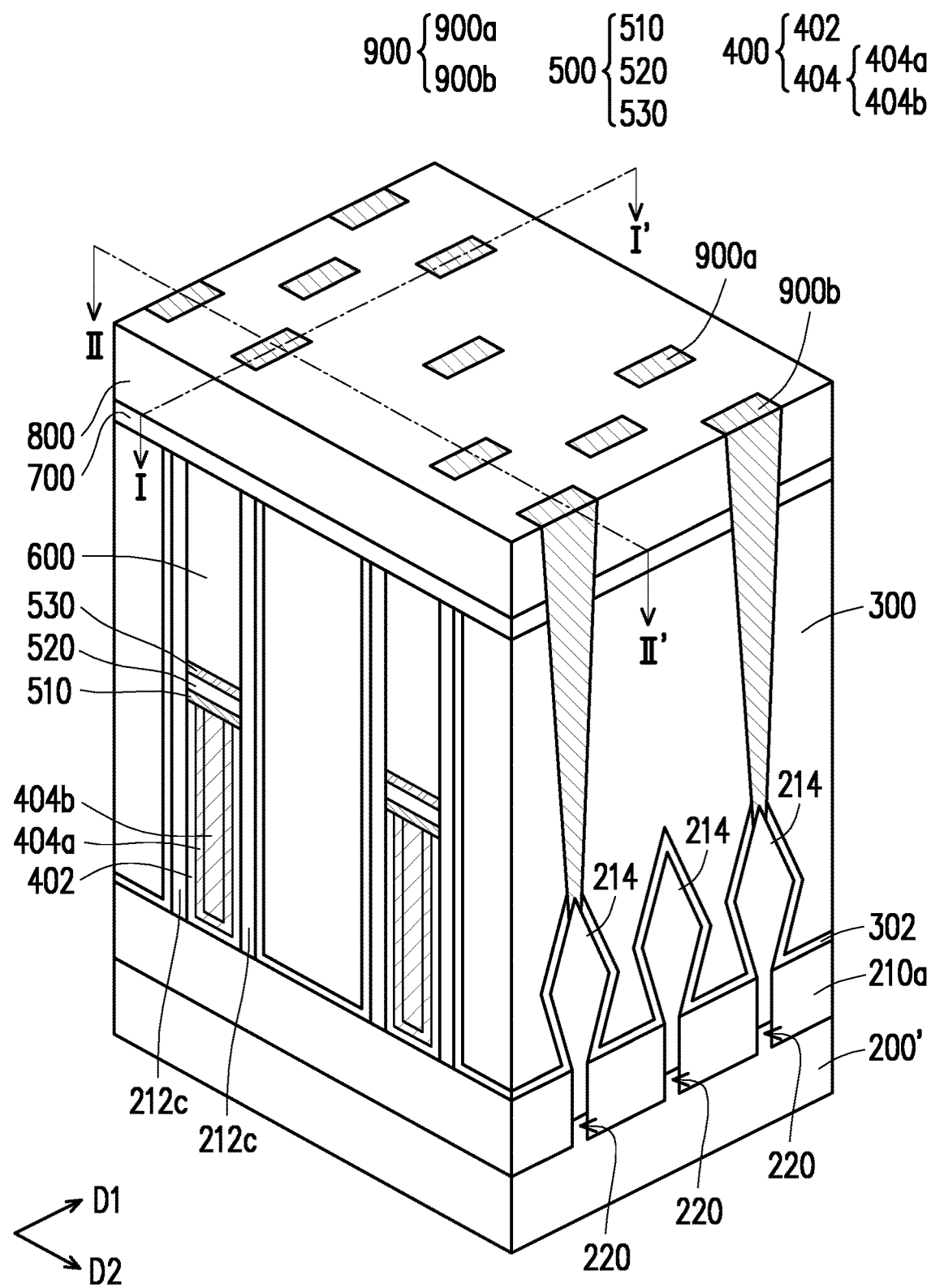
Figure 2R:
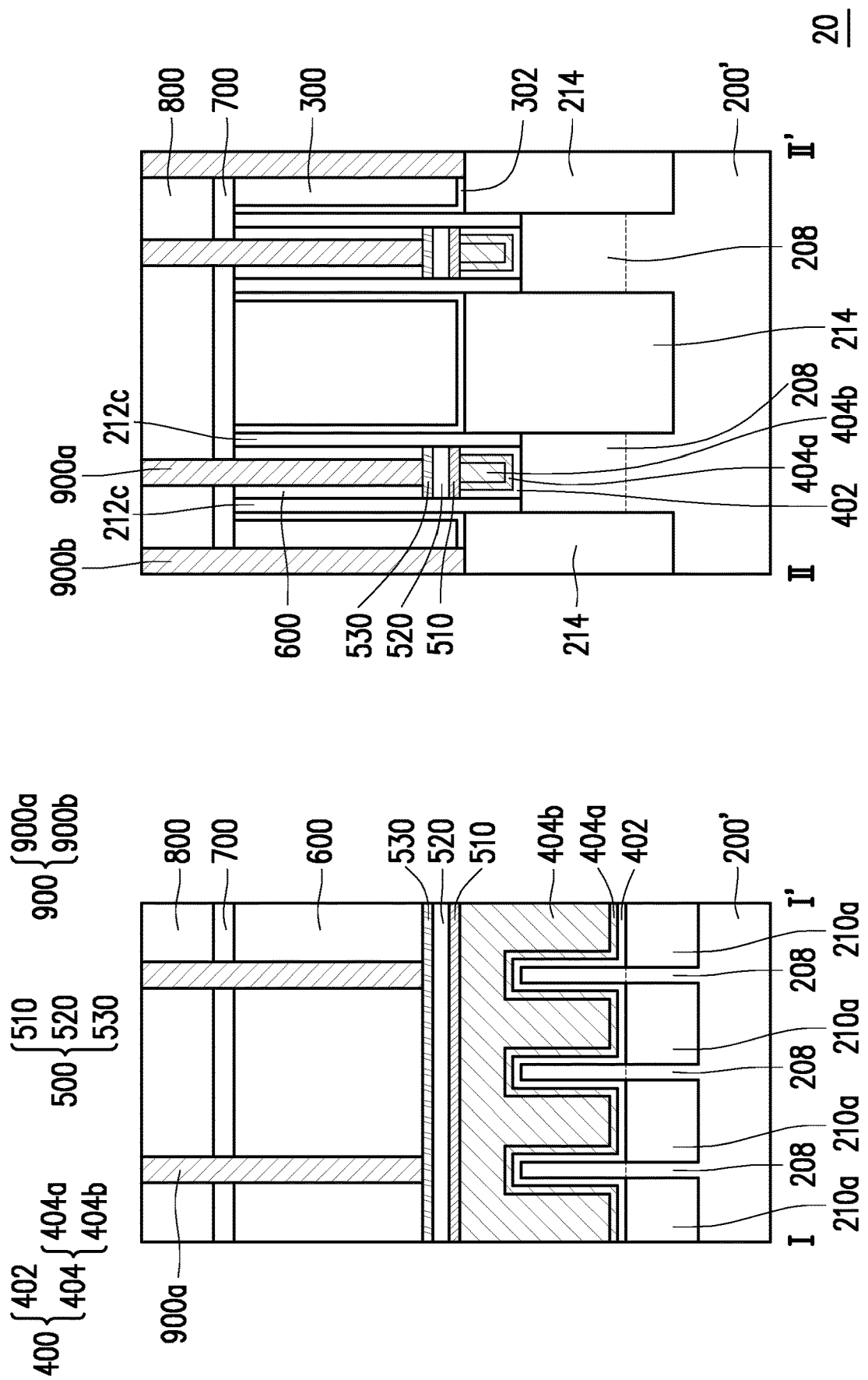

FIG. 1R is a perspective view illustrating one of various stages of a method of manufacturing a semiconductor device 10 in accordance with some embodiments of the disclosure. FIG. 2R is a cross-sectional view of the semiconductor device 10 taken along lines I-I' and II-II' of FIG. 1R. Referring to FIG. 1R and FIG. 2R, a plurality of conductive contacts 900 is formed to obtain the semiconductor device 10. In some embodiments, the conductive contacts 900 may include copper, copper alloys, nickel, aluminum, manganese, magnesium, silver, gold, tungsten, cobalt, a combination thereof, or the like. In some embodiments, the conductive contacts 900 may be formed by, for example, electrochemical plating process, CVD, PECVD, ALD, PVD, a combination thereof, or the like. In some embodiments, the conductive contacts 900 includes a plurality of first conductive contacts 900a and a plurality of second conductive contacts 900b. The first conductive contacts 900a are electrically connected to the capacitor structures 500 and the gate structures 400. On the other hand, the second conductive contacts 900b are electrically connected to the strained material structures 214. In other words, the first conductive contacts 900a may be referred to as "gate contacts" while the second conductive contacts 900b may be referred to as "source/drain contacts."

In some embodiments, the first conductive contacts 900a penetrate through the interlayer dielectric layer 800, the etch stop layer 700, and the hard mask layer 600. That is, the interlayer dielectric layer 800, the etch stop layer 700, and the hard mask layer 600 respectively wraps around different portions of each first conductive contact 900. As illustrated in FIG. 2R, the first conductive contacts 900a are electrically and physically connected to the capacitor structures 500. For example, the first conductive contacts 900a are physically in contact with the metal layer 530 of the capacitor structures 500. The capacitor structures 500 are sandwiched between the first conductive contacts 900a and the gate structures 400. The capacitor structures 500 are also sandwiched between the hard mask layer 600 and the gate structures 400. In some embodiments, the first conductive contacts 900a are formed by the following steps. First, a plurality of contact openings (not shown) is formed in the interlayer dielectric layer 800, the etch stop layer 700, and the hard mask layer 600. In some embodiments, the contact openings may be formed by performing an etching process on the interlayer dielectric layer 800, the etch stop layer 700, and the hard mask layer 600. In some embodiments, the locations of the contact openings correspond to the locations of the capacitor structures 500. For example, the contact openings expose at least a portion of the metal layer 530 of each capacitor structure 500. Thereafter, a conductive material such as copper, copper alloys, nickel, aluminum, manganese, magnesium, silver, gold, tungsten, cobalt, a combination thereof, or the like is filled into the contact openings. Subsequently, a planarization process is performed to remove excess materials outside of the contact openings to form the conductive contacts 900a.

In some embodiments, the second conductive contacts 900b penetrate through the interlayer dielectric layer 800, the etch stop layer 700, the interlayer dielectric layer 300, and the etch stop layer 302. As illustrated in FIG. 1R and FIG. 2R, the second conductive contacts 900b are electrically and physically connected to the strained material structures 214. In some embodiments, the second conductive contacts 900b are formed by the following steps. First, a plurality of contact openings (not shown) is formed in the interlayer dielectric layer 800, the etch stop layer 700, the interlayer dielectric layer 300, and the etch stop layer 302. In some embodiments, the contact openings may be formed by performing an etching process on the interlayer dielectric layer 800, the etch stop layer 700, the interlayer dielectric layer 300, and the etch stop layer 302. In some embodiments, the locations of the contact openings correspond to the locations of the strained material structures 214. For example, the contact openings expose at least a portion of each strained material structures 214. Thereafter, a metal layer (such as a Ti layer; not shown) may be formed in the contact openings. In some embodiments, the metal layer is formed to be in direct contact with the exposed portion of the strained material structures 214. An anneal process is then performed to react the metal layer with the exposed portion of the strained material structures 214 to form a silicide layer (not shown) between the metal layer and the strained material structures 214. After the silicide layer is formed, the metal layer may be removed to expose the silicide layer. It should be noted that the removal step of the metal layer herein is optional. Thereafter, a conductive material such as copper, copper alloys, nickel, aluminum, manganese, magnesium, silver, gold, tungsten, cobalt, a combination thereof, or the like is filled into the contact openings. Subsequently, a planarization process is performed to remove excess materials outside of the contact openings to form the conductive contacts 900b.

It should be noted that the locations of the conductive contacts 900 shown in FIG. 1R and FIG. 2R are merely exemplary illustration, and the disclosure is not limited thereto. In some alternative embodiments, the conductive contacts 900 may be vertically aligned with the semiconductor fins 208 or may be disposed at different locations on the capacitor structures 500 and the strained material structures 214. Furthermore, the first conductive contacts 900a may be formed prior to, simultaneously with, or after forming the second conductive contacts 900b. In some embodiments, a plurality of routing patterns (not shown) may be formed over the conductive contacts 900 to render electrical connection between the semiconductor device 10 and other electronic devices. In some embodiments, the semiconductor device 10 may be referred to as a "Fin Field-effect transistor (FinFET)."

Figure 4:
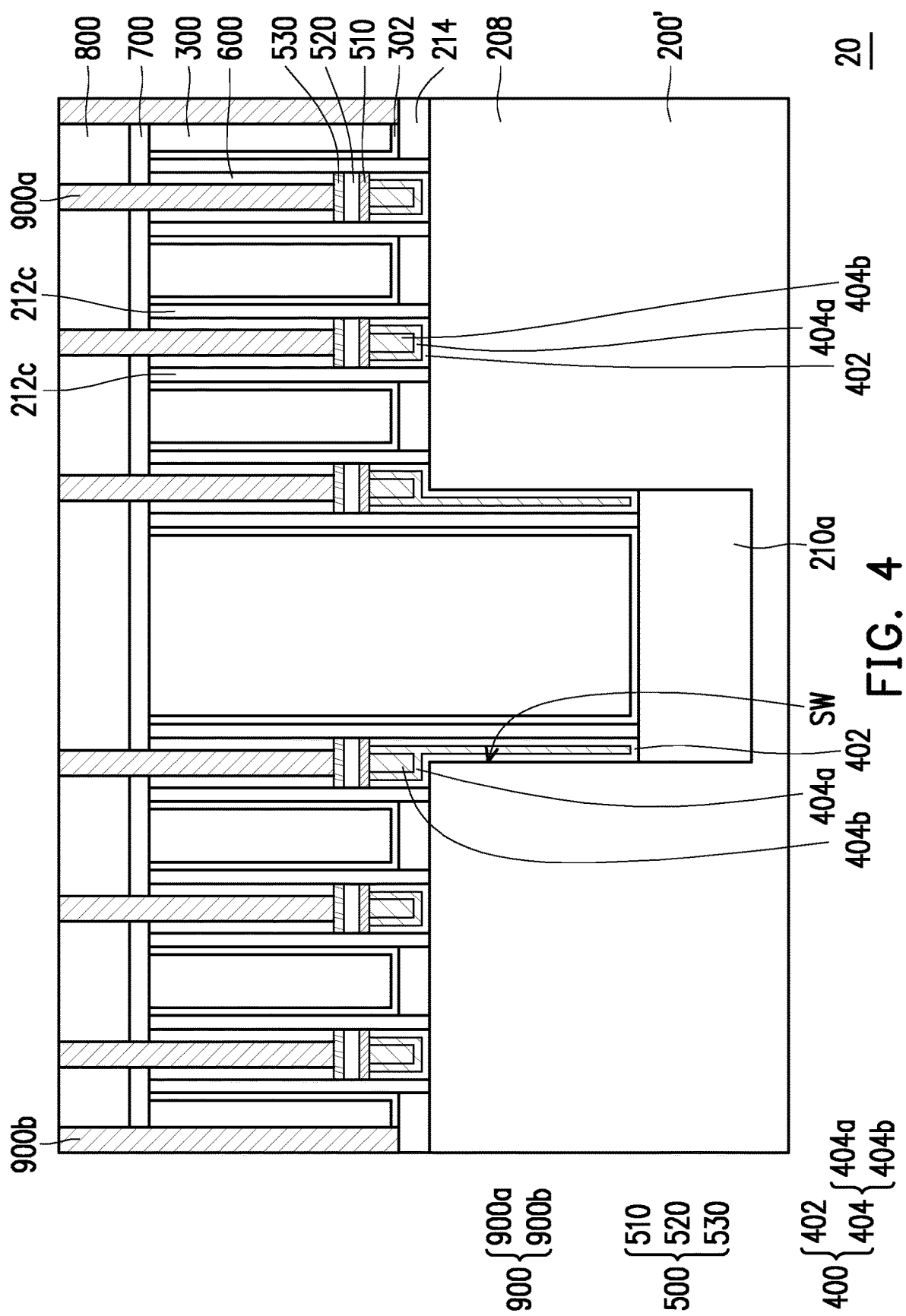
FIG. 4 is a cross-sectional view of a semiconductor device in accordance with some alternative embodiments of the disclosure.

FIG. 4 is a cross-sectional view of a semiconductor device 20 in accordance with some alternative embodiments of the disclosure. It should be noted that the cross-sectional view presented in FIG. 4 is taken along a line having an extending direction parallel to the line II-II' shown in FIG. 1R. The semiconductor device 20 in FIG. 4 is similar to the semiconductor device 10 in FIG. 1R, so similar elements are denoted by the same reference numeral and the detailed descriptions thereof are omitted herein. However, the number of the insulator 210a in the semiconductor device 20 is less than the number of the insulator 210a in the semiconductor device 10. For example, as illustrated in FIG. 4, there is no insulator between some of the two adjacent gate structures 400. That is, multiple gate structures 400 are disposed on the top surface of the same semiconductor fin 208. In addition, the number of the gate structures 400 in the semiconductor device 20 is more than the number of the gate structures 400 in the semiconductor device 10. In some embodiments, the three gate structures 400 on the left hand side of FIG. 4 may be devices of the first type (for example, p-type devices) while the remaining three gate structures 400 on the right hand side may be devices of the second type (for example, n-type devices). In some embodiments, the p-type devices and the n-type devices are separated by the insulator 210a. As illustrated in FIG. 4, a sidewall SW of the semiconductor fin 208 that is perpendicular to the extending direction of the semiconductor fin 208 is covered by at least a portion of some of the gate structures 400 and the insulator 210a. For example, the sidewall SW of the semiconductor fin 208 is covered by the gate dielectric layer 402 and the insulator 210a. In some embodiments, the gate structures 400 also covers sidewalls (not shown) of the semiconductor fin 208 that is parallel to the extending direction of the semiconductor fin 208. In other words, some of the gate structures 400 in the semiconductor device 20 cover top surface and three sidewalls of the semiconductor fins 208. In the semiconductor device 20, a ratio of an effective area of capacitance of the capacitor structures 500 to a contact area between the gate structures 400 and the semiconductor fins 208 ranges between 0.69 and 1.

Figure 5A:
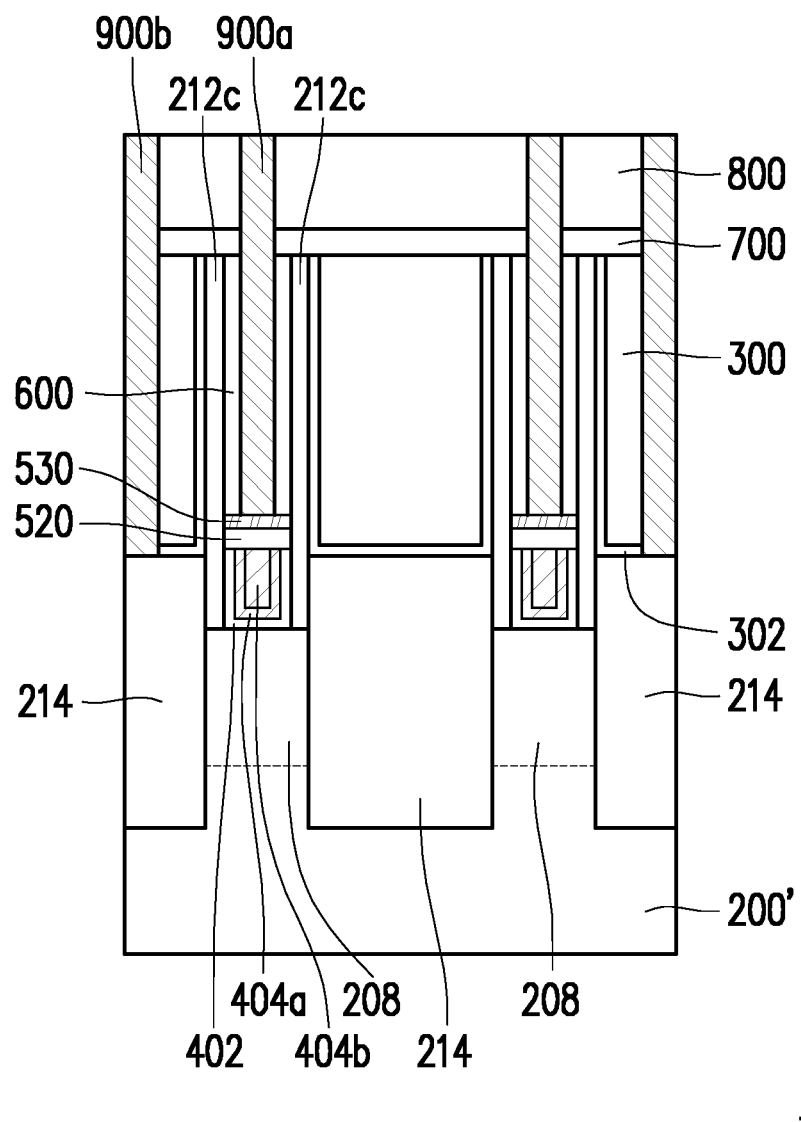
FIG. 5A and FIG. 5B are cross-sectional views of semiconductor devices in accordance with some alternative embodiments of the disclosure.

FIG. 5A is a cross-sectional view of a semiconductor device 30 in accordance with some alternative embodiments of the disclosure. It should be noted that the cross-sectional view presented in FIG. 5A is taken along a line having an extending direction parallel to the line II-II' shown in FIG. 1R. The semiconductor device 30 in FIG. 5A is similar to the semiconductor device 10 in FIG. 1R, so similar elements are denoted by the same reference numeral and the detailed descriptions thereof are omitted herein. However, the metal layer 510 shown in FIG. 1R is omitted in the semiconductor device 30 of FIG. 5A. That is, in the semiconductor device 30 of FIG. 5A, the capacitor structures 500 are formed by the ferroelectric layer 520 and the metal layer 530. As illustrated in FIG. 5A, the ferroelectric layer 520 is directly in contact with the gate structures 400. In some embodiment, each gate 404 of the gate structures 400 and each capacitor structure 500 may collectively form a capacitor. For example, the gate 404 may serve as a bottom electrode of the capacitor, the metal layer 530 may serve as a top electrode of the capacitor, and the ferroelectric layer 520 may serve as a dielectric layer sandwiched between the top electrode and the bottom electrode. In the semiconductor device 30, a ratio of an effective area of capacitance of the capacitor to a contact area between the gate structures 400 and the semiconductor fins 208 ranges between 0.69 and 1.

Figure 5B:
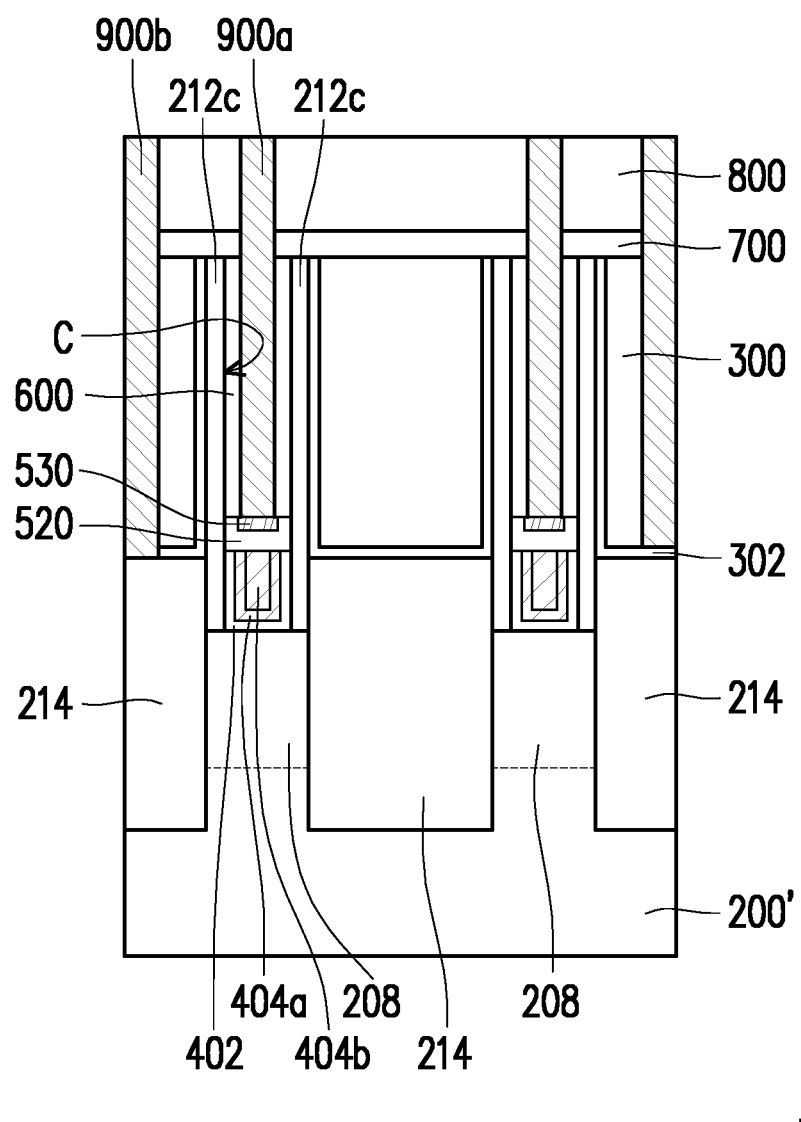

FIG. 5B is a cross-sectional view of a semiconductor device 40 in accordance with some alternative embodiments of the disclosure. It should be noted that the cross-sectional view presented in FIG. 5B is taken along a line having an extending direction parallel to the line II-II' shown in FIG. 1R. The semiconductor device 40 in FIG. 5B is similar to the semiconductor device 30 in FIG. 5A, so similar elements are denoted by the same reference numeral and the detailed descriptions thereof are omitted herein. However, in the semiconductor device 40 of FIG. 5B, the ferroelectric layer 520 surrounds sidewalls of the metal layer 530. In other words, in the manufacturing process of the semiconductor device 40, during the steps similar to the steps shown in FIG. 1M to FIG. 1N and FIG. 2M to FIG. 2N, the process recipe is adjusted such that the ferroelectric layer 520 is formed to cover a portion of the sidewalls of the cavities C. As illustrated in FIG. 5B, the ferroelectric layer 520 has a U-shaped cross-sectional view. In some embodiments, the metal layer 530 is separated from the spacers 212c by the ferroelectric layer 520. In the semiconductor device 40, a ratio of an effective area of capacitance of the capacitor to a contact area between the gate structures 400 and the semiconductor fins 208 ranges between 0.69 and 1.

Figure 6A:
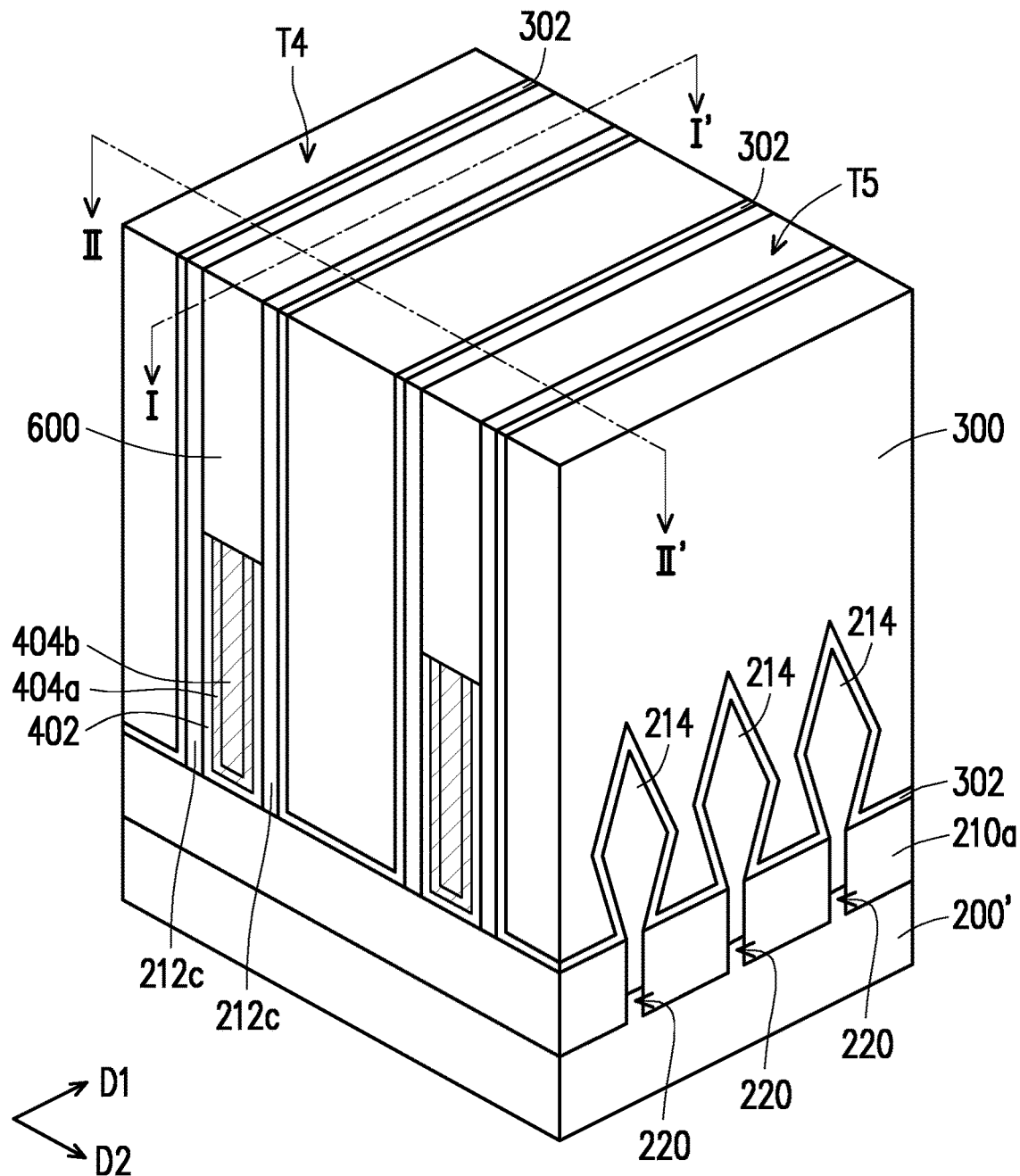
FIG. 6A to FIG. 6E are perspective views illustrating various stages of a method of manufacturing a semiconductor device in accordance with some alternative embodiments of the disclosure.

FIG. 6A is a perspective view illustrating one of various stages of a method of manufacturing a semiconductor device 50 in accordance with some embodiments of the disclosure. FIG. 7A is a cross-sectional view of the semiconductor device 50 taken along lines I-I' and II-II' of FIG. 6A. Referring to FIG. 6A and FIG. 7A, the structure shown in these figures may be obtained by performing the steps shown in FIG. 1A to FIG. 1L. Moreover, as illustrated in FIG. 6A and FIG. 7A, a hard mask layer 600 is formed over the gate structures 400. For example, the hard mask layer 600 is formed on the top surfaces T3 of the gate structures 400. In some embodiments, the hard mask layer 600 is sandwiched between the two adjacent spacers 212c. As illustrated in FIG. 1L, a top surface T5 of the hard mask layer 600 is substantially coplanar with the top surface T4 of the interlayer dielectric layer 300. The materials and the formation methods of the hard mask layer 600 in FIG. 6A and FIG. 7A may be similar to that of the hard mask layer 600 in FIG. 1P and FIG. 2P, so the detailed descriptions thereof are omitted herein.

Figure 6B:
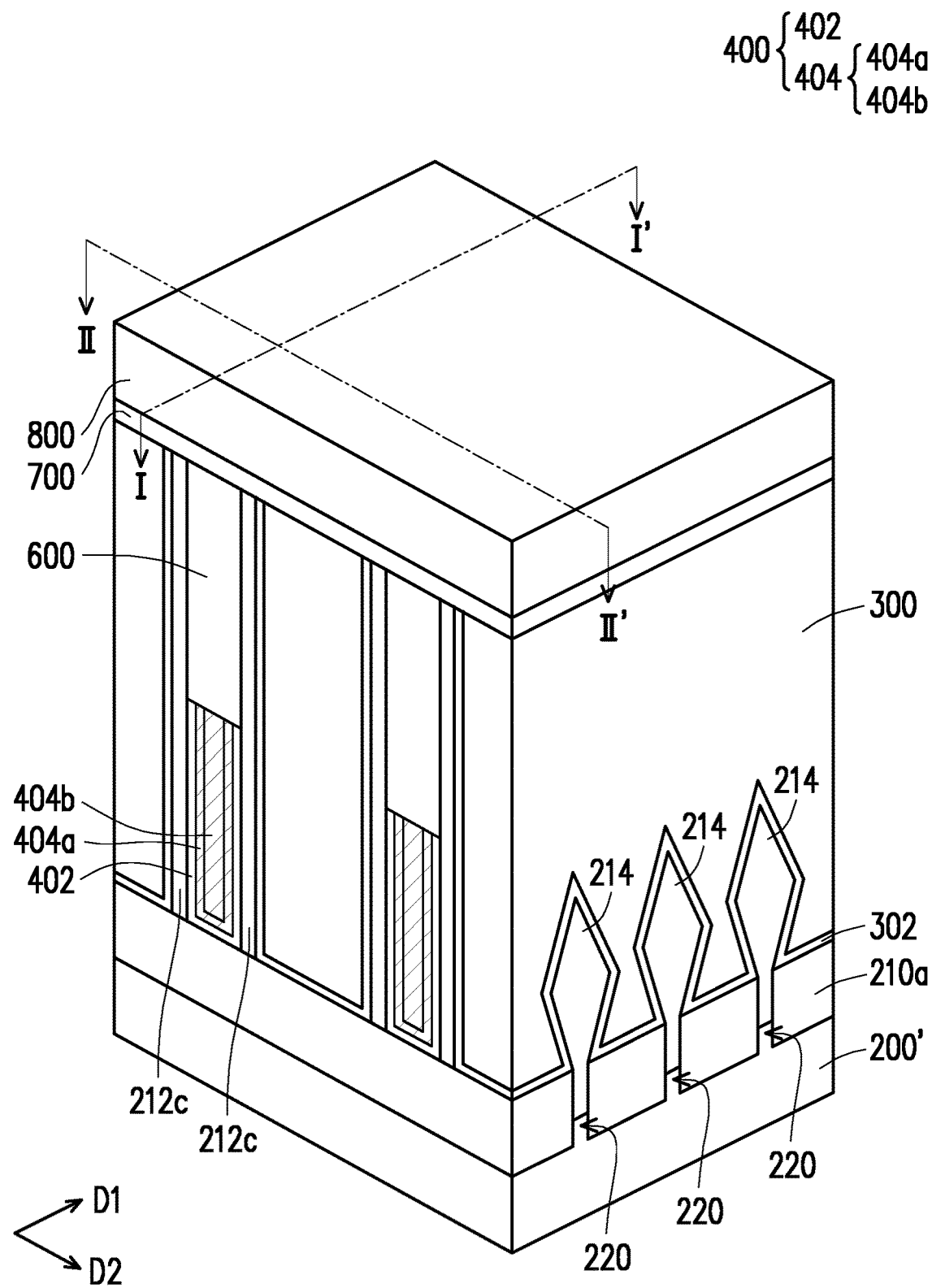
Figure 7B:
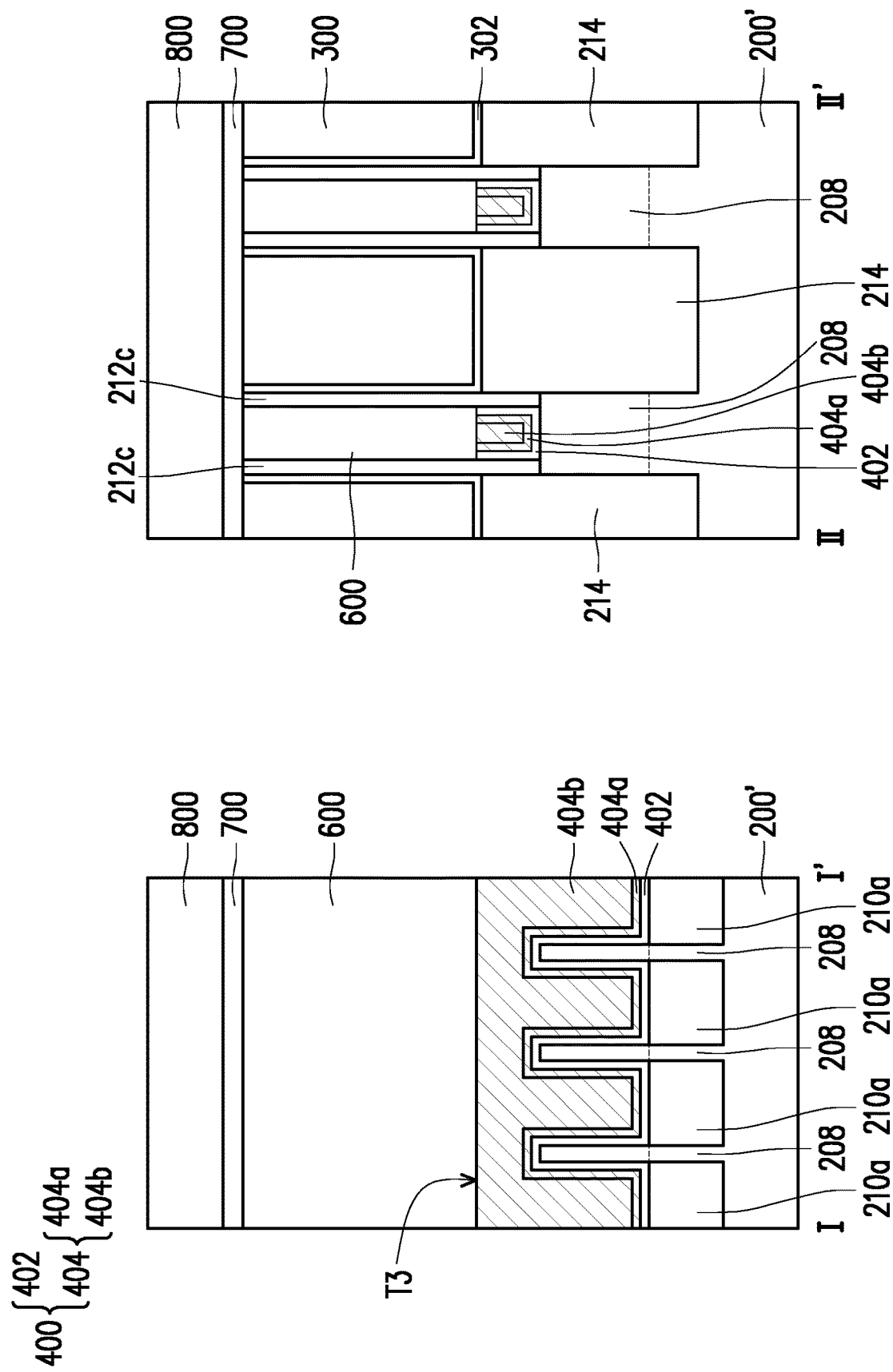

FIG. 6B is a perspective view illustrating one of various stages of a method of manufacturing a semiconductor device 50 in accordance with some embodiments of the disclosure. FIG. 7B is a cross-sectional view of the semiconductor device 50 taken along lines I-I' and II-II' of FIG. 6B. Referring to FIG. 6B and FIG. 7B, an etch stop layer 700 and an interlayer dielectric layer 800 are sequentially formed over the interlayer dielectric layer 300, the etch stop layer 302, the spacers 212c, and the hard mask layer 600. The materials and the formation methods of the etch stop layer 700 and the interlayer dielectric layer 800 in FIG. 6B and FIG. 7B may be similar to that of the etch stop layer 700 and the interlayer dielectric layer 800 in FIG. 1Q and FIG. 2Q, so the detailed descriptions thereof are omitted herein.

Figure 6C:
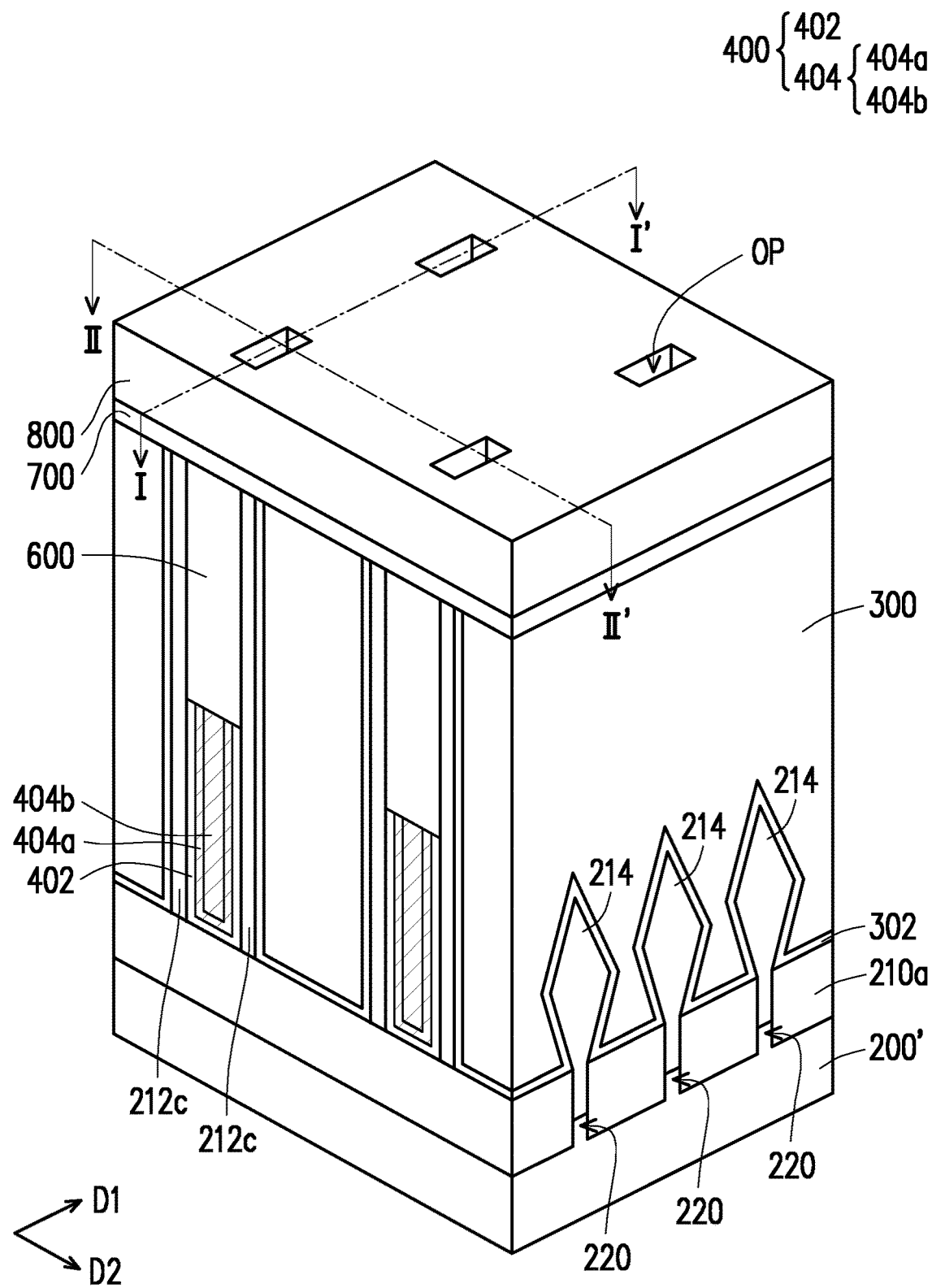
Figure 7C:
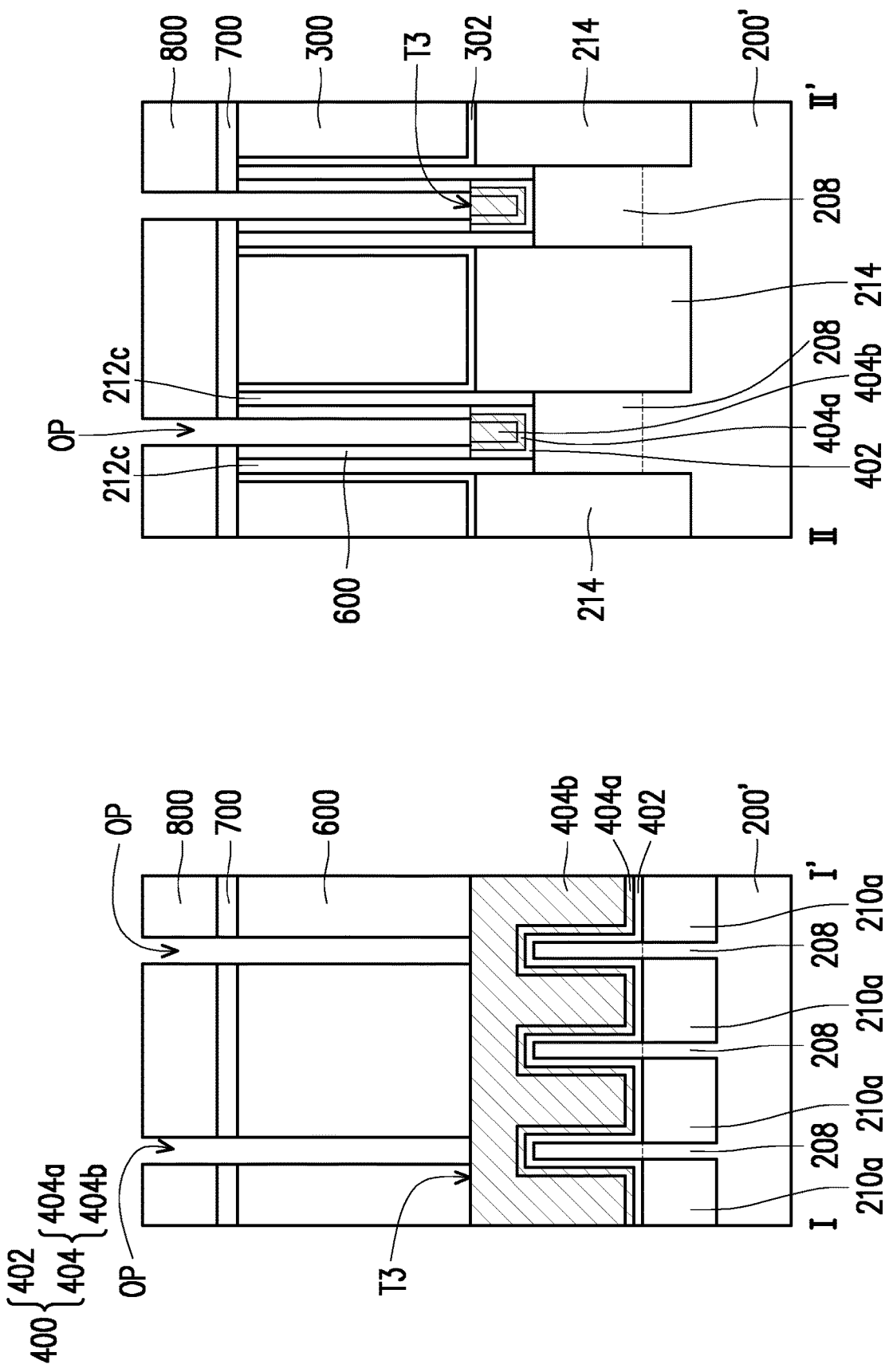

FIG. 6C is a perspective view illustrating one of various stages of a method of manufacturing a semiconductor device 50 in accordance with some embodiments of the disclosure. FIG. 7C is a cross-sectional view of the semiconductor device 50 taken along lines I-I' and II-II' of FIG. 6C. Referring to FIG. 6C and FIG. 7C, a portion of the interlayer dielectric layer 800, a portion of the etch stop layer 700, and a portion of the hard mask layer 600 are removed to form a plurality of openings OP. In some embodiments, the openings OP may be formed by performing an etching process on the interlayer dielectric layer 800, the etch stop layer 700, and the hard mask layer 600. In some embodiments, the locations of the openings OP correspond to the locations of the gate structures 400. For example, the openings OP expose at least a portion of the top surface T3 of each gate structure 400.

Figure 6D:
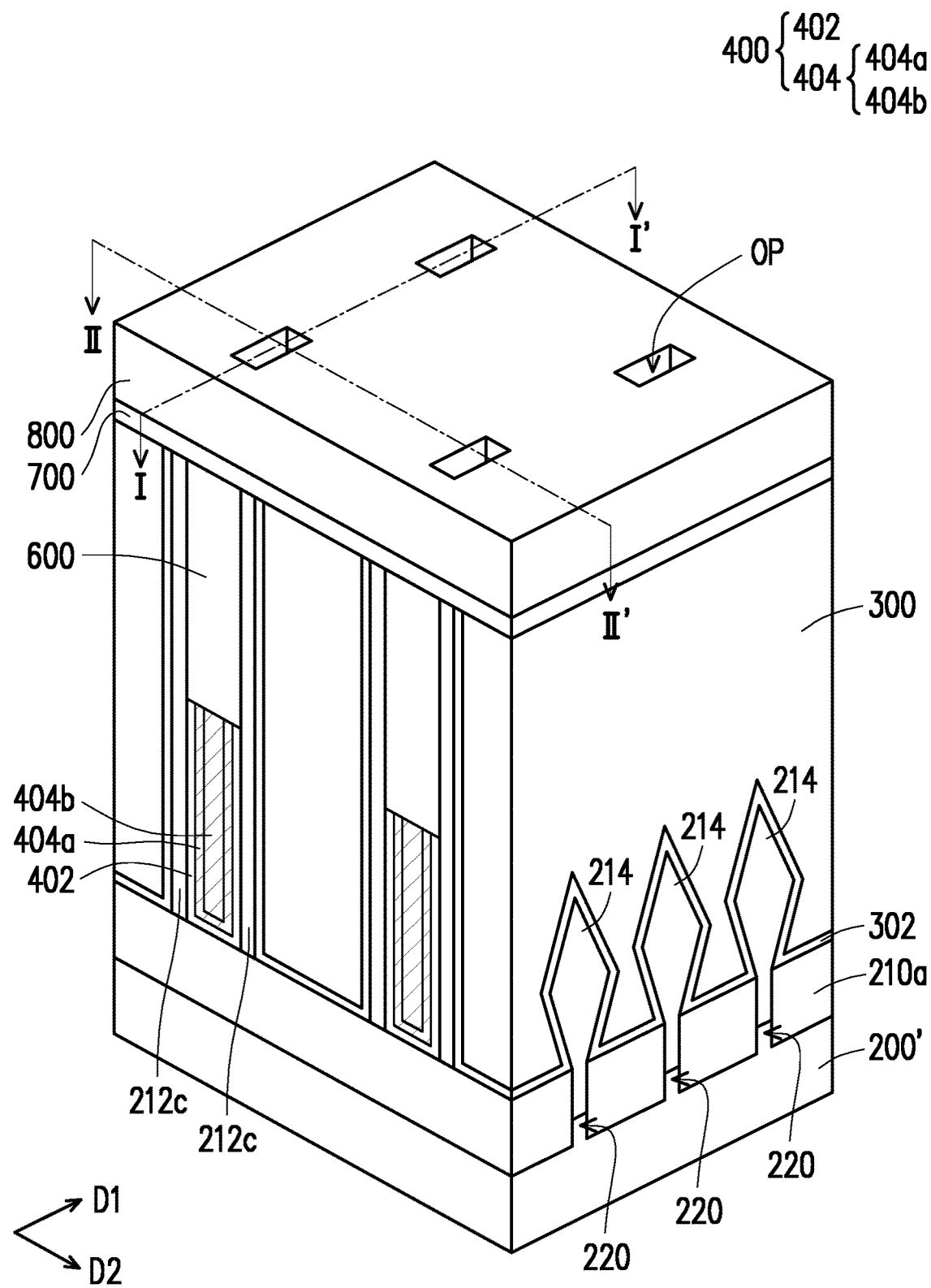
Figure 7D:
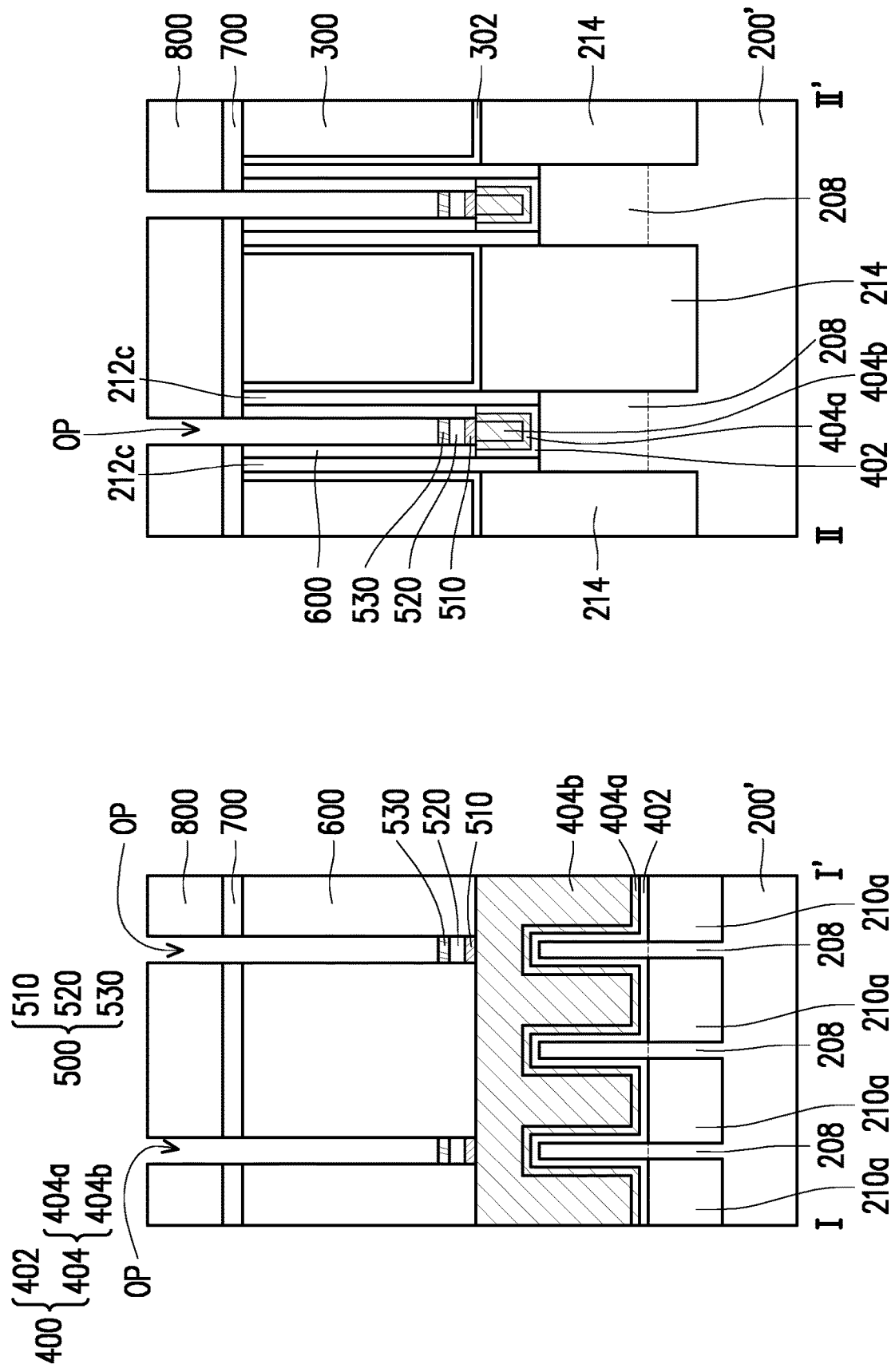

FIG. 6D is a perspective view illustrating one of various stages of a method of manufacturing a semiconductor device 50 in accordance with some embodiments of the disclosure. FIG. 7D is a cross-sectional view of the semiconductor device 50 taken along lines I-I' and II-II' of FIG. 6D. Referring to FIG. 6D and FIG. 7D, capacitor structures 500 are formed in the openings OP. In some embodiments, the capacitor structures 500 are formed on the gate structures 400. As illustrated in FIG. 7D, the hard mask layer 600 surrounds the capacitor structures 500. The materials and the formation methods of the capacitor structures 500 in FIG. 6D and FIG. 7D may be similar to that of the capacitor structures 500 in FIG. 1M to FIG. 1O and FIG. 2M and FIG. 2O, so the detailed descriptions thereof are omitted herein. Each capacitor structure 500 includes a metal layer 510, a ferroelectric layer 520, and a metal layer 530. As illustrated in FIG. 6D and FIG. 7D, the metal layer 510, the ferroelectric layer 520, and the metal layer 530 are deposited in the openings OP and are sequentially stacked over the gate structures 400. The ferroelectric layer 520 is sandwiched between the metal layer 510 and the metal layer 530.

Figure 8:
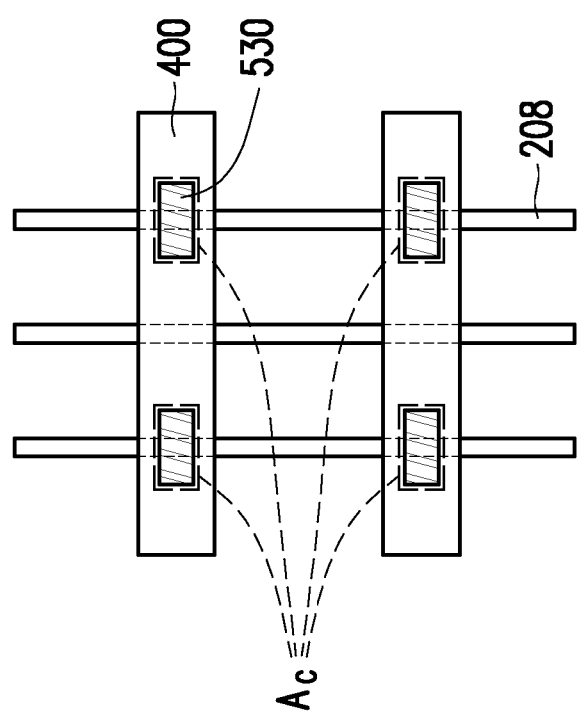
FIG. 8 is a top view of FIG. 6D and FIG. 7D.

In FIG. 6D and FIG. 7D, the effective area of capacitance of the capacitor structures 500 is the vertical overlapping area among the metal layer 530, the ferroelectric layer 520, and the metal layer 510. For example, the effective area of capacitance of the capacitor structures 500 is labelled as $A_C$ in FIG. 8, which is a top view of FIG. 6D and FIG. 7D. It should be noted that elements other than the semiconductor fins 208, the gate structures 400, and the metal layer 530 are omitted in FIG. 8 for clarity. In some embodiments, by forming the capacitor structures 500 with the steps provided in FIG. 6C to FIG. 6D and FIG. 7C to FIG. 7D, a ratio of an effective area of capacitance of the capacitor structures 500 to a contact area between the gate structures 400 and the semiconductor fins 208 may range between 0.22 and 1. Since the ratio is less than 1, the voltage drop across the ferroelectric layer 520 may be maximized and the capacitance of the capacitor structures 500 is less than the capacitance of the transistor. As a result, the full hysteresis window may be induced (i.e. all ferroelectric dipole may be flipped), the write voltage may be reduced, the charge trapping issue may be eliminated, and the endurance of the subsequently formed semiconductor device may be improved.

Figure 6E:
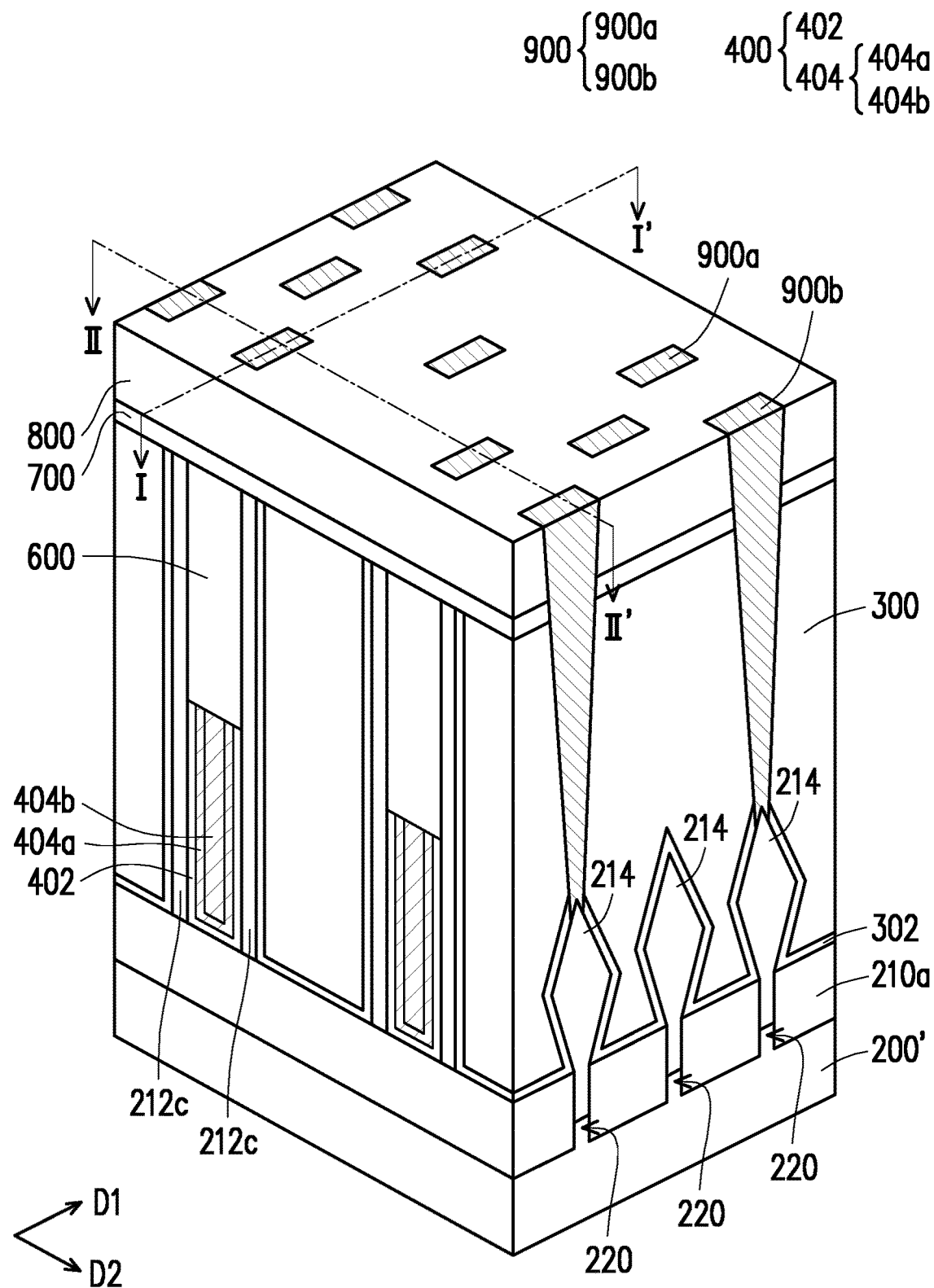
Figure 7E:
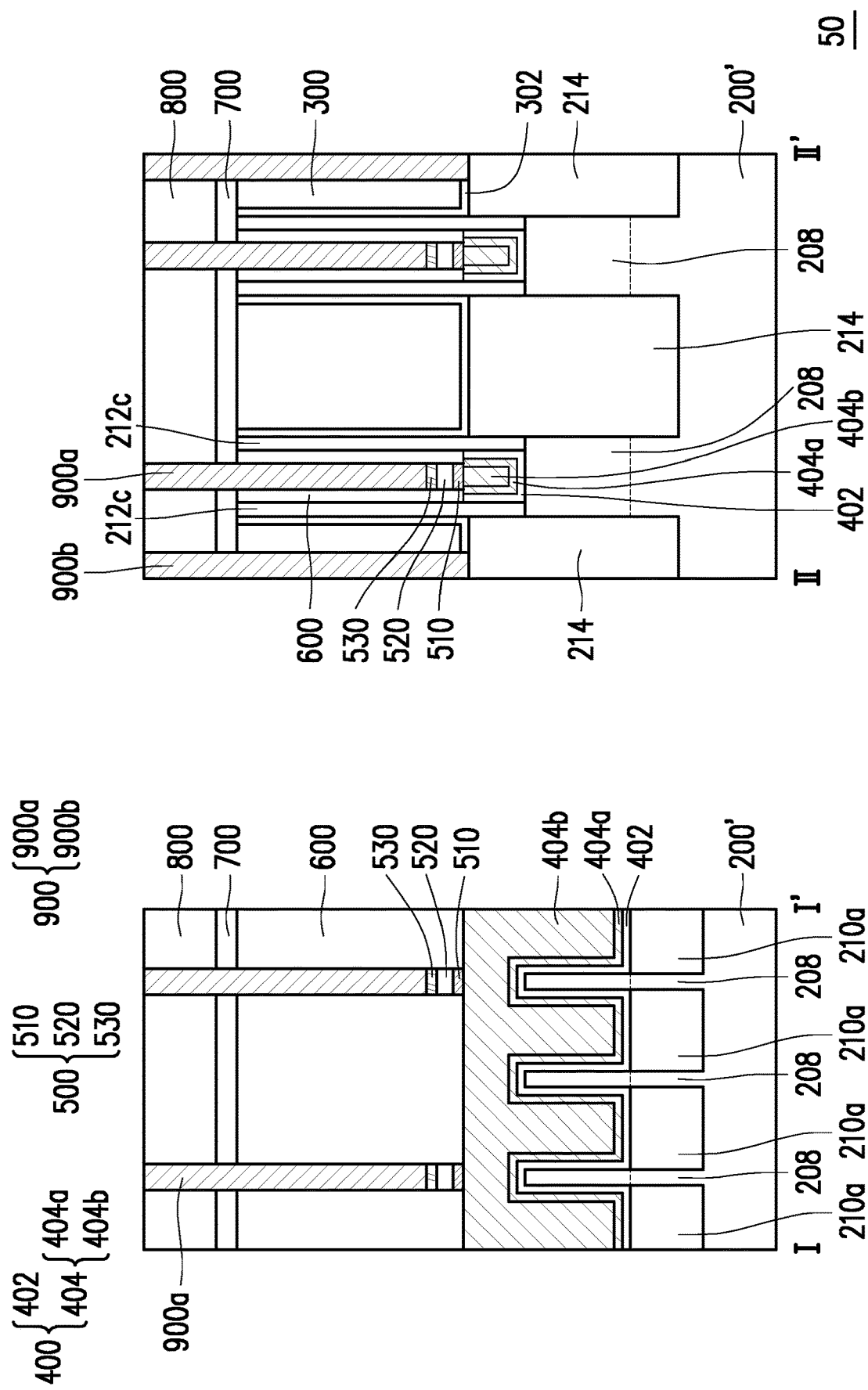

FIG. 6E is a perspective view illustrating one of various stages of a method of manufacturing a semiconductor device 50 in accordance with some embodiments of the disclosure. FIG. 7E is a cross-sectional view of the semiconductor device 50 taken along lines I-I' and II-II' of FIG. 6E. Referring to FIG. 6E and FIG. 7E, a plurality of conductive contacts 900 is formed to obtain the semiconductor device 50. In some embodiments, the conductive contacts 900 may include copper, copper alloys, nickel, aluminum, manganese, magnesium, silver, gold, tungsten, cobalt, a combination thereof, or the like. In some embodiments, the conductive contacts 900 may be formed by, for example, electrochemical plating process, CVD, PECVD, ALD, PVD, a combination thereof, or the like. In some embodiments, the conductive contacts 900 includes a plurality of first conductive contacts 900a and a plurality of second conductive contacts 900b. The first conductive contacts 900a are electrically connected to the capacitor structures 500 and the gate structures 400. On the other hand, the second conductive contacts 900b are electrically connected to the strained material structures 214. In other words, the first conductive contacts 900a may be referred to as "gate contacts" while the second conductive contacts 900b may be referred to as "source/drain contacts."

In some embodiments, the first conductive contacts 900a penetrate through the interlayer dielectric layer 800, the etch stop layer 700, and the hard mask layer 600. That is, the interlayer dielectric layer 800, the etch stop layer 700, and the hard mask layer 600 respectively wraps around different portions of each first conductive contact 900. As illustrated in FIG. 7E, the first conductive contacts 900a are electrically and physically connected to the capacitor structures 500. For example, the first conductive contacts 900a are physically in contact with the metal layer 530 of the capacitor structures 500. The capacitor structures 500 are sandwiched between the first conductive contacts 900a and the gate structures 400. In some embodiments, the first conductive contacts 900a are formed by filling a conductive material (i.e. copper, copper alloys, nickel, aluminum, manganese, magnesium, silver, gold, tungsten, cobalt, a combination thereof, or the like) into the openings OP and performing a planarization process to remove excess materials outside of the openings OP.

In some embodiments, the second conductive contacts 900b penetrate through the interlayer dielectric layer 800, the etch stop layer 700, the interlayer dielectric layer 300, and the etch stop layer 302. As illustrated in FIG. 6E and FIG. 7E, the second conductive contacts 900b are electrically and physically connected to the strained material structures 214. In some embodiments, the formation method of the second conductive contacts 900b in FIG. 6E and FIG. 7E may be similar to that of the conductive contacts 900b in FIG. 1R and FIG. 2R, so the detailed descriptions thereof are omitted herein.

It should be noted that the locations of the conductive contacts 900 shown in FIG. 6E and FIG. 7E are merely exemplary illustration, and the disclosure is not limited thereto. In some alternative embodiments, the conductive contacts 900 may be vertically aligned with the semiconductor fins 208 or may be disposed at different locations on the capacitor structures 500 and the strained material structures 214. Furthermore, the first conductive contacts 900a may be formed prior to, simultaneously with, or after forming the second conductive contacts 900b. That is, in some alternative embodiments, the contact openings for forming the second conductive contacts 900b and the openings OP (shown in FIG. 6C and FIG. 7C) for forming the first conductive contacts 900a may be simultaneously formed. In some embodiments, a plurality of routing patterns (not shown) may be formed over the conductive contacts 900 to render electrical connection between the semiconductor device 50 and other electronic devices. In some embodiments, the semiconductor device 50 may be referred to as a "Fin Field-effect transistor (FinFET)."

Figure 9:
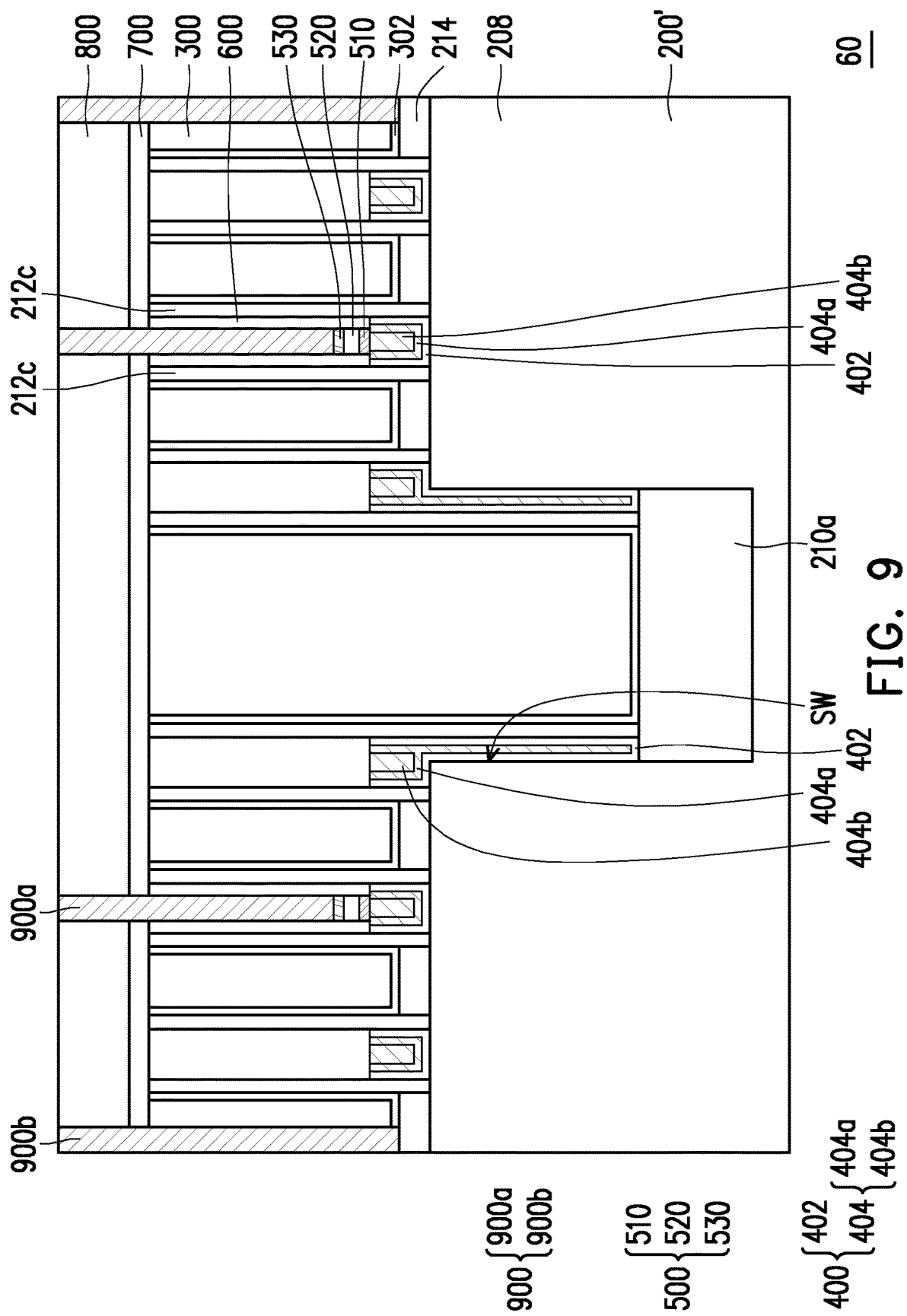
FIG. 9 is a cross-sectional view of a semiconductor device in accordance with some alternative embodiments of the disclosure.

FIG. 9 is a cross-sectional view of a semiconductor device 60 in accordance with some alternative embodiments of the disclosure. It should be noted that the cross-sectional view presented in FIG. 9 is taken along a line having an extending direction parallel to the line II-II' shown in FIG. 7E. The semiconductor device 60 in FIG. 9 is similar to the semiconductor device 50 in FIG. 7E, so similar elements are denoted by the same reference numeral and the detailed descriptions thereof are omitted herein. However, the number of the insulator 210a and the number of the capacitor structure 500 in the semiconductor device 60 is respectively less than the number of the insulator 210a and the number of the capacitor structure 500 in the semiconductor device 50. For example, as illustrated in FIG. 9, there is no insulator between some of the two adjacent gate structures 400. That is, multiple gate structures 400 are disposed on the top surface of the same semiconductor fin 208. Moreover, there is no capacitor structure formed above some of the gate structures 400. In addition, the number of the gate structures 400 in the semiconductor device 60 is more than the number of the gate structures 400 in the semiconductor device 50. In some embodiments, the three gate structures 400 on the left hand side of FIG. 9 may be devices of the first type (for example, p-type devices) while the remaining three gate structures 400 on the right hand side may be devices of the second type (for example, n-type devices). In some embodiments, the p-type devices and the n-type devices are separated by the insulator 210a. As illustrated in FIG. 9, a sidewall SW of the semiconductor fin 208 that is perpendicular to the extending direction of the semiconductor fin 208 is covered by at least a portion of some of the gate structures 400 and the insulator 210a. For example, the sidewall SW of the semiconductor fin 208 is covered by the gate dielectric layer 402 and the insulator 210a. In some embodiments, the gate structures 400 also covers sidewalls (not shown) of the semiconductor fin 208 that is parallel to the extending direction of the semiconductor fin 208. In other words, some of the gate structures 400 in the semiconductor device 60 cover top surface and three sidewalls of the semiconductor fins 208. In the semiconductor device 60, a ratio of an effective area of capacitance of the capacitor structures 500 to a contact area between the gate structures 400 and the semiconductor fins 208 ranges between 0.22 and 1.

Figure 10A:
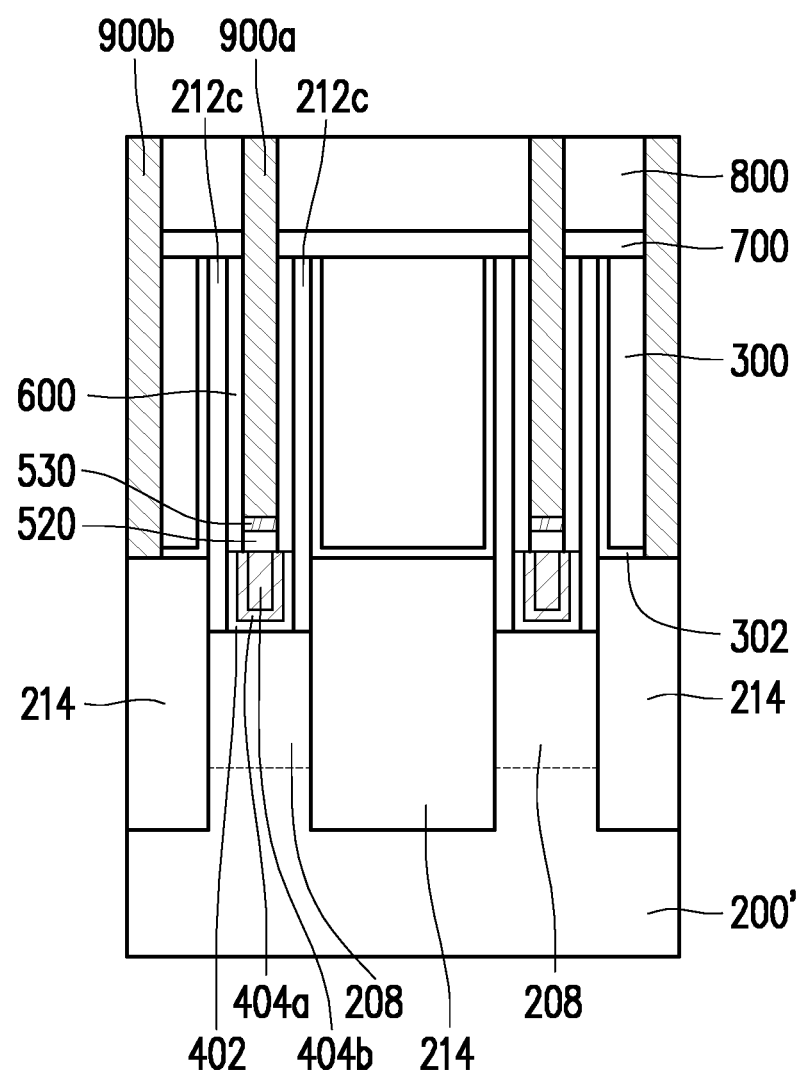

FIG. 10A is a cross-sectional view of a semiconductor device 70 in accordance with some alternative embodiments of the disclosure. It should be noted that the cross-sectional view presented in FIG. 10A is taken along a line having an extending direction parallel to the line II-II' shown in FIG. 7E. The semiconductor device 70 in FIG. 10A is similar to the semiconductor device 50 in FIG. 7E, so similar elements are denoted by the same reference numeral and the detailed descriptions thereof are omitted herein. However, the metal layer 510 shown in FIG. 7E is omitted in the semiconductor device 70 of FIG. 10A. That is, in the semiconductor device 70 of FIG. 10A, the capacitor structures 500 are formed by the ferroelectric layer 520 and the metal layer 530. As illustrated in FIG. 10A, the ferroelectric layer 520 is directly in contact with the gate structures 400. In some embodiment, each gate 404 of the gate structures 400 and each capacitor structures 500 may collectively form a capacitor. For example, the gate 404 may serve as a bottom electrode of the capacitor, the metal layer 530 may serve as a top electrode of the capacitor, and the ferroelectric layer 520 may serve as a dielectric layer sandwiched between the top electrode and the bottom electrode. In the semiconductor device 70, a ratio of an effective area of capacitance of the capacitor to a contact area between the gate structures 400 and the semiconductor fins 208 ranges between 0.22 and 1.

Figure 10B:
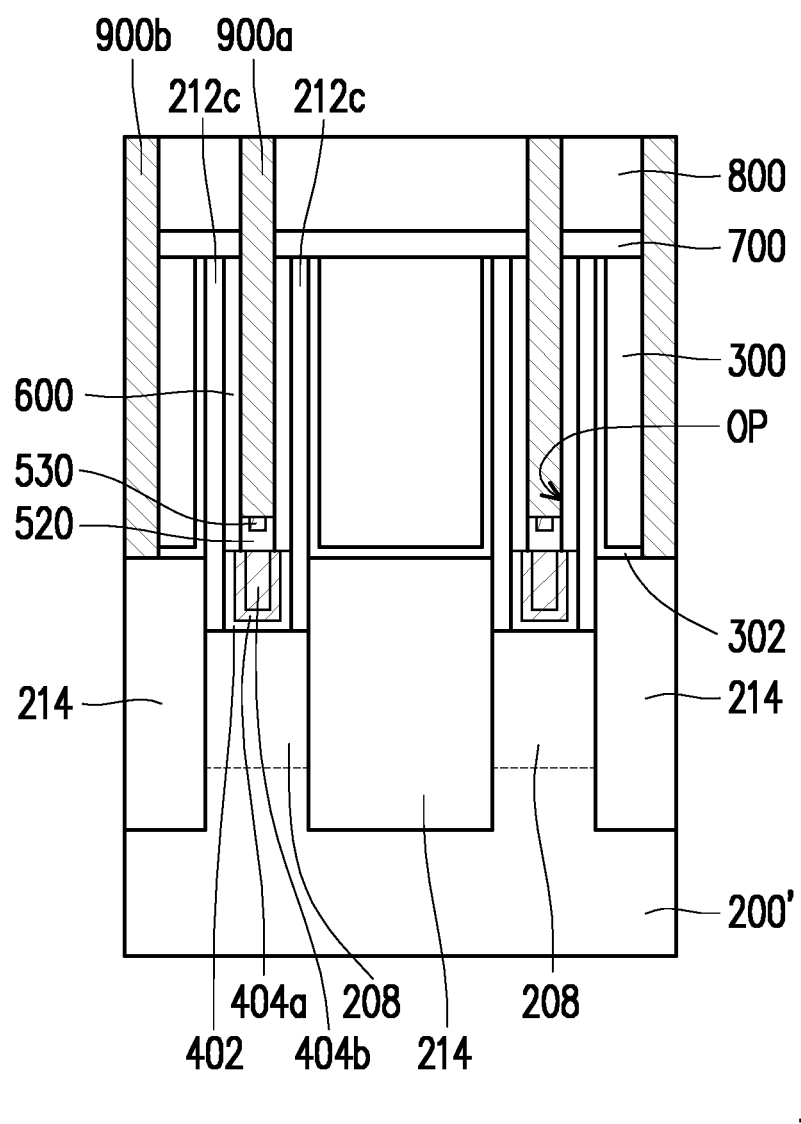

FIG. 10B is a cross-sectional view of a semiconductor device 80 in accordance with some alternative embodiments of the disclosure. It should be noted that the cross-sectional view presented in FIG. 10B is taken along a line having an extending direction parallel to the line II-II' shown in FIG. 7E. The semiconductor device 80 in FIG. 10B is similar to the semiconductor device 70 in FIG. 10A, so similar elements are denoted by the same reference numeral and the detailed descriptions thereof are omitted herein. However, in the semiconductor device 80 of FIG. 10B, the ferroelectric layer 520 surrounds sidewalls of the metal layer 530. In other words, in the manufacturing process of the semiconductor device 80, during the steps similar to the steps shown in FIG. 6D and FIG. 7D, the process recipe is adjusted such that the ferroelectric layer 520 is formed to cover a portion of the sidewalls of the openings OP. As illustrated in FIG. 10B, the ferroelectric layer 520 has a U-shaped cross-sectional view. In some embodiments, the metal layer 530 is separated from the spacers 212c by the ferroelectric layer 520. In the semiconductor device 80, a ratio of an effective area of capacitance of the capacitor to a contact area between the gate structures 400 and the semiconductor fins 208 ranges between 0.22 and 1.

In accordance with some embodiments of the disclosure, a semiconductor device includes a semiconductor substrate, a gate structure, a capacitor structure, and a conductive contact. The semiconductor substrate has at least one semiconductor fin thereon. The gate structure is disposed across the semiconductor fin. The capacitor structure is disposed on the gate structure. The capacitor structure includes a ferroelectric layer and a first metal layer disposed on the ferroelectric layer. The capacitor structure is sandwiched between the conductive contact and the gate structure.

In accordance with some embodiments of the disclosure, a method of manufacturing a semiconductor device includes at least the following steps. A semiconductor substrate is patterned to form a plurality of trenches in the semiconductor substrate and at least one semiconductor fin between the trenches. A plurality of insulators is formed in the trenches. A dummy gate structure is formed across the semiconductor fin. A plurality of strained material structures is formed over portions of the semiconductor fin revealed by the dummy gate structure. The dummy gate structure is removed to form a hollow portion. A gate structure is formed in the hollow portion. A portion of the gate structure is removed to form a cavity. A capacitor structure is formed over the gate structure. A hard mask layer is formed over the capacitor structure to seal the cavity. The capacitor structure is formed by at least the following steps. A ferroelectric layer is formed in the cavity. A first metal layer is deposited over the ferroelectric layer.

In accordance with some alternative embodiments of the disclosure, a method of manufacturing a semiconductor device includes at least the following steps. A semiconductor substrate is patterned to form at least one semiconductor fin. A pair of spacers is formed across the semiconductor fin. A gate structure is formed between the pair of spacers. A hard mask layer is formed on the gate structure and between the pair of spacers. An etch stop layer and an interlayer dielectric layer are sequentially formed over the hard mask layer and the pair of spacers. A portion of the hard mask layer, a portion of the etch stop layer, and a portion of the interlayer dielectric layer are removed to form an opening. The opening exposes a top surface of the gate structure. A capacitor structure is formed over the gate structure. The opening is filled with a conductive material to form a conductive contact. The capacitor structure is formed by at least the following steps. A ferroelectric layer is formed in the opening. A first metal layer is deposited over the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor fin;
   a gate structure disposed across the semiconductor fin;
   a capacitor structure disposed on and in physical contact with the gate structure, wherein the capacitor structure comprises a ferroelectric layer, and a vertical projection of the capacitor structure lands on the semiconductor fin;
   a conductive contact disposed on the capacitor structure, wherein the conductive contact is a single-layered structure;
   a hard mask layer laterally surrounding the conductive contact, wherein the conductive contact protrudes from a top surface of the hard mask layer, and the conductive contact is in physical contact with the hard mask layer; and
   a pair of spacers laterally surrounding the gate structure and the hard mask layer.

2. The semiconductor device according to claim 1, wherein the capacitor structure further comprises a first metal layer disposed between the ferroelectric layer and the conductive contact.

3. The semiconductor device according to claim 2, wherein the ferroelectric layer surrounds sidewalls of the first metal layer.

4. The semiconductor device according to claim 2, wherein the capacitor structure further comprises a second metal layer sandwiched between the gate structure and the ferroelectric layer.

5. The semiconductor device according to claim 1, wherein the conductive contact penetrates through the hard mask layer.

6. The semiconductor device according to claim 1, wherein the hard mask layer further laterally surrounds the capacitor structure.

7. The semiconductor device according to claim 1, wherein an entire top surface of the conductive contact is located on a same plane.

8. A method of manufacturing a semiconductor device, comprising:
   providing a semiconductor fin;
   forming a pair of spacers on the semiconductor fin;
   forming a gate structure to cover a portion of the semiconductor fin, wherein the gate structure is disposed across the semiconductor fin and between the pair of spacers;
   forming a capacitor structure on and in physical contact with the gate structure such that a vertical projection of the capacitor structure lands on the semiconductor fin, comprising:
      forming a ferroelectric layer over the gate structure; and
      depositing a first metal layer on the ferroelectric layer;
   forming a hard mask layer on the capacitor structure, wherein the pair of spacers laterally surrounds the gate structure and the hard mask layer;
   removing a portion of the hard mask layer to form a contact opening in the hard mask layer, wherein the contact opening exposes a portion of the capacitor structure; and
   filling a conductive material in the contact opening of the hard mask layer to form a conductive contact, wherein the conductive contact is disposed on the capacitor structure, the conductive contact is a single-layered structure, the hard mask layer laterally surrounds the conductive contact, the conductive contact penetrates through the hard mask layer and protrudes from a top surface of the hard mask layer, and the conductive contact is in physical contact with the hard mask layer.

9. The method according to claim 8, wherein the step of forming the capacitor structure further comprises depositing a second metal layer on the gate structure before the ferroelectric layer is formed.

10. The method according to claim 8, wherein the step of forming the ferroelectric layer comprises:
    depositing a precursor layer through atomic layer deposition (ALD); and
    annealing the precursor layer to form the ferroelectric layer.

11. The method according to claim 10, wherein the precursor layer comprises a hafnium-containing compound and a dopant, the hafnium-containing compound comprises hafnium dioxide ($HfO_2$), hafnium tetrachloride ($HfCl_4$), tetrakis (ethylmethylamido) hafnium (TEMAH), tetrakis (dimethylamido) hafnium (TDMAH), or a combination thereof, and the dopant comprises zirconium (Zr), aluminium (Al), lanthanum (La), yttrium (Y), gadolinium (Gd), strontium (Sr), or a combination thereof.

12. The method according to claim 10, wherein the step of forming the ferroelectric layer further comprises:
    forming a capping metal layer over the precursor layer before annealing the precursor layer; and
    annealing the capping metal layer and the precursor layer simultaneously to form the ferroelectric layer.

13. The method according to claim 8, wherein the ferroelectric layer is formed to have a U-shape in a cross-sectional view.

14. The method according to claim 8, wherein the conductive contact is in physical contact with the capacitor structure.

15. A method of manufacturing a semiconductor device, comprising:
    providing a semiconductor fin;
    forming a pair of spacers on the semiconductor fin;
    forming a gate structure over the semiconductor fin, wherein the gate structure is disposed across the semiconductor fin and between the pair of spacers;
    forming a hard mask layer on the gate structure, wherein the pair of spacers laterally surrounds the gate structure and the hard mask layer;
    removing a portion of the hard mask layer to form an opening, wherein the opening exposes a top surface of the gate structure;

forming a capacitor structure in the opening to cover the exposed top surface of the gate structure such that the capacitor structure is disposed on and in physical contact with the gate structure, and a vertical projection of the capacitor structure lands on the semiconductor fin, comprising:
forming a ferroelectric layer in the opening; and
depositing a first metal layer over the ferroelectric layer; and
filling the opening with a conductive material to form a conductive contact, wherein the conductive contact is disposed on the capacitor structure, the conductive contact is a single-layered structure, the hard mask layer laterally surrounds the conductive contact, the conductive contact protrudes from a top surface of the hard mask layer, the capacitor structure is sandwiched between the conductive contact and the gate structure, and the conductive contact is in physical contact with the hard mask layer.

16. The method according to claim 15, wherein the step of forming the capacitor structure further comprises depositing a second metal layer on the gate structure before the ferroelectric layer is formed.

17. The method according to claim 15, wherein the step of forming the ferroelectric layer comprises:

depositing a precursor layer in the opening through atomic layer deposition (ALD); and
annealing the precursor layer to form the ferroelectric layer.

18. The method according to claim 17, wherein the precursor layer comprises a hafnium-containing compound and a dopant, the hafnium-containing compound comprises hafnium dioxide ($HfO_2$), hafnium tetrachloride ($HfCl_4$), tetrakis (ethylmethylamido) hafnium (TEMAH), tetrakis (dimethylamido) hafnium (TDMAH), or a combination thereof, and the dopant comprises zirconium (Zr), aluminium (Al), lanthanum (La), yttrium (Y), gadolinium (Gd), strontium (Sr), or a combination thereof.

19. The method according to claim 17, wherein the step of forming the ferroelectric layer further comprises:
forming a capping metal layer over the precursor layer before annealing the precursor layer; and
annealing the capping metal layer and the precursor layer simultaneously to form the ferroelectric layer.

20. The method according to claim 15, wherein the ferroelectric layer is formed to cover sidewalls of the opening.

* * * * *